(12) United States Patent
Lomp et al.

(10) Patent No.: US 7,756,190 B2
(45) Date of Patent: Jul. 13, 2010

(54) TRANSFERRING VOICE AND NON-VOICE DATA

(75) Inventors: Gary Lomp, Centerport, NY (US); Fatih Ozluturk, Port Washington, NY (US); Avi Silverberg, Commack, NY (US)

(73) Assignee: InterDigital Technology Corporation, Wilmington, DE (US)

( * ) Notice: Subject to any disclaimer, the term of this patent is extended or adjusted under 35 U.S.C. 154(b) by 422 days.

(21) Appl. No.: 10/680,943

(22) Filed: Oct. 8, 2003

(65) Prior Publication Data

US 2004/0071198 A1 Apr. 15, 2004

Related U.S. Application Data

(60) Continuation of application No. 09/840,769, filed on Apr. 24, 2001, now Pat. No. 6,633,600, and a continuation of application No. 09/444,079, filed on Nov. 22, 1999, now Pat. No. 6,229,843, which is a continuation of application No. 09/024,473, filed on Feb. 17, 1998, now Pat. No. 5,991,332, which is a division of application No. 08/669,769, filed on Jun. 27, 1996, now Pat. No. 5,796,776.

(60) Provisional application No. 60/000,775, filed on Jun. 30, 1995.

(51) Int. Cl.
*H04B 1/707* (2006.01)

(52) U.S. Cl. .................................................... 375/148

(58) Field of Classification Search ................. 375/134, 375/137, 142, 144, 145, 260, 148–150, 343; 370/335, 342
See application file for complete search history.

(56) References Cited

U.S. PATENT DOCUMENTS

| | | | |
|---|---|---|---|
| 3,700,820 A | 10/1972 | Blasbalg et al. |
| 3,761,610 A | 9/1973 | Krallinger et al. |
| 4,069,392 A | 1/1978 | Goldenberg et al. |
| 4,092,601 A | 5/1978 | Lee et al. |
| 4,156,277 A | 5/1979 | Seitz et al. |

(Continued)

FOREIGN PATENT DOCUMENTS

DE 3743731 7/1989

(Continued)

OTHER PUBLICATIONS

Raymond W. Nettleton, "Spectral Efficiency in Cellular Land-Mobile Communications: A Spread-Spectrum Approach," UMI Dissertation Information Service (1978) 204 pp.

(Continued)

*Primary Examiner*—Young T. Tse
(74) *Attorney, Agent, or Firm*—Volpe and Koenig, P.C.

(57) ABSTRACT

A wireless communication unit comprises circuitry configured to receive a voice data associated with a first logical channel. The circuitry further configured to receive a non-voice data associated with a second logical channel. The voice data and non-voice data carried by a wireless channel set during a time period. The wireless channel set comprises a plurality of wireless channels. The wireless channel is associated with a subscriber unit. Circuitry is configured to insert information into the non-voice data, when the non-voice data is missing in the wireless channel set during the time period.

16 Claims, 23 Drawing Sheets

U.S. PATENT DOCUMENTS

| | | |
|---|---|---|
| 4,292,623 A | 9/1981 | Eswaran et al. |
| 4,320,513 A | 3/1982 | Lampert |
| 4,384,307 A | 5/1983 | Kuzmik et al. |
| 4,385,206 A | 5/1983 | Bradshaw et al. |
| 4,403,322 A | 9/1983 | Kato et al. |
| 4,425,665 A | 1/1984 | Stauffer |
| 4,458,314 A | 7/1984 | Grimes |
| 4,480,307 A | 10/1984 | Budde et al. |
| 4,570,220 A | 2/1986 | Tetrick et al. |
| 4,583,124 A | 4/1986 | Tsuji et al. |
| 4,608,700 A | 8/1986 | Kirtley, Jr. et al. |
| 4,630,126 A | 12/1986 | Kaku et al. |
| 4,646,232 A | 2/1987 | Chang et al. |
| 4,667,192 A | 5/1987 | Schmid et al. |
| 4,675,865 A | 6/1987 | DeVries et al. |
| 4,709,343 A | 11/1987 | Van Chang |
| 4,744,079 A | 5/1988 | Csapo et al. |
| 4,768,145 A | 8/1988 | Wheelwright et al. |
| 4,785,463 A | 11/1988 | Janc et al. |
| 4,811,262 A | 3/1989 | White |
| 4,811,421 A | 3/1989 | Havel et al. |
| 4,862,402 A | 8/1989 | Shah et al. |
| 4,876,554 A | 10/1989 | Tubbs |
| 4,901,265 A | 2/1990 | Kerr et al. |
| 4,901,307 A | 2/1990 | Gilhousen et al. |
| 4,905,177 A | 2/1990 | Weaver, Jr. et al. |
| 4,914,574 A | 4/1990 | Terada et al. |
| 4,926,130 A | 5/1990 | Weaver |
| 4,928,274 A | 5/1990 | Gilhousen et al. |
| 4,940,771 A | 7/1990 | Maresca |
| 5,022,024 A | 6/1991 | Paneth et al. |
| 5,022,049 A | 6/1991 | Abrahamson et al. |
| 5,027,306 A | 6/1991 | Dattorro et al. |
| 5,028,887 A | 7/1991 | Gilmore |
| 5,050,004 A | 9/1991 | Morton, Jr. |
| 5,056,109 A | 10/1991 | Gilhousen et al. |
| 5,081,643 A | 1/1992 | Schilling |
| 5,084,900 A | 1/1992 | Taylor |
| 5,093,840 A | 3/1992 | Schilling |
| 5,099,204 A | 3/1992 | Wheatley, III |
| 5,101,416 A | 3/1992 | Fenton et al. |
| 5,101,501 A | 3/1992 | Gilhousen et al. |
| 5,103,459 A | 4/1992 | Gilhousen et al. |
| 5,105,423 A | 4/1992 | Tanaka et al. |
| 5,107,225 A | 4/1992 | Wheatley et al. |
| 5,107,345 A | 4/1992 | Lee |
| 5,109,390 A | 4/1992 | Gilhousen et al. |
| 5,113,525 A | 5/1992 | Andoh |
| 5,115,429 A | 5/1992 | Huchyj et al. |
| 5,117,385 A | 5/1992 | Gee |
| 5,126,748 A | 6/1992 | Ames et al. |
| 5,128,623 A | 7/1992 | Gilmore |
| 5,140,613 A | 8/1992 | Birgenheier et al. |
| 5,142,278 A | 8/1992 | Moallemi et al. |
| 5,159,283 A | 10/1992 | Jensen |
| 5,159,551 A | 10/1992 | Brunnett et al. |
| 5,161,168 A | 11/1992 | Schilling |
| 5,166,929 A | 11/1992 | Lo |
| 5,166,951 A | 11/1992 | Schilling |
| 5,166,952 A | 11/1992 | Omurg et al. |
| 5,179,571 A | 1/1993 | Schilling |
| 5,179,572 A | 1/1993 | Schilling |
| 5,193,094 A | 3/1993 | Viterbi |
| 5,199,061 A | 3/1993 | Kim |
| 5,204,876 A | 4/1993 | Bruckert et al. |
| 5,210,771 A | 5/1993 | Schaeffer et al. |
| 5,216,692 A | 6/1993 | Ling |
| 5,224,120 A | 6/1993 | Schilling |
| 5,228,053 A | 7/1993 | Miller et al. |
| 5,228,054 A | 7/1993 | Rueth et al. |
| 5,228,056 A | 7/1993 | Schilling |
| 5,233,630 A | 8/1993 | Wolf |
| 5,235,614 A | 8/1993 | Bruckert et al. |
| 5,237,586 A | 8/1993 | Bottomley |
| 5,239,557 A | 8/1993 | Dent |
| 5,239,685 A | 8/1993 | Moe et al. |
| 5,241,690 A | 8/1993 | Larsson et al. |
| 5,245,629 A | 9/1993 | Hall |
| 5,253,268 A | 10/1993 | Omura et al. |
| 5,253,347 A | 10/1993 | Bagnoli et al. |
| 5,257,283 A | 10/1993 | Gilhousen et al. |
| 5,258,940 A | 11/1993 | Coker et al. |
| 5,260,967 A | 11/1993 | Schilling |
| 5,262,974 A | 11/1993 | Hausman et al. |
| 5,263,045 A | 11/1993 | Schilling |
| 5,265,119 A | 11/1993 | Gilhousen et al. |
| 5,267,261 A | 11/1993 | Blakeney, III et al. |
| 5,267,262 A | 11/1993 | Wheatley, III |
| 5,274,474 A | 12/1993 | Medina |
| 5,274,665 A | 12/1993 | Schilling |
| 5,276,261 A | 1/1994 | Mayer et al. |
| 5,276,684 A | 1/1994 | Pearson |
| 5,276,907 A | 1/1994 | Meidan |
| 5,280,472 A | 1/1994 | Gilhousen et al. |
| 5,283,536 A | 2/1994 | Wheatley, III et al. |
| 5,287,299 A | 2/1994 | Lin |
| 5,287,463 A | 2/1994 | Frame et al. |
| 5,289,527 A | 2/1994 | Tiedemann, Jr. |
| 5,291,515 A | 3/1994 | Uchida et al. |
| 5,293,641 A | 3/1994 | Kallin et al. |
| 5,295,152 A | 3/1994 | Gudmundson et al. |
| 5,295,153 A | 3/1994 | Gudmundson |
| 5,297,162 A | 3/1994 | Lee et al. |
| 5,299,226 A | 3/1994 | Schilling |
| 5,299,228 A | 3/1994 | Hall |
| 5,305,349 A | 4/1994 | Dent |
| 5,307,405 A | 4/1994 | Sih |
| 5,309,474 A | 5/1994 | Gilhousen et al. |
| 5,311,459 A | 5/1994 | D'Luna et al. |
| 5,316,422 A | 5/1994 | Coffman |
| 5,321,721 A | 6/1994 | Yamaura et al. |
| 5,327,455 A | 7/1994 | DeGaudenzi et al. |
| 5,327,467 A | 7/1994 | DeGaudenzi et al. |
| 5,329,547 A | 7/1994 | Ling et al. |
| 5,337,338 A | 8/1994 | Sutton et al. |
| 5,339,046 A | 8/1994 | Kornfeld et al. |
| 5,339,174 A | 8/1994 | Harris |
| 5,341,396 A | 8/1994 | Higgins |
| 5,341,397 A | 8/1994 | Gudmundson |
| 5,341,427 A | 8/1994 | Hardy et al. |
| 5,341,456 A | 8/1994 | DeJaco |
| 5,343,335 A | 8/1994 | Hara |
| 5,345,467 A | 9/1994 | Lomp et al. |
| 5,345,596 A | 9/1994 | Buchenhorner et al. |
| 5,345,598 A | 9/1994 | Dent |
| 5,347,536 A | 9/1994 | Meehan |
| 5,349,606 A | 9/1994 | Lovell et al. |
| 5,351,134 A | 9/1994 | Yaguchi et al. |
| 5,351,269 A | 9/1994 | Schilling |
| 5,353,302 A | 10/1994 | Bi |
| 5,353,352 A | 10/1994 | Dent et al. |
| 5,355,453 A | 10/1994 | Row et al. |
| 5,361,276 A | 11/1994 | Subramanian |
| 5,363,377 A | 11/1994 | Sharpe |
| 5,363,403 A | 11/1994 | Schilling et al. |
| 5,365,544 A | 11/1994 | Schilling |
| 5,365,585 A | 11/1994 | Puhl et al. |
| 5,367,533 A | 11/1994 | Schilling |
| 5,373,259 A | 12/1994 | Hackman et al. |
| 5,373,502 A | 12/1994 | Turban |
| 5,377,183 A | 12/1994 | Dent |
| 5,377,223 A | 12/1994 | Schilling |
| 5,379,242 A | 1/1995 | Rose et al. |
| 5,383,219 A | 1/1995 | Wheatley, III et al. |

| | | | | | | |
|---|---|---|---|---|---|---|
| 5,386,589 A | 1/1995 | Kanai | | 5,582,851 A | 12/1996 | Hofstetter et al. |
| 5,390,207 A | 2/1995 | Fenton et al. | | 5,586,113 A | 12/1996 | Adachi et al. |
| 5,392,287 A | 2/1995 | Tiedemann, Jr. et al. | | 5,590,409 A | 12/1996 | Sawahashi et al. |
| D356,560 S | 3/1995 | Kornfeld et al. | | 5,594,718 A | 1/1997 | Weaver, Jr. et al. |
| 5,396,516 A | 3/1995 | Padovani et al. | | 5,596,570 A | 1/1997 | Soliman |
| 5,396,539 A | 3/1995 | Slekys et al. | | 5,602,833 A | 2/1997 | Zehavi |
| 5,398,243 A | 3/1995 | Aguilhon et al. | | 5,603,096 A | 2/1997 | Gilhousen et al. |
| 5,404,376 A | 4/1995 | Dent | | 5,604,730 A | 2/1997 | Tiedemann, Jr. |
| 5,406,559 A | 4/1995 | Edem et al. | | 5,610,940 A | 3/1997 | Durrant et al. |
| 5,406,615 A | 4/1995 | Miller, II et al. | | 5,613,228 A | 3/1997 | Tuttle et al. |
| 5,408,697 A | 4/1995 | Price et al. | | 5,614,914 A | 3/1997 | Bolgiano et al. |
| 5,410,568 A | 4/1995 | Schilling | | 5,619,524 A | 4/1997 | Ling et al. |
| 5,412,686 A | 5/1995 | Ling | | 5,619,526 A | 4/1997 | Kim et al. |
| 5,414,728 A | 5/1995 | Zehavi | | 5,621,416 A | 4/1997 | Lennen |
| 5,414,729 A | 5/1995 | Fenton | | 5,621,723 A | 4/1997 | Walton, Jr. et al. |
| 5,414,732 A | 5/1995 | Kauffman | | 5,627,835 A | 5/1997 | Witter |
| 5,414,796 A | 5/1995 | Jacobs et al. | | 5,627,855 A | 5/1997 | Davidovici |
| 5,416,797 A | 5/1995 | Gilhousen et al. | | 5,629,955 A | 5/1997 | McDonough |
| 5,418,624 A | 5/1995 | Ahmed | | 5,638,362 A | 6/1997 | Dohi et al. |
| 5,420,850 A | 5/1995 | Umeda et al. | | 5,644,590 A | 7/1997 | Sugita |
| 5,420,864 A | 5/1995 | Dahlin et al. | | 5,652,765 A | 7/1997 | Adachi et al. |
| 5,420,896 A | 5/1995 | Schilling | | 5,654,980 A | 8/1997 | Latva-aho et al. |
| 5,422,908 A | 6/1995 | Schilling | | 5,657,343 A | 8/1997 | Schilling |
| 5,430,724 A | 7/1995 | Fall et al. | | 5,666,654 A | 9/1997 | Kanai |
| 5,430,760 A | 7/1995 | Dent | | 5,673,259 A | 9/1997 | Quick, Jr. |
| 5,440,597 A | 8/1995 | Chung et al. | | 5,673,286 A | 9/1997 | Lomp |
| 5,442,625 A | 8/1995 | Gitlin et al. | | 5,675,581 A | 10/1997 | Soliman |
| 5,442,662 A | 8/1995 | Fukasawa et al. | | 5,689,502 A | 11/1997 | Scott |
| 5,446,683 A | 8/1995 | Mullen et al. | | 5,689,815 A | 11/1997 | Yamazaki et al. |
| 5,446,756 A | 8/1995 | Mallinckrodt | | 5,691,974 A | 11/1997 | Zehavi et al. |
| 5,448,600 A | 9/1995 | Lucas | | 5,692,008 A | 11/1997 | Van Nee |
| 5,454,026 A | 9/1995 | Tanaka | | 5,710,768 A | 1/1998 | Ziv et al. |
| 5,459,758 A | 10/1995 | Moore | | 5,712,869 A | 1/1998 | Lee et al. |
| 5,459,759 A | 10/1995 | Schilling | | 5,715,526 A | 2/1998 | Weaver et al. |
| 5,461,639 A | 10/1995 | Wheatley, III et al. | | 5,722,051 A | 2/1998 | Agrawal et al. |
| 5,465,399 A | 11/1995 | Oberholtzer et al. | | 5,734,648 A | 3/1998 | Adachi et al. |
| 5,471,497 A | 11/1995 | Zehavi | | 5,737,326 A | 4/1998 | I et al. |
| 5,483,549 A | 1/1996 | Weinberg et al. | | 5,745,484 A | 4/1998 | Scott |
| 5,485,486 A | 1/1996 | Gilhousen et al. | | 5,748,687 A | 5/1998 | Ozluturk |
| 5,487,089 A | 1/1996 | Misaizu et al. | | 5,751,739 A | 5/1998 | Seshadri et al. |
| 5,487,180 A | 1/1996 | Ohtake | | 5,751,761 A | 5/1998 | Gilhousen |
| 5,488,629 A | 1/1996 | Takahashi et al. | | 5,754,803 A | 5/1998 | Regis |
| 5,506,864 A | 4/1996 | Schilling | | 5,757,767 A | 5/1998 | Zehavi |
| 5,508,708 A | 4/1996 | Ghosh et al. | | 5,764,687 A | 6/1998 | Easton |
| 5,509,126 A | 4/1996 | Oprescu et al. | | 5,771,451 A | 6/1998 | Takai et al. |
| 5,519,736 A | 5/1996 | Ishida | | 5,781,584 A | 7/1998 | Zhou et al. |
| 5,528,593 A | 6/1996 | English et al. | | 5,790,591 A | 8/1998 | Gold et al. |
| 5,528,624 A | 6/1996 | Kaku et al. | | 5,796,776 A | 8/1998 | Lomp et al. |
| 5,535,238 A * | 7/1996 | Schilling et al. ............ 375/142 | | 5,799,010 A | 8/1998 | Lomp et al. |
| 5,535,239 A | 7/1996 | Padovani et al. | | 5,802,046 A | 9/1998 | Scott |
| 5,535,278 A | 7/1996 | Cahn et al. | | 5,812,593 A | 9/1998 | Kaku |
| 5,541,606 A | 7/1996 | Lennen | | 5,812,938 A | 9/1998 | Gilhousen et al. |
| 5,544,156 A | 8/1996 | Teder et al. | | 5,822,318 A | 10/1998 | Tiedemann et al. |
| 5,544,196 A | 8/1996 | Tiedemann, Jr. et al. | | 5,822,359 A | 10/1998 | Bruckert et al. |
| 5,546,424 A | 8/1996 | Miyake | | 5,828,662 A | 10/1998 | Jalali et al. |
| 5,548,613 A | 8/1996 | Kaku et al. | | 5,841,768 A | 11/1998 | Ozluturk et al. |
| 5,550,811 A | 8/1996 | Kaku et al. | | 5,844,935 A * | 12/1998 | Shoji ......................... 375/150 |
| 5,559,790 A | 9/1996 | Yano et al. | | 5,856,971 A | 1/1999 | Gitlin et al. |
| 5,561,669 A | 10/1996 | Lenny et al. | | 5,870,378 A | 2/1999 | Huang et al. |
| 5,563,907 A | 10/1996 | Lomp | | 5,870,427 A | 2/1999 | Tiedemann et al. |
| 5,563,912 A | 10/1996 | Yasunga | | 5,872,810 A | 2/1999 | Phillips et al. |
| 5,566,165 A | 10/1996 | Sawahashi et al. | | 5,875,400 A | 2/1999 | Madhavapeddy et al. |
| 5,566,201 A | 10/1996 | Ostman | | 5,878,329 A | 3/1999 | Mallinckrodt |
| 5,568,472 A | 10/1996 | Umeda et al. | | 5,878,350 A | 3/1999 | Nakamura et al. |
| 5,568,483 A | 10/1996 | Padovani et al. | | 5,881,056 A | 3/1999 | Huang et al. |
| 5,570,349 A | 10/1996 | Bustamante et al. | | 5,881,368 A | 3/1999 | Grob et al. |
| 5,570,353 A | 10/1996 | Keskitalo et al. | | 5,884,187 A | 3/1999 | Ziv et al. |
| 5,572,516 A | 11/1996 | Miya et al. | | 5,884,196 A | 3/1999 | Lekven et al. |
| 5,574,754 A | 11/1996 | Kurihara et al. | | 5,896,368 A | 4/1999 | Dahlman et al. |
| 5,574,775 A | 11/1996 | Miller, II et al. | | 5,898,665 A | 4/1999 | Sawahashi et al. |
| 5,574,983 A | 11/1996 | Duozono et al. | | 5,912,919 A | 6/1999 | Lomp et al. |
| 5,579,374 A | 11/1996 | Doi et al. | | 5,926,501 A | 7/1999 | Souissi et al. |
| 5,581,547 A | 12/1996 | Umeda et al. | | 5,933,781 A | 8/1999 | Willenegger et al. |

| Patent No. | Date | Inventor |
|---|---|---|
| 5,940,382 A | 8/1999 | Haim |
| 5,940,771 A | 8/1999 | Gollnick et al. |
| 5,943,361 A | 8/1999 | Gilhousen et al. |
| 5,953,346 A | 9/1999 | Luddy |
| 5,959,080 A | 9/1999 | Scott |
| 5,959,980 A | 9/1999 | Scott |
| 5,966,403 A | 10/1999 | Pon |
| 5,987,014 A | 11/1999 | Magill et al. |
| 5,991,329 A | 11/1999 | Lomp et al. |
| 5,991,332 A | 11/1999 | Lomp et al. |
| 6,018,528 A | 1/2000 | Gitlin et al. |
| 6,021,123 A * | 2/2000 | Mimura .................... 370/331 |
| 6,038,577 A | 3/2000 | Burshtein |
| 6,049,535 A | 4/2000 | Ozluturk et al. |
| 6,072,787 A | 6/2000 | Hamalainen et al. |
| 6,088,335 A | 7/2000 | I et al. |
| 6,104,748 A | 8/2000 | Kaku |
| 6,108,537 A | 8/2000 | Cormer et al. |
| 6,122,292 A | 9/2000 | Watanabe et al. |
| 6,141,374 A | 10/2000 | Burns |
| 6,157,619 A | 12/2000 | Ozluturk et al. |
| 6,173,162 B1 | 1/2001 | Dahlman et al. |
| 6,181,949 B1 | 1/2001 | Ozluturk et al. |
| 6,212,174 B1 | 4/2001 | Lomp et al. |
| 6,212,399 B1 | 4/2001 | Kumar et al. |
| 6,215,778 B1 | 4/2001 | Lomp et al. |
| 6,226,316 B1 | 5/2001 | Schilling et al. |
| 6,229,843 B1 | 5/2001 | Lomp et al. |
| 6,252,866 B1 | 6/2001 | Haim |
| 6,269,113 B1 | 7/2001 | Park |
| 6,272,168 B1 | 8/2001 | Lomp et al. |
| 6,286,040 B1 | 9/2001 | Durham |
| 6,289,040 B1 | 9/2001 | Molev-Shteiman |
| 6,292,519 B1 | 9/2001 | Popovic |
| 6,335,924 B1 | 1/2002 | Yano et al. |
| 6,347,083 B1 | 2/2002 | Nishino |
| 6,356,555 B1 | 3/2002 | Rakib et al. |
| 6,381,264 B1 | 4/2002 | Lomp et al. |
| 6,393,049 B1 * | 5/2002 | Davidovici et al. ......... 375/142 |
| 6,396,867 B1 | 5/2002 | Tiedemann et al. |
| 6,396,897 B1 | 5/2002 | Tiedemann et al. |
| 6,397,070 B1 | 5/2002 | Black |
| 6,405,272 B1 | 6/2002 | Regis |
| 6,434,124 B1 | 8/2002 | Rege |
| 6,438,119 B1 | 8/2002 | Kim et al. |
| 6,456,608 B1 | 9/2002 | Lomp |
| 6,463,295 B1 | 10/2002 | Yun |
| 6,473,447 B1 | 10/2002 | Strich et al. |
| 6,487,190 B1 | 11/2002 | Regis |
| 6,490,462 B2 | 12/2002 | Ozluturk et al. |
| 6,493,563 B1 | 12/2002 | Ozluturk et al. |
| 6,507,745 B2 | 1/2003 | Ozluturk et al. |
| 6,510,148 B1 | 1/2003 | Honkasalo |
| 6,519,277 B2 * | 2/2003 | Eidson ...................... 375/150 |
| 6,519,461 B1 | 2/2003 | Andersson et al. |
| 6,519,474 B2 | 2/2003 | Ozluturk et al. |
| 6,549,565 B1 | 4/2003 | Buehrer et al. |
| 6,571,105 B2 | 5/2003 | Ozluturk et al. |
| 6,577,876 B2 | 6/2003 | Ozluturk et al. |
| 6,587,447 B1 | 7/2003 | Wang et al. |
| 6,590,883 B1 | 7/2003 | Kitade et al. |
| 6,590,889 B1 | 7/2003 | Preuss et al. |
| 6,606,503 B2 | 8/2003 | Ozluturk et al. |
| 6,608,825 B1 | 8/2003 | Luddy |
| 6,633,600 B2 | 10/2003 | Lomp et al. |
| 6,654,613 B1 | 11/2003 | Maeng |
| 6,671,266 B1 | 12/2003 | Moon et al. |
| 6,674,788 B2 | 1/2004 | Lomp et al. |
| 6,674,791 B2 | 1/2004 | Lomp et al. |
| 6,697,350 B2 | 2/2004 | Lomp |
| 6,707,805 B2 | 3/2004 | Ozluturk et al. |
| 6,708,041 B1 | 3/2004 | Butovitsch et al. |
| 6,721,301 B2 | 4/2004 | Ozluturk et al. |
| RE38,523 E | 6/2004 | Ozluturk |
| 6,744,809 B2 | 6/2004 | Lomp et al. |
| 6,760,321 B2 | 7/2004 | Shamsunder |
| 6,763,244 B2 | 7/2004 | Chen et al. |
| 6,778,551 B1 | 8/2004 | Magnus et al. |
| 6,778,840 B2 | 8/2004 | Ozluturk et al. |
| 6,788,662 B2 | 9/2004 | Ozluturk et al. |
| 6,801,516 B1 | 10/2004 | Lomp et al. |
| 6,816,473 B2 | 11/2004 | Ozluturk et al. |
| 6,831,905 B1 | 12/2004 | Lomp et al. |
| 6,839,567 B2 | 1/2005 | Ozluturk et al. |
| 6,847,821 B1 * | 1/2005 | Lewis et al. ............. 455/452.2 |
| 6,853,675 B1 | 2/2005 | Oleynik |
| 6,865,168 B1 | 3/2005 | Sekine |
| 6,873,645 B2 | 3/2005 | Lomp et al. |
| 6,879,841 B2 | 4/2005 | Ozluturk et al. |
| 6,885,652 B1 | 4/2005 | Ozukturk et al. |
| 6,904,294 B2 | 6/2005 | Ozluturk et al. |
| 6,907,020 B2 | 6/2005 | Periyalwar |
| 6,940,840 B2 | 9/2005 | Ozluturk et al. |
| 6,983,009 B2 | 1/2006 | Lomp |
| 6,985,467 B2 | 1/2006 | Lomp et al. |
| 7,020,111 B2 | 3/2006 | Ozluturk et al. |
| 7,039,029 B2 | 5/2006 | Lee et al. |
| 7,050,481 B1 | 5/2006 | Hulbert |
| 7,061,888 B2 | 6/2006 | Sakoda |
| 7,072,380 B2 | 7/2006 | Ozluturk et al. |
| 7,079,522 B1 | 7/2006 | Kim et al. |
| 7,085,583 B2 | 8/2006 | Ozluturk et al. |
| 7,117,004 B2 | 10/2006 | Ozluturk et al. |
| 7,123,600 B2 | 10/2006 | Ozluturk et al. |
| 7,190,966 B2 | 3/2007 | Ozluturk et al. |
| 7,212,820 B2 | 5/2007 | Dent et al. |
| 7,286,847 B2 | 10/2007 | Ozluturk et al. |
| 7,339,894 B2 | 3/2008 | Corazza |
| 7,403,508 B1 | 7/2008 | Miao |
| 7,437,177 B2 | 10/2008 | Ozluturk et al. |
| 7,502,406 B2 | 3/2009 | Lomp et al. |
| 7,535,874 B2 | 5/2009 | Ozluturk et al. |
| 7,593,453 B2 | 9/2009 | Lomp et al. |
| 2001/0038630 A1 | 11/2001 | Tong et al. |
| 2002/0051434 A1 | 5/2002 | Ozluturk et al. |
| 2002/0057659 A1 | 5/2002 | Ozluturk et al. |
| 2002/0064164 A1 * | 5/2002 | Yokoyama et al. .......... 370/394 |
| 2002/0097697 A1 | 7/2002 | Bae et al. |
| 2002/0101832 A1 * | 8/2002 | Chen et al. ................. 370/318 |
| 2002/0106007 A1 * | 8/2002 | Lomp et al. ................. 375/147 |
| 2002/0118653 A1 | 8/2002 | Lomp et al. |
| 2002/0150065 A1 | 10/2002 | Ponnekanti |
| 2003/0190925 A1 | 10/2003 | Ozluturk et al. |
| 2003/0193914 A1 | 10/2003 | Lomp et al. |
| 2004/0005020 A1 | 1/2004 | Dent |
| 2004/0071198 A1 | 4/2004 | Lomp et al. |
| 2004/0165654 A1 | 8/2004 | Lomp et al. |
| 2004/0179506 A1 | 9/2004 | Padovani et al. |
| 2004/0252668 A1 | 12/2004 | Ozukturk et al. |
| 2005/0002348 A1 | 1/2005 | Holtzman et al. |
| 2005/0094604 A1 | 5/2005 | Ozluturk et al. |
| 2005/0243897 A1 | 11/2005 | Lomp et al. |
| 2005/0249165 A1 | 11/2005 | Ozluturk et al. |
| 2005/0254478 A1 | 11/2005 | Ozluturk et al. |
| 2005/0265430 A1 | 12/2005 | Ozluturk et al. |
| 2006/0088134 A1 | 4/2006 | Gilhousen et al. |
| 2006/0098759 A1 | 5/2006 | Tiedemann et al. |
| 2007/0002934 A1 | 1/2007 | Schilling |
| 2008/0240046 A1 | 10/2008 | Ozluturk et al. |
| 2009/0103508 A1 | 4/2009 | Lomp et al. |
| 2010/0002752 A1 | 1/2010 | Lomp et al. |

FOREIGN PATENT DOCUMENTS

| | | |
|---|---|---|
| DE | 3743731 A1 | 7/1989 |
| DE | 3743732 | 7/1989 |

| | | |
|---|---|---|
| DE | 3743732 A1 | 7/1989 |
| EP | 0022170 | 1/1981 |
| EP | 0372350 | 6/1990 |
| EP | 0462572 | 12/1991 |
| EP | 0464839 A2 | 1/1992 |
| EP | 0476215 | 3/1992 |
| EP | 0515335 | 5/1992 |
| EP | 0505341 A | 9/1992 |
| EP | 0525860 | 2/1993 |
| EP | 0526106 A2 | 2/1993 |
| EP | 0565507 | 10/1993 |
| EP | 0615395 | 3/1994 |
| EP | 0631397 | 12/1994 |
| EP | 0637178 A | 2/1995 |
| EP | 0637179 | 2/1995 |
| EP | 0654913 | 5/1995 |
| EP | 0654913 A2 | 5/1995 |
| EP | 0682423 | 5/1995 |
| EP | 0656716 | 6/1995 |
| EP | 0656716 A1 | 6/1995 |
| EP | 0668662 A1 | 8/1995 |
| EP | 0744876 | 11/1996 |
| EP | 1933470 | 6/2008 |
| GB | 2280575 | 2/1995 |
| GB | 2301746 | 12/1996 |
| JP | 62256516 | 11/1987 |
| JP | 63198423 | 8/1988 |
| JP | H1-124730 | 8/1989 |
| JP | H02-042500 | 2/1990 |
| JP | 02256331 | 10/1990 |
| JP | H2287874 | 11/1990 |
| JP | H03-040535 | 2/1991 |
| JP | H4222111 | 8/1992 |
| JP | H4287593 | 10/1992 |
| JP | H05-022285 | 1/1993 |
| JP | H583381 | 4/1993 |
| JP | H05-129969 | 5/1993 |
| JP | H5144128 | 6/1993 |
| JP | H07-030483 | 7/1993 |
| JP | 5-227124 | 9/1993 |
| JP | H05-244056 | 9/1993 |
| JP | H05-327580 | 10/1993 |
| JP | H05-300077 | 11/1993 |
| JP | H66374 | 1/1994 |
| JP | H06-120865 | 4/1994 |
| JP | H6104694 | 4/1994 |
| JP | 06-268574 | 9/1994 |
| JP | H06-276176 | 9/1994 |
| JP | H6-343068 | 12/1994 |
| JP | H07-046180 | 2/1995 |
| JP | H07-050631 | 2/1995 |
| JP | H07-079477 | 3/1995 |
| JP | H758665 | 3/1995 |
| JP | H07-095151 | 4/1995 |
| JP | H07-107007 | 4/1995 |
| JP | H7273600 | 10/1995 |
| JP | H6104829 | 1/1996 |
| JP | H7-095151 | 11/1996 |
| JP | S63-23425 | 1/1998 |
| JP | S63198423 | 8/1998 |
| WO | 9013942 | 11/1990 |
| WO | 9200639 | 1/1992 |
| WO | 9221196 | 11/1992 |
| WO | WO9221196 | 11/1992 |
| WO | 9307702 | 4/1993 |
| WO | 9309626 | 5/1993 |
| WO | 9314588 | 7/1993 |
| WO | 9416513 | 7/1994 |
| WO | 9428640 | 12/1994 |
| WO | 9503652 | 2/1995 |
| WO | WO9503652 | 2/1995 |
| WO | 9507578 | 3/1995 |
| WO | 9508876 | 3/1995 |
| WO | WO9507578 | 3/1995 |
| WO | 9512257 | 5/1995 |
| WO | 9515038 | 6/1995 |
| WO | 9702665 | 1/1997 |
| WO | WO9702665 | 1/1997 |
| WO | 9707600 | 2/1997 |

OTHER PUBLICATIONS

Hossein Al Avi, "Power Control and Interference Management in a Spread-Spectrum Cellular Mobile Radio System," UMI Dissertation Information Services, (1984) 129pp.

"Code Division Multiple Access (CDMA)", Franz Josef Hagmanns, Volker Hespelt, 8273 ANT Nachrichtentechnische Berichte Aug. 1993, No. 10, Backnang, DE, pp. 64-71.

Pahlavan et al.; "Performance of adaptive matched filter receivers over fading multipath channels;" IEEE; vol. 38, No. 12; pp. 2106-2113; Dec. 1990.

Giannetti et al.; "Design of an all-digital receiver for narrowband continuous-phase asynchronous CDMA systems;" IEEE; vol. 3; pp. 468-472; May 1993.

Braun et al.; "An All-digital receiver for satellite audio broadcasting signals using trellis coded quasi-orthogonal code-division multiplexing," AEI; vol. 4, No. 1; pp. 23-32; 1993.

Rick et al.; "Noncoherent parallel acquisition in CDMA spread spectrum systems;" IEEE; paragraph 1; May 1994.

Bernasconi; "Receiver architectures for the down-link in a DS-CDMA mobile system;" IEEE; pp. 51-55; Sep. 1994.

Hagmanns et al., "Code Division Multiple Access (CDMA)," 8273 ANT Nachrichtentechnische Berichte Aug. 1993, No. 10, Backnang, DE, pp. 64-71.

"CDMA and ATM-zwei Technologies, ein Zeil," 2323 Telcom Report (Siemens) Maerz/Apr. 18, 1995, No. 2, Munchen, DE pp. 60-63.

Liu et al., SIR-Based Call Admission Control for DS-CDMA Cellular Systems, IEEE Journal on Selected Areas in Communications, US IEEE Inc, New York, vol. 12. No. 14, May 1, 1994, pp. 638-644.

Pahlavan et al., "Performance of Adaptive Matched Filter Receivers Over Facing Multipath Channels," IEEE, vol. 38, No. 12, pp. 2106-2113, Dec. 1990.

Giannetti et al., "Design of an All-Digital Receiver for Narrowhead Continuous-Phase Asynchronous CDMA Systems," IEEE, vol. 3, May 1993, pp. 468-472.

Braun et al., "An All-Digital Receiver for Satellite Audio Broadcasting Signals Using Trellis Coded Quasi-Orthogonal Code-Division Multiplexing," AEI, vol. 4, No. 1, 1993, pp. 23-32.

Rick et al., "Noncoherent Parallel Acquisition on CDMA Spread Spectrum Systems," IEEE, Paragraph 1, May 1994.

Esmailzadeh, et al., "Power control in packet switched time division duplex direct sequence spread spectrum communications" Vehicular Technology Conference, 1992 IEEE 42$^{nd}$, vol. 2, May 10-13, 1992; pp. 989-992.

D'Avella, et al., "Power control in CDMA systems: performance evaluation and system design implications" Universal Personal communications, 1994, Record., 1994 Third Annual international conference on, Sep. 27-Oct. 1, 1994; pp. 73-77.

Chuang et al., "Uplink power control for TDMA portable radio channnes" Vehicular Technology, IEEE Transactions on, vol. 43, Issue: Feb. 1, 1994; pp. 33-39.

Bernasoni, "Receiver Architectures for the Down-Link in a DS-CDMA Mobile System," IEEE, Sep. 1994, pp. 51-55.

TIA/EIA/IS-95-A, "Mobile Station-Base Station Compatibility Standard for Dual-Mode Wideband Spread Spectrum Cellular System", TIA/EIA Interim Standard, Telecommunications Industry Association, May 1995.

Patent Abstracts of Japan, vol. 015, No. 003 (E-1019), Jan. 7, 1991 & JP 02 256331 A (Sharp Corp.), Oct. 17, 1990, see abstract.

Komo J, KimC: "implementation consideration of code division multiple access sequences" 23$^{RD}$ Southerstern Symposium On System Theory, Mar. 12, 1991, pp. 11-15.

TIA Interim Standard "Mobile Station-Base Station Compatibility Standard for Dual-Mode Wideband Spread Spectrum Cellular System", TIA/EIA/IS-95-A, Telecommunications Industry Association, May 1995.

I et al., "Performance of Multi-Code CDMA Wireless Personal Communications Networks", IEEE, 1995, pp. 907-911.

I et al., "Multi-Code CDMA Wireless Personal Communications Networks", IEEE, 1995, pp. 1060-1064.

Krzymien et al., "Rapid Acquisition Algorithms for Synchronization of Bursty Transmissions in CDMA Microcellular and Personal Wireless Systems", IEEE Journal in Selected Areas in Communications, vol. 14, No. 3, Apr. 1996, pp. 570-579.

H. Azad,"Multirate Spread Spectrum Direct Sequence CDMA Techniques", IEE Colloq. on Spread Spectrum Techniques for Radio Communication Systems, Digest No. 1994/ 098 (IEE, 1994) pp. 4/1-4/5.

I et al., "Variable Spreading Gain CDMA with Adaptive Control for True Packet Switching Wireless Network", IEEE, 1995, pp. 725-730.

Tachikawa et al., "Nonlinear Code Sequence for Rapid Acquisition", Study Report of the Spread Spectrum Communication System Study Group, The Institute of Electrical, Information, Electronics and Communications Engineers of Japan (IEIEC), Mar. 1987.

"Public Version of Respondents Samsung Electronics America, Inc.'s and Samsung Telecommunications America LLC's Response to the Complaint and Notice of Investigation," *In the Matter of Certain 3G Wideband Code Division Multiple Access (WCDMA) Handsets and Components Thereof*, (United States International Trade Commission), (Investigation No. 337-TA-601), (May 31, 2007).

Andermo et al., "A CDMA-Based Radio Access Design for UMTS," *IEEE Personal Communications*, pp. 48-53, (Feb. 1995).

Andermo et al., "Code Division Testbed, CODIT," *Record*, ICUPC'93 Conference, pp. 397 - 401, (IEEE 1993).

Andermo et al., "CODIT, a Testbed Project Evaluating DS-CDMA for UMTS/FPLMTS," pp. 21- 25, IEEE (1994).

Andermo, "CODIT Final Review Report," R2020/ERA/PM/DS/P/050/b1, Issue 2.0, *UMTS Code Division Testbed (CODIT)*. (Nov. 21, 1995).

Association of Radio Industries and Businesses (ARIB), *Specifications of Air-Interface for 3G Mobile System*, vol. 3, ver 1.0, (Jan. 14, 1999).

Baier et al., "Design Study for a CDMA Based Third Generation Mobile Radio System," *IEEE Journal on Selected Areas in Communications*, vol. 12, No. 4, pp. 733-743, (May 1994).

Blahut, *Theory and Practice of Error Control Codes*, (Addison-Wesley Publishing Company, 1983).

Blasbalg, "A Comparison of Pseudo-Noise and Conventional Modulation for Multiple-Access Satellite Communications," *IBM Journal*, pp. 241-255, (Jul. 1965).

Cameron et al., "An Analysis of CDMA With Imperfect Power Control," 1993 43rd *IEEE Vehicular Technology Conference*, (Seacaucus, NJ, May 18-20, 1993), pp. 977-979, (IEEE 1992).

Chuang et al., "Uplink Power Control for TDMA Portable Radio Channels," *IEEE Transactions on Vehicular Technology*, vol. 43, No. 1, pp. 33-39, (Feb. 1994).

Cosmas et al., "Overview of the Mobile Communications Programme of RACE II, " *Electronics and Communication Engineering Journal*, pp. 155-167,(Aug. 1995).

D'Avella et al., "Power Control in CDMA Systems: Performance Evaluation and System Design Implications," Universal Personal Communications, 1994, Record, 1994 Third Annual International Conference on, pp. 73-77 (Sep. 27 - Oct. 1, 1994).

Dixon, *Spread Spectrum Systems With Commercial Applications, Third Edition*, pp. 412 - 415, (John Wiley & Sons, Inc. 1994).

Esmailzadeh et al., "Power Control in Packet Switched Time Division Duplex Direct Sequence Spread Spectrum Communications," *Vehicular Technology Conference*, 1992 IEEE 42nd, vol. 2, pp. 989-992, (May 10-13, 1992).

ETSI TC-RES, European Telecommunication Standard ETS 300 444, "Radio Equipment and Systems (Res); Digital European Cordless Telecommunications (DECT) Generic Access Profile (GAP)," (European Telecommunication Standards Institute, Dec. 1995).

ETSI TC-RES, European Telecommunication Standard prETS 300 444, "Radio Equipment and Systems (RES); Digital European Cordless Telecommunications (DECT) Generic Access Profile (GAP)," (European Telecommunication Standards Institute, Feb. 1995).

ETSI TC-RES, Interim European Telecommunication Standard (I-ETS) 300 131, "Radio Equipment and Systems (RES); Common Air Interface Specification to be used for the interworking between cordless telephone apparatus in the frequency band 864, 1 MHz to 868,1 MHz, including public services," (European Telecommunication Standards Institute, Apr. 1992).

Fluhr et al, "Advanced Mobile Phone Service: Control Architecture," *The Bell System Technical Journal*, vol. 58, No. 1, pp. 43-69, (American Telephone and Telegraph Company Jan. 1979).

Hinderling et al., "CDMA Mobile Station Modem ASIC," *IEEE Journal of Solid State Circuits*, vol. 28, No.3, pp. 253-260, (Mar. 1993).

Holtzman, "A Simple, Accurate Method to Calculate Spread-Spectrum Multiple-Access Error Probabilities," *IEEE Transactions on Communications*, vol. 40, No. 3, pp. 461-464, (IEEE, Mar. 1992).

Interdigital / Siemens, "Functional Interface Specification (FIS) for Radio in the Local Loop based on B-CDMA, CDMAlink version 1," Issue 1.0 (Siemens AG Jun. 23, 1995).

International Dictionary of Physics and Electronics, Second Edition, pp. 612 and 952, (D. Van Nostrand Company, Inc., 1956, 1961).

Kohno et al., "Spread Spectrum Access Methods for Wireless Communications," *IEEE Communications*, vol. 33, No. 1, pp. 58-67, (IEEE, Jan. 1995).

Lee, "Overview of Cellular CDMA," *IEEE Transactions on Vehicular Technology*, vol. 40, No. 2, pp. 291-302, (May 1991).

McDonald, *Fundamentals of Digital Switching*, (Plenum Press, 1983).

McEliece, R. J., "Correlation Properties of Sets of Sequences Derived From Irreducible Cyclic Codes," *Information and Control* 45, pp. 18-25 (1980).

McFarlane et al., "Validation of Advanced CDMA Concepts for UMTS and FPLMTS," pp. 36-40, (IEEE 1994).

McFarlane, "UMTS Revisited," (IEE, London, UK 1994).

Ormondroyd, "Power Control for Spread-Spectrum Systems," *Conference on Communications Equipment and Systems*pp. 109-115, (Apr. 20-22, 1982).

Pursley, "Performance Evaluation for Phase-Coded Spread-Spectrum Multiple-Access Communication — Part 1: System Analysis," *IEEE Transactions on Communications*, vol. COM-25, No. 8, pp. 795-799, (Aug. 1977).

QUALCOMM, "Proposed EIA/TIA Interim Standard: Wideband Spread Spectrum Digital Cellular System Dual- Mode Mobile Station — Base Station Compatibility Standard," TR45.5, (Apr. 21, 1992).

Salmasi et al., "On the System Design Aspects of Code Division Multiple Access (CDMA) Applied to Digital Cellular and Personal Communications Networks," *Vehicular Technology Conference*, 1991. ' *Gateway to the Future Technology in Motion*', 41st IEEE, pp. 57-62, (May 19-22, 1991).

Schilling, "Broadband-CDMA: ONEPHONE for a Wireless Twenty First Century," ICPWC'94, pp. 1-5, (IEEE 1994).

Scholtz, "The Origins of Spread Spectrum Communications," *IEEE Transactions on Communications*, vol. COM-30, No. 5, pp. 822-854, (May 1982).

Siemens AG, "CDMA / link System Description," ver. 3.00 (Mar. 10, 1995).

Simon et al., *Spread Spectrum Communications Handbook*, Revised Edition pp. 262-396, (McGraw Hill New York, 1994).

Simpson et al., "CDMA Power Control, Interleaving, and Coding, " *41st IEEE Vehicular Technology Conference*, (St. Louis, MO, May 19-22, 1991) pp. 362-367, (IEEE 1991).

Simpson et al., "Direct Sequence CDMA Power Control, Interleaving and Coding," *IEEE Journal on Selected Areas in Communications*, vol. 11, No. 7, pp. 1085-1095, (Sep. 1993).

Soliman et al., "CDMA Reverse Link Open Loop Power Control," *Globecom '92 IEEE Global Telecommunications Conference* (Orlando, Fl, Dec. 6-9, 1992) pp. 69-73, (IEEE 1992).

TIA/EIA/IS-95, "Mobile Station-Base Station Compatibility Standard for Dual-Mode Wideband Spread Spectrum Cellular System", TIA/EIA Interim Standard, pp. 7-12, 7.14, and 7.15, (Telecommunications Industry Association, Jul. 1993).

Tiedemann et al., "The Design and Development of a Code Division Multiple Access (CDMA) System for Cellular and Personal Communications," *IEEE International Symposium on Personal, Indoor and Mobile Radio Communications*, (London, UK, Sep. 23-25, 1991) pp. 131-136, (IEEE 1991).

Van Nielen, "UMTS: A Third Generation Mobile System," PIMRC '92, (Boston, MA, Oct. 19-21, 1992) pp. 17-21, (1992).

Zagami et al., "Providing Universal Location Services Using a Wireless E911 Location Network," *IEEE Communications Magazine*, pp. 66-71, (Apr. 1998).

Ziemer et al., *Digital Communications and Spread Spectrum Systems*, pp. 492-494 (Collier Macmillan 1985).

In the Matter of Certain 3G Mobile Handsets and Components, Investigation No. 337-TA-613 (Aug. 14, 2009).

"Final Initial and Recommended Determination," In the Matter of Certain 3G Mobile Handsets and Components, United States Trade Commission, Investigation No. 337-TA-613 (Aug. 14, 2009).

"Notice of Commission Determination to Review in Part A Final Determination Finding No. Violation of Section 337 and on Review to Affirm the Administrative Law Judge's Determination of No Violation; Termination of Investigation," In the Matter of Certain 3G Mobile Handsets and Components, United States Trade Commission, Investigation No. 337-TA-613 (Oct. 16, 2009).

Kato et al., An improvement on channel quality for personal communications systems, Proceedings of General Conference 1995 of the Institute of Electronics, Information and Communication Engineers, Communication 1, p. 513, B513 (Mar. 10, 1995).

Schnell, "Hadamard Codewords as Orthogonal Spreading Sequences in Synchronous DS CDMA Systems for Mobile Radio Channels," IEEE Third International Symposium on Spread Spectrum Techniques and Applications, vol. 2, pp. 505-509, (Jul. 4-6, 1994).

\* cited by examiner

TRANSFERRING VOICE AND NON-VOICE DATA

CODE DETECTION

This application is a continuation of U.S. patent application Ser. No. 09/840,769, filed Apr. 24, 2001, now U.S. Pat. No. 6,633,600, which is a continuation of U.S. patent application Ser. No. 09/444,079, filed Nov. 22, 1999, now U.S. Pat. No. 6,229,843, which is a continuation of U.S. patent application Ser. No. 09/024,473, filed Feb. 17, 1998, now U.S. Pat. No. 5,991,332, which is a divisional of U.S. patent application Ser. No. 08/669,769, filed Jun. 27, 1996, now U.S. Pat. No. 5,796,776, which claims priority from U.S. Provisional Application No. 60/000,775 filed Jun. 30, 1995.

BACKGROUND

Providing quality telecommunication services to user groups which are classified as remote, such as rural telephone systems and telephone systems in underdeveloped countries, has proved to be a challenge over recent years. The past needs created by these services have been partially satisfied by wireless radio services, such as fixed or mobile frequency division multiplex (FDM), frequency division multiple access (FDMA), time division multiplex (TDM), time division multiple access (TDMA) systems, combination frequency and time division systems (FD/TDMA), and other land mobile radio systems. Often, these remote services are faced with more potential users than can be supported simultaneously by their frequency or spectral bandwidth capacity.

Recognizing these limitations, recent advances in wireless communications have used spread spectrum modulation techniques to provide simultaneous communication by multiple users. Spread spectrum modulation refers to modulating a information signal with a spreading code signal; the spreading code signal being generated by a code generator where the period Tc of the spreading code is substantially less than the period of the information data bit or symbol signal. The code may modulate the carrier frequency upon which the information has been sent, called frequency-hopped spreading, or may directly modulate the signal by multiplying the spreading code with the information data signal, called direct-sequence spreading (DS). Spread-spectrum modulation produces a signal with bandwidth substantially greater than that required to transmit the information signal, and synchronous reception and despreading of the signal at the receiver demodulator recovers the original information. The synchronous demodulator uses a reference signal to synchronize the despreading circuits to the input spread-spectrum modulated signal in order to recover the carrier and information signals. The reference signal can be a spreading code which is not modulated by an information signal. Such use of a synchronous spread-spectrum modulation and demodulation for wireless communication is described in U.S. Pat. No. 5,228,056 entitled SYNCHRONOUS SPREAD-SPECTRUM COMMUNICATIONS SYSTEM AND METHOD by Donald L. Schilling, which is incorporated herein by reference.

Spread-spectrum modulation in wireless networks offers many advantages because multiple users may use the same frequency band with minimal interference to each user's receiver. Spread-spectrum modulation also reduces effects from other sources of interference. In addition, synchronous spread-spectrum modulation and demodulation techniques may be expanded by providing multiple message channels for a user, each spread with a different spreading code, while still transmitting only a single reference signal to the user. Such use of multiple message channels modulated by a family of spreading codes synchronized to a pilot spreading codes for wireless communication is described in U.S. Pat. No. 5,166,951 entitled HIGH CAPACITY SPREAD-SPECTRUM CHANNEL by Donald L. Schilling, which is incorporated herein by reference.

One area in which spread-spectrum techniques are used is in the field of mobile cellular communications to provide personal communication services (PCS). Such systems desirably support large numbers of users, control Doppler shift and fade, and provide high speed digital data signals with low bit error rates. These systems employ a family or orthogonal or quasi-orthogonal spreading codes, with a pilot spreading code sequence synchronized to the family of codes. Each user is assigned one of the spreading codes as a spreading function. Related problems of such a system are: supporting a large number of users with the orthogonal codes, handling reduced power available to remote units, and handling multipath fading effects. Solutions to such problems include using phased-array antennas to generate multiple steerable beams, using very long orthogonal or quasi-orthogonal code sequences which are reused by cyclic shifting of the code synchronized to a central reference, and diversity combining of multipath signals. Such problems associated with spread spectrum communications, and methods to increase capacity of a multiple access, spread-spectrum system are described in U.S. Pat. No. 4,901,307 entitled SPREAD SPECTRUM MULTIPLE ACCESS COMMUNICATION SYSTEM USING SATELLITE OR TERRESTRIAL REPEATERS by Gilhousen et al. which is incorporated herein by reference.

SUMMARY

A wireless communication unit comprises circuitry configured to receive a voice data associated with a first logical channel. The circuitry further configured to receive a non-voice data associated with a second logical channel. The voice data and non-voice block carried by a wireless channel set during a time period. The wireless channel set comprises a plurality of wireless channels. The wireless channel is associated with the communication unit. Circuitry is configured to insert information into the non-voice data, when the non-voice data is missing in the wireless channel set during the time period.

BRIEF DESCRIPTION OF THE DRAWING(S)

DETAILED DESCRIPTION OF THE PREFERRED EMBODIMENT(S)

Figure 1:
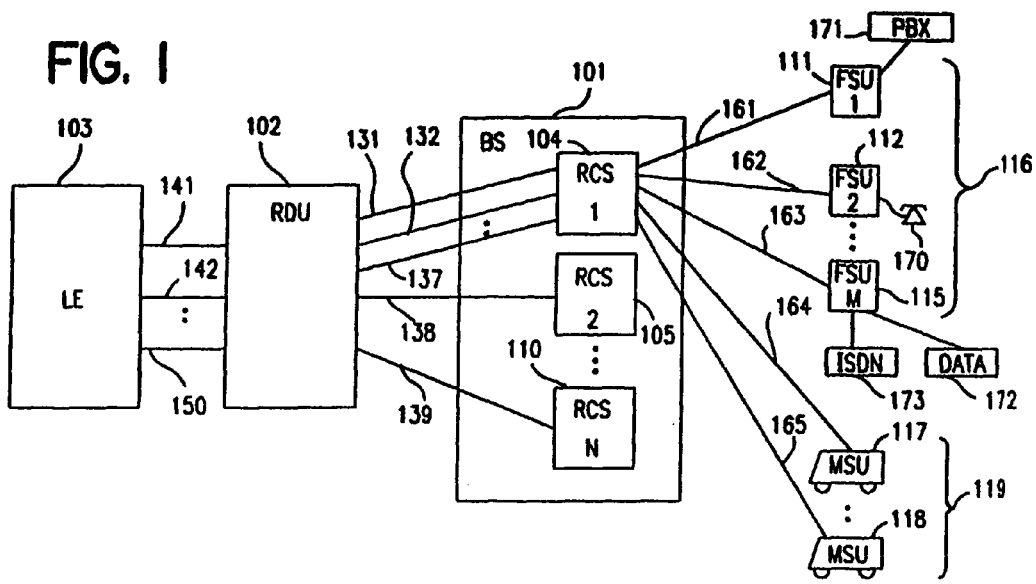
FIG. 1 is a block diagram of a code division multiple access communication system according to the present invention.

Referring to FIG. 1, the radio links 161 to 165 incorporate Broadband Code Division Multiple Access (B-CDMA™) as the mode of transmission in both the Uplink and Downlink directions. CDMA (also known as Spread Spectrum) communication techniques used in multiple access systems are well-known, and are described in U.S. Pat. No.5,228,056 entitled SYNCHRONOUS SPREAD-SPECTRUM COMMUNICATION SYSTEM AND METHOD by Donald T. Schilling which is incorporated herein by reference. The described exemplary system uses the Direct Sequence (DS) spreading technique. In each modem, one or more CDMA modulators performs the spread-spectrum spreading code sequence generation. In addition, the modems generate, for example, a pseudonoise (PN) spreading sequence; and perform complex DS modulation to produce quadrature phase shift keying (QPSK) signals for the In-phase (I) and Quadrature (Q) channels. Pilot signals are generated and transmitted with the modulated signals. The pilot signals of the present embodiment are spreading codes which are not modulated by data. The pilot signals are used for system synchronization, carrier phase recovery, and for estimating the impulse response of the radio channel. Each SU includes a single pilot generator and at least one CDMA modulator and demodulator, called a CDMA modem. Each RCS 104, 105, 110 has a single pilot generator plus sufficient CDMA modulators and demodulators for all the logical channels in use by all SUs.

The CDMA demodulator despreads the signal, with appropriate processing to combat or exploit multipath propagation effects. Parameters concerning the received power level are used to generate the Automatic Power Control (APC) information which, in turn, is transmitted to the other end (i.e. from the SU to the RCS or from the RCS to the SU). The APC information is used to control transmit power of the automatic forward power control (AFPC) and automatic reverse power control (ARPC) links. In addition, each RCS 104, 105 and 110 may perform Maintenance Power Control (MPC), in a manner similar to APC, to adjust the initial transmit power of each SU 111, 112, 115, 117 and 118.

Diversity combining at the radio antennas of the RCS 104, 105 and 110 is not necessary because CDMA has inherent frequency diversity due to the spread bandwidth. Receivers may include Adaptive Matched Filters (AMFs) (not shown in FIG. 1), however, which combine the multipath signals. In the exemplary embodiment, AMFs perform Maximal Ratio Combining.

Logical Communication Channels

A "channel" of the prior art is usually regarded as a communications path which is part of an interface and which can be distinguished from other paths of that interface without regard to its content. In the case of CDMA, however, separate communications paths are distinguished only by their content. The term "logical channel" is used to distinguish the separate data streams, which are logically equivalent to channels in the conventional sense. All logical channels and sub-channels of the present invention are mapped to a common 64 kilo-symbols per second (ksym/s) QPSK stream. Some channels are synchronized to associated pilot codes which are generated in the same way and perform much the same function as the system Global Pilot Code. The system pilot signals are not, however, considered logical channels.

Several logical communication channels are used over the RF communication link between the RCS and SU. Each logical communication channel has either a fixed, pre-determined spreading code or a dynamically assigned spreading code. For both pre-determined and assigned codes, the code phase is in synchronism with the Pilot Code. Logical communication channels are divided into two groups: the Global Channel (GC) group includes those channels which are either transmitted from the base station RCS to all the remote SUs or from any SU to the RCS of the base station regardless of the SU's identity. These channels contain for all users and include the channels used by SUs to gain access to message communication channels. Channels in the Assigned Channels (AC) group are those channels which are dedicated to communication between the RCS and a particular SU.

The Global Channels (GC) group provides for 1) Broadcast logical channels, which provide point to multipoint services for broadcasting messages to all SUs and paging messages to SUs; and 2) Access Control logical channels which provide point-to-point services on global channels for SUs to access the system and obtain assigned channels.

An Assigned Channel (AC) group contains the logical channels that control a single telecommunication connection between the RCS and a SU. The functions developed when an AC group is formed consists of a pair of power control logical message channels for each of the Uplink and Downlink connections, and depending on the type of connection, one or more pairs of traffic channels. The Bearer Control function performs the required forward error control, bearer rate modification, and encryption functions. The logical channels which constitute the BC and AC groups are summarized below in Table 1.

natively, the APC and order wire (OW) data may be separately modulated using complex spreading code sequences, or they may be time division multiplexed with a 16 kbit/s traffic channel.

The Spreading Codes

The CDMA code generators used to encode the logical channels of the present invention employ Linear Shift Registers (LSRs) with feedback logic which is a method well known in the art. The code generators of the present embodiment of the invention generate 64 synchronous unique sequences. Each RF communication channel uses a pair of these sequences for complex spreading (in-phase and quadrature) of the logical channels, so the generator gives 32 complex spreading sequences. The sequences are generated by a single seed which is initially loaded into a shift register circuit.

TABLE 1

Logical Channels and sub-channels of the B-CDMA Air Interface

| Channel Name | Abbr. | Brief Description | Direction (forward or reverse) | Bit rate | Max BER | Power level | Pilot |
|---|---|---|---|---|---|---|---|
| Global Channels | | | | | | | |
| Fast Broadcast Channel | FBCH | Broadcasts fast-changing system information | F | 16 kbit/s | 1e−4 | Fixed | GLPT |
| Slow Broadcast Channel | SBCH | Broadcasts paging messages to FSUs and slow-changing system information | F | 16 kbit/s | 1e−7 | Fixed | GLPT |
| Access Channels | AXCH(i) | For initial access attempts by FSUs | R | 32 kbit/s | 1e−7 | Controlled by APC | LAXT(i) |
| Control Channels | CTCH(i) | For granting access | F | 32 kbit/s | 1e−7 | Fixed | GLPT |
| Assigned Channels | | | | | | | |
| 16 kbit/s POTS | TRCH/16 | General POTS use | F/R | 16 kbit/s | 1e−4 | Controlled by APC | F-GLPT R-ASPT |
| 32 kbit/s POTS | TRCH/32 | General POTS use | F/R | 32 kbit/s | 1e−4 | Controlled by APC | F-GLPT R-ASPT |
| 64 kbit/s POTS | TRCH/64N | POTS use for in-band modems/fax | F/R | 64 kbit/s | 1e−4 | Controlled by APC | F-GLPT R-ASPT |
| Traffic channel @64 kbit/s-low BER | TRCH/64L | ISDN B channel or LL | F/R | 64 kbit/s | 1e−7 | Controlled by APC | F-GLPT R-ASPT |
| D channel | TRCH/16L | ISDN D channel | F/R | 16 kbit/s | 1e−7 | Controlled by APC | F-GLPT R-ASPT |
| Order wire channel | OW | assigned signaling channel | F/R | 32 kbit/s | 1e−7 | Controlled by APC | F-GLPT R-ASPT |
| APC channel | APC | carries APC commands | F/R | 64 kbit/s | 2e−1 | Controlled by APC | F-GLPT R-ASPT |

The APC data is sent at 64 kbit/sec. The APC logical channel is not FEC coded to avoid delay and is transmitted at a low power level to minimize capacity used for APC. Alter-

The Generation of Spreading Code Sequences and Seed Selection

The spreading code period of the present invention is defined as an integer multiple of the symbol duration, and the beginning of the code period is also the beginning of the symbol. The relation between bandwidths and the symbol lengths chosen for the exemplary embodiment of the present invention is:

| BW (MHZ) | L (chips/symbol) |
|---|---|
| 7 | 91 |
| 10 | 130 |
| 10.5 | 133 |
| 14 | 182 |
| 15 | 195 |

The spreading code length is also a multiple of 64 and of 96 for ISDN frame support. The spreading code is a sequence of symbols, called chips or chip values. The general methods of generating pseudorandom sequences using Galois Field mathematics is known to those skilled in the art; however, the inventor has derived a unique set, or family, of code sequences for the present invention. First, the length of the linear feedback shift register to generate a code sequence is chosen, and the initial value of the register is called a "seed". Second, the constraint is imposed that no code sequence generated by a code seed can be a cyclic shift of another code sequence generated by the same code seed. Finally, no code sequence generated from one seed can be a cyclic shift of a code sequence generated by another seed.

The inventor has determined that the spreading code length of chip values of the present invention is:

$$128 \times 233415 = 29877120 \qquad (1)$$

The spreading codes are generated by combining a linear sequence of period 233415 and a nonlinear sequence of period 128.

The nonlinear sequence of length 128 is implemented as a fixed sequence loaded into a shift register with a feed-back connection. The fixed sequence can be generated by an m-sequence of length 127 padded with an extra logic 0, 1, or random value as is well known in the art.

The linear sequence of length L=233415 is generated using a linear feedback shift register (LFSR) circuit with 36 stages. The feedback connections correspond to a irreducible polynomial h(n) of degree 36. The polynomial h(x) chosen by the inventor for the exemplary embodiment of the present invention is $$h(x) = x^{36} + x^{35} + x^{30} + x^{28} + x^{26} + x^{25} + x^{22} + x^{20} + x^{19} + x^{17} + x^{16} + x^{15} + x^{14} + x^{12} + x^{11} + x^9 + x^8 + x^4 + x^3 + x^2 + 1 \qquad (2)$$

A group of "seed" values for a LFSR representing the polynomial h(x) of equation (2) which generates code sequences that are nearly orthogonal with each other is determined. The first requirement of the seed values is that the seed values do not generate two code sequences which are simply cyclic shifts of each other.

The present invention includes a method to increase the number of available seeds for use in a CDMA communication system by recognizing that certain cyclic shifts of the previously determined code sequences may be used simultaneously. The round trip delay for the cell sizes and bandwidths of the present invention are less than 3000 chips. In one embodiment of the present invention, sufficiently separated cyclic shifts of a sequence can be used within the same cell without causing ambiguity for a receiver attempting to determine the code sequence. This method enlarges the set of sequences available for use.

By implementing the tests previously described, a total of 3879 primary seeds were determined by the inventor through numerical computation. These seeds are given mathematically as $$d^n \text{ modulo } h(x). \qquad (3)$$

When all primary seeds are known, all secondary seeds of the present invention are derived from the primary seeds by shifting them multiples of 4095 chips modulo h(x). Once a family of seed values is determined, these values are stored in memory and assigned to logical channels as necessary. Once assigned, the initial seed value is simply loaded into LFSR to produce the required spreading-code sequence associated with the seed value.

Epoch and Sub-epoch Structures

The long complex spreading codes used for the system of the current invention have a number of chips after which the code repeats. The repetition period of the spreading sequence is called an epoch. To map the logical channels to CDMA spreading codes, the present invention uses an Epoch and Sub-epoch structure. The code period for the CDMA spreading code to modulate logical channels is 29877120 chips/code period which is the same number of chips for all bandwidths. The code period is the epoch of the present invention, and the Table 2 defines the epoch duration for the supported chip rates. In addition, two sub-epochs are defined over the spreading code epoch and are 233415 chips and 128 chips long.

The 233415 chip sub-epoch is referred to as a long sub-epoch, and is used for synchronizing events on the RF communication interface such as encryption key switching and changing from global to assigned codes. The 128 chip short epoch is defined for use as an additional timing reference. The highest symbol rate used with a single CDMA code is 64 ksym/sec. There is always an integer number of chips in a symbol duration for the supported symbol rates 64, 32, 16, and 8 ksym/s.

| Bandwidth (MHz) | Chip Rate, Complex (M chip/sec) | number of chips in a 64 kbit/sec symbol | 128 chip sub-epoch duration* (μs) | 233415 chip sub-epoch duration* (ms) | Epoch duration (sec) |
|---|---|---|---|---|---|
| 7 | 5.824 | 91 | 21.978 | 40.078 | 5.130 |
| 10 | 8.320 | 130 | 15.385 | 28.055 | 3.591 |
| 10.5 | 8.512 | 133 | 15.038 | 27.422 | 3.510 |
| 14 | 11.648 | 182 | 10.989 | 20.039 | 2.565 |
| 15 | 12.480 | 195 | 10.256 | 18.703 | 2.394 |

*numbers in these columns are rounded to 5 digits.

Figure 2A:
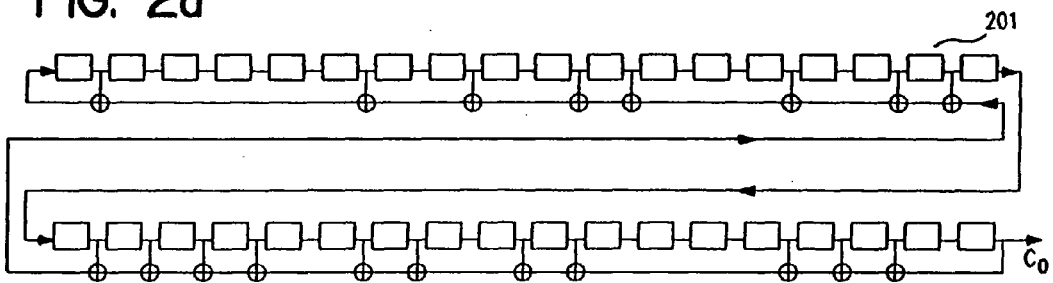
FIG. 2a is a block diagram of a 36 stage linear shift register suitable for use with long spreading-code of the code generator of the present invention.
Figure 2B:
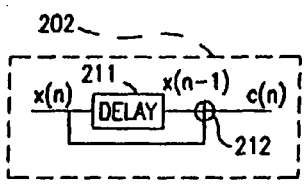
FIG. 2b is a block diagram of circuitry which illustrates the feed-forward operation of the code generator.
Figure 2C:
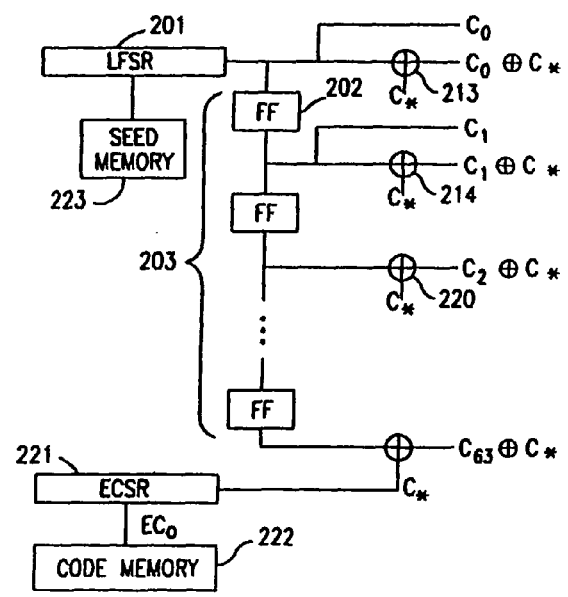
FIG. 2c is a block diagram of an exemplary code generator of the present invention including the circuit for generating spreading-code sequences from the long spreading-code and the short spreading-codes.

Cyclic sequences of the prior art are generated using linear feedback shift register (LFSR) circuits. This method, however, does not generate sequences of even length. One embodiment of the spreading code sequence generator using the code seeds generated previously is shown in FIG. 2a, FIG. 2b, and FIG. 2c. The exemplary system uses a 36 stage LFSR 201 to generate a sequence of period $N' = 233415 = 3^3 \times 5 \times 7 \times 13 \times 19$, which is $C_0$ in FIG. 2a. In the FIGS. 2a, 2b, and 2c the symbol .sym. represents a binary addition (EXCLUSIVE-OR). A sequence generator designed as above generates the in-phase and quadrature parts of a set of complex sequences. The tap connections and initial state of the 36 stage LFSR determine the sequence generated by this circuit. The tap coefficients of the 36 stage LFSR are determined such that the resulting sequences have the period 233415. Note that the tap connections shown in FIG. 2a correspond to the polynomial given in equation (2). Each resulting sequence is then overlaid by binary addition with the 128 length sequence C* to obtain the epoch period 29877120.

FIG. 2b shows a Feed Forward (FF) circuit 202 which is used in the code generator. The signal X[n−1] is output of the chip delay 211, and the input of the chip delay 211 is X[n]. The code chip C[n] is formed by the logical adder 212 for the input X[n] and X[n−1]. FIG. 2c shows the complete spreading-code generator. From the LFSR 201, output signals go through a chain of up to 63 single stage FFs 203 cascaded as shown. The output of each FF is overlaid with the short, even code sequence C* which has a period of $128=2^7$, the short code sequence C* is stored in code memory 222 and exhibits spectral characteristics of a pseudorandom sequence to obtain the epoch N=29877120 when combined with the sequences provided by the FFs 203. This sequence of 128 is determined by using an m-sequence (PN sequence) of length $127=2^7-1$ and adding a bit-value, such as logic 0, to the sequence to increase the length to 128 chips. The even code sequence C* is input to the even code shift register 221, which is a cyclic register, that continually outputs the sequence. The short sequence is then combined with the long sequence using an EXCLUSIVE-OR operation 213, 214, 220.

Figure 2D:
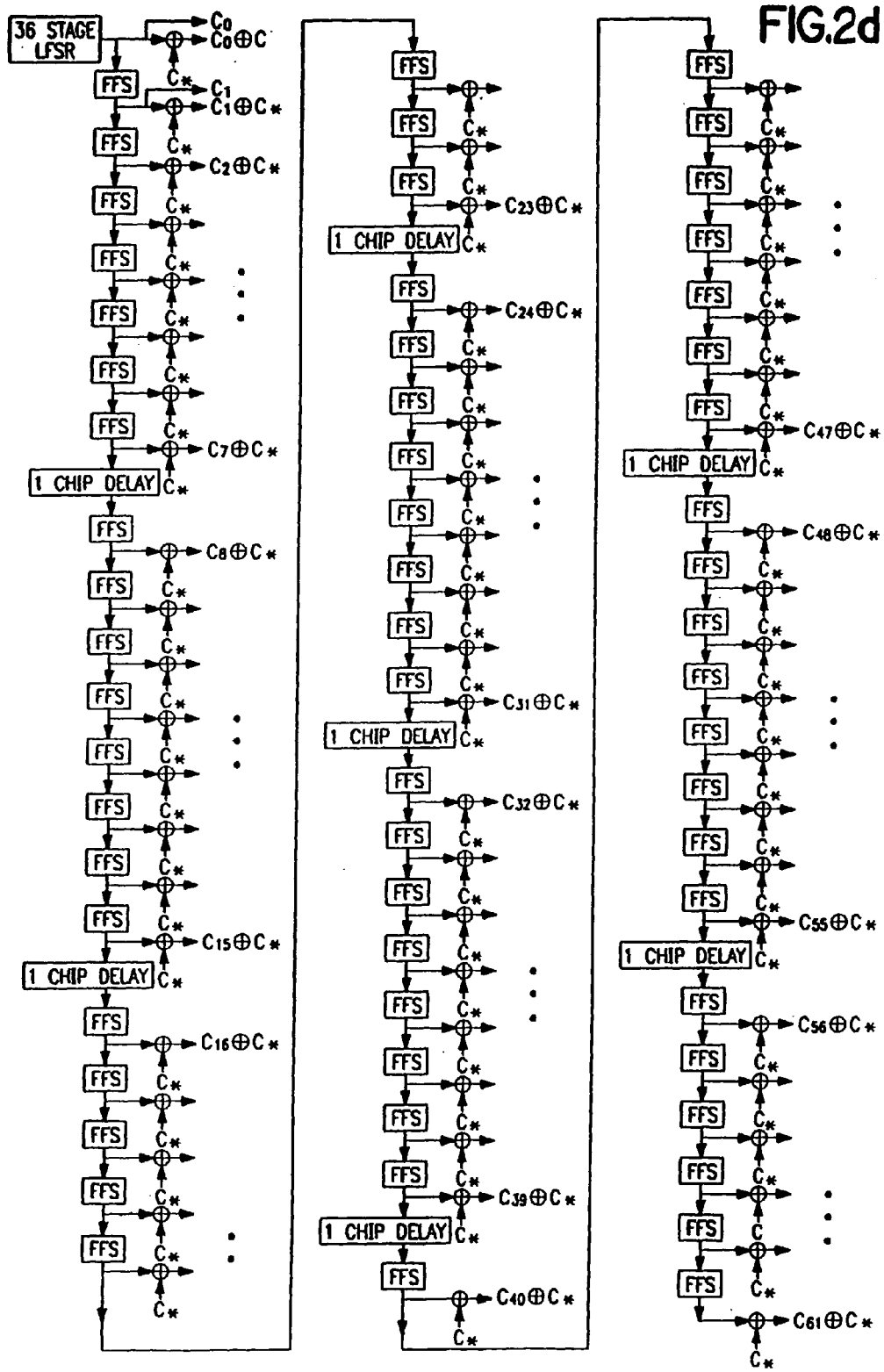
FIG. 2d is an alternate embodiment of the code generator circuit including delays to compensate for electrical circuit delays.

As shown in FIG. 2c, up to 63 spreading-code sequences $C_0$ through $C_{63}$ are generated by tapping the output signals of FFs 203 and logically adding the short sequence C* in a binary adders 213, 214, and 220, for example. One skilled in the art would realize that the implementation of the FF 203 create a cumulative delay effect for the code sequences produced at each FF stage in the chain. This delay is due to the nonzero electrical delay in the electronic components of the implementation. The timing problems associated with the delay can be mitigated by inserting additional delay elements into the FF chain. An exemplary FF chain with additional delay elements is shown in FIG. 2d.

The code-generators in the exemplary system are configured to generate either global codes, or assigned codes. Global codes are CDMA codes that can be received or transmitted by all users of the system. Assigned codes are CDMA codes that are allocated for a particular connection. When a family of sequences is generated from the same generator as described, only the seed of the 36 stage LFSR is specified. Sequences for all the global codes, are generated using the same LFSR circuit. Therefore, once an SU has synchronized to the Global pilot signal from an RCS and knows the seed for the LFSR circuit for the Global Channel codes, it can generate not only the pilot sequence but also all other global codes used by the RCS.

The signal that is upconverted to RF is generated as follows. The spreading sequences produced by the above shift register circuits are converted to an antipodal sequence (0 maps into +1, 1 maps into −1). The Logical channels are initially converted to APSK signals, which are mapped as constellation points as is well known in the art. The In-phase and Quadrature channels of each QPSK signal form the real and imaginary parts of the complex data value. Similarly, two spreading codes are used to form complex spreading chip values. The complex data and complex spreading code are multiplied to produce a spread-spectrum data signal. Similarly, for despreading, the received complex data is correlated with the conjugate of the complex spreading code to recover the data signal.

Short Codes

Short codes are used for the initial ramp-up process when an SU accesses an RCS. The period of the short codes is equal to the symbol duration and the start of each period is aligned with a symbol boundary. Both the SUs and the RCS derive the real and imaginary parts of the short codes from the last eight feed-forward sections of the sequence generator to produce the global codes for that cell. Details on the implementation of the initial ramp-up process may be found in a U.S. patent application entitled "A METHOD OF CONTROLLING INITIAL POWER RAMP-UP IN CDMA SYSTEMS BY USING SHORT CODES", filed on even date herewith which is incorporated herein by reference.

The signals represented by these short codes are known as Short Access Channel pilots (SAXPTs).

Mapping of Logical Channels to Spreading Codes

The exact relationship between the spreading-code sequences and the CDMA logical channels and pilot signals is documented in Table 3a and Table 3b. Those signal names ending in '—CH' correspond to logical channels. Those signal names ending in '—PT' correspond to pilot signals, which are described in detail below.

TABLE 3a

Spreading code sequences and global CDMA codes

| Sequence | Quadrature | Logical Channel or Pilot Signal | Direction |
|---|---|---|---|
| $C_0$ | I | FBCH | Forward (F) |
| $C_1$ | Q | FBCH | F |
| $C_2 \oplus C^*$ | I | GLPT | F |
| $C_3 \oplus C^*$ | Q | GLPT | F |
| $C_4 \oplus C^*$ | I | SBCH | F |
| $C_5 \oplus C^*$ | Q | SBCH | F |
| $C_6 \oplus C^*$ | I | CTCH (0) | F |
| $C_7 \oplus C^*$ | Q | CTCH (0) | F |
| $C_8 \oplus C^*$ | I | APCH (1) | F |
| $C_9 \oplus C^*$ | Q | APCH (1) | F |
| $C_{10} \oplus C^*$ | I | CTCH (1) | F |
| $C_{11} \oplus C^*$ | Q | CTCH (1) | F |
| $C_{12} \oplus C^*$ | I | APCH (1) | F |
| $C_{13} \oplus C^*$ | Q | APCH (1) | F |
| $C_{14} \oplus C^*$ | I | CTCH (2) | F |
| $C_{15} \oplus C^*$ | Q | CTCH (2) | F |
| $C_{16} \oplus C^*$ | I | APCH (2) | F |
| $C_{17} \oplus C^*$ | Q | APCH (2) | F |
| $C_{18} \oplus C^*$ | I | CTCH (3) | F |
| $C_{19} \oplus C^*$ | Q | CTCH (3) | F |
| $C_{20} \oplus C^*$ | I | APCH (3) | F |
| $C_{21} \oplus C^*$ | Q | APCH (3) | F |
| $C_{22} \oplus C^*$ | I | reserved | — |
| $C_{23} \oplus C^*$ | Q | reserved | — |
| . | . | . | . |
| . | . | . | . |
| . | . | . | . |
| $C_{40} \oplus C^*$ | I | reserved | — |
| $C_{41} \oplus C^*$ | Q | reserved | — |
| $C_{42} \oplus C^*$ | I | AXCH (3) | Reverse (R) |
| $C_{43} \oplus C^*$ | Q | AXCH (3) | R |
| $C_{44} \oplus C^*$ | I | LAXPT (3) SAXPT (3) seed | R |
| $C_{45} \oplus C^*$ | Q | LAXPT (3) SAXPT (3) seed | R |
| $C_{46} \oplus C^*$ | I | AXCH (2) | R |
| $C_{47} \oplus C^*$ | Q | AXCH (2) | R |
| $C_{48} \oplus C^*$ | I | LAXPT (2) SAXPT (2) seed | R |
| $C_{49} \oplus C^*$ | Q | LAXPT (2) SAXPT (2) seed | R |
| $C_{50} \oplus C^*$ | I | AXCH (1) | R |
| $C_{51} \oplus C^*$ | Q | AXCH (1) | R |
| $C_{52} \oplus C^*$ | I | LAXPT (1) SAXPT (1) seed | R |
| $C_{53} \oplus C^*$ | Q | LAXPT (1) SAXPT (1) seed | R |

TABLE 3a-continued

Spreading code sequences and global CDMA codes

| Sequence | Quadrature | Logical Channel or Pilot Signal | Direction |
|---|---|---|---|
| $C_{54} \oplus C*$ | I | AXCH (0) | R |
| $C_{55} \oplus C*$ | Q | AXCH (0) | R |
| $C_{56} \oplus C*$ | I | LAXPT (0) SAXPT (0) seed | R |
| $C_{57} \oplus C*$ | Q | LAXPT (0) SAXPT (0) seed | R |
| $C_{58} \oplus C*$ | I | IDLE | — |
| $C_{59} \oplus C*$ | Q | IDLE | — |
| $C_{60} \oplus C*$ | I | AUX | R |
| $C_{61} \oplus C*$ | Q | AUX | R |
| $C_{62} \oplus C*$ | I | reserved | — |
| $C_{63} \oplus C*$ | Q | reserved | — |

TABLE 3b

Spreading code sequences and assigned CDMA codes

| Sequence | Quadrature | Logical Channel or Pilot Signal | Direction |
|---|---|---|---|
| $C_0 \oplus C*$ | I | ASPT | Reverse (R) |
| $C_1 \oplus C*$ | Q | ASPT | R |
| $C_2 \oplus C*$ | I | APCH | R |
| $C_3 \oplus C*$ | Q | APCH | R |
| $C_4 \oplus C*$ | I | OWCH | R |
| $C_5 \oplus C*$ | Q | OWCH | R |
| $C_6 \oplus C*$ | I | TRCH (0) | R |
| $C_7 \oplus C*$ | Q | TRCH (0) | R |
| $C_8 \oplus C*$ | I | TRCH (1) | R |
| $C_9 \oplus C*$ | Q | TRCH (1) | R |
| $C_{10} \oplus C*$ | I | TRCH (2) | R |
| $C_{11} \oplus C*$ | Q | TRCH (2) | R |
| $C_{12} \oplus C*$ | I | TRCH (3) | R |
| $C_{13} \oplus C*$ | Q | TRCH (3) | R |
| $C_{14} \oplus C*$ | I | reserved | — |
| $C_{15} \oplus C*$ | Q | reserved | — |
| . | . | . | . |
| . | . | . | . |
| . | . | . | . |
| $C_{44} \oplus C*$ | I | reserved | — |
| $C_{45} \oplus C*$ | Q | reserved | — |
| $C_{46} \oplus C*$ | I | TRCH (3) | Forward (F) |
| $C_{47} \oplus C*$ | Q | TRCH (3) | F |
| $C_{48} \oplus C*$ | I | TRCH (2) | F |
| $C_{49} \oplus C*$ | Q | TRCH (2) | F |
| $C_{50} \oplus C*$ | I | TRCH (1) | F |
| $C_{51} \oplus C*$ | Q | TRCH (1) | F |
| $C_{52} \oplus C*$ | I | TRCH (0) | F |
| $C_{53} \oplus C*$ | Q | TRCH (0) | F |
| $C_{54} \oplus C*$ | I | OWCH | F |
| $C_{55} \oplus C*$ | Q | OWCH | F |
| $C_{56} \oplus C*$ | I | APCH | F |
| $C_{57} \oplus C*$ | Q | APCH | F |
| $C_{58} \oplus C*$ | I | IDLE | — |
| $C_{59} \oplus C*$ | Q | IDLE | — |
| $C_{60} \oplus C*$ | I | reserved | — |
| $C_{61} \oplus C*$ | Q | reserved | — |
| $C_{62} \oplus C*$ | I | reserved | — |
| $C_{63} \oplus C*$ | Q | reserved | — |

Pilot Signals

As described above, the pilot signals are used for synchronization, carrier phase recovery, and for estimating the impulse response of the radio channel. The RCS 104 transmits a forward link pilot carrier reference as a complex pilot code sequence to provide a time and phase reference for all SUs 111, 112, 115, 117 and 118 in its service area. The power level of the Global Pilot (GLPT) signal is set to provide adequate coverage over the whole RCS service area, which area depends on the cell size. With only one pilot signal in the forward link, the reduction in system capacity due to the pilot energy is negligible.

Each of the SUs 111, 112, 115, 117 and 118 transmits a pilot carrier reference as a quadrature modulated (complex-valued) pilot spreading-code sequence to provide time and phase reference to the RCS for the reverse link. The pilot signal transmitted by the SU of one embodiment of the invention is 6 dB lower than the power of the 32 kbit/s POTS (plain old telephone service) traffic channel. The reverse pilot channel is subject to APC. The reverse link pilot associated with a particular connection is called the Assigned Pilot (ASPT). In addition, there are pilot signals associated with access channels, and these are called the Long Access Channel Pilots (LAXPTs). Short access channel pilots (SAXPTs) are also associated with the access channels and used for spreading-code acquisition and initial power ramp-up.

All pilot signals are formed from complex codes, as defined below:

$$\text{GLPT (forward)} = \{C_2 \oplus C_* + j \cdot (C_3 \oplus C_*)\} \cdot \{(\pm 1) + j \cdot (0)\}$$

{Complex Code}·{Carrier}

The complex pilot signals are de-spread by multiplication with conjugate spreading codes: $\{(c_2 \oplus C_*) - j \cdot (C_3 \oplus C_*)\}$. By contrast, traffic channels are of the form:

$$\text{TRCH}_n(\text{forward/reverse}) = \{(C_k \oplus C_*) + j \cdot (C_1 \oplus C_*)\} \cdot \{(\pm 1) + j \cdot (\pm 1)\}$$

{Complex Codes}·{Data Symbol} which thus form a constellation set at $$\frac{\pi}{4}$$

radians with respect to the pilot signal constellations.

Figure 3A:
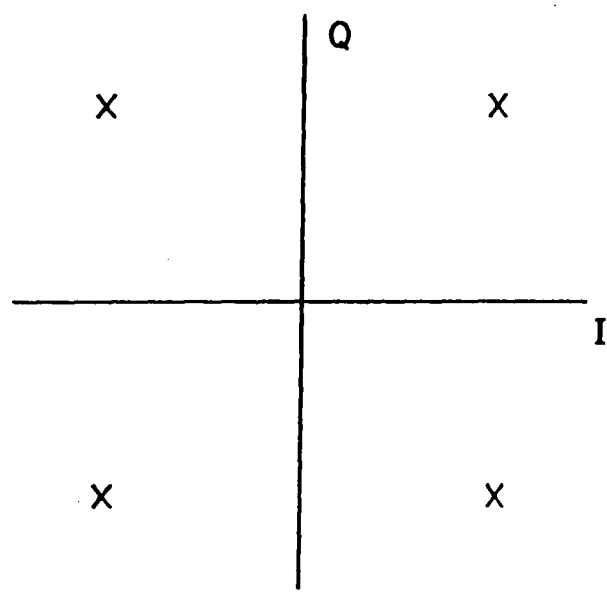
FIG. 3a is a graph of the constellation points of the pilot spreading-code QPSK signal.
Figure 3B:
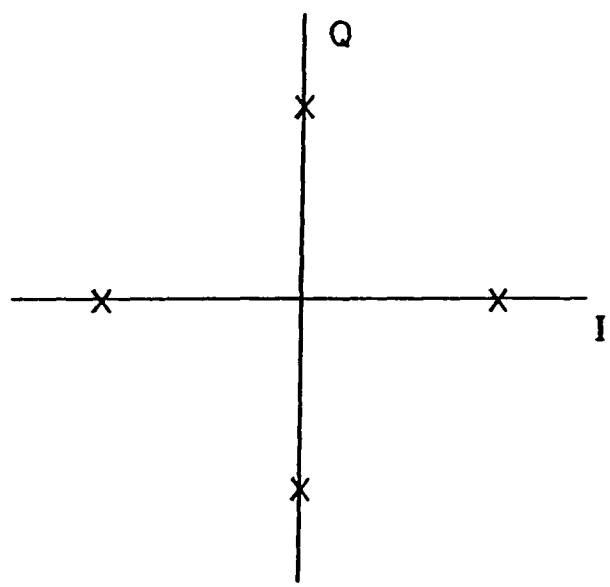
FIG. 3b is a graph of the constellation points of the message channel QPSK signal.

The GLPT constellation is shown in FIG. 3a, and the $\text{TRCH}_n$ traffic channel constellation is shown in FIG. 3b.

Logical Channel Assignment of the FBCH, SBCH, and Traffic Channels

The fast broadcast channel (FBCH) is a global forward link channel used to broadcast dynamic information about the availability of services and access channels (AXCHs). The messages are sent continuously, and each message lasts approximately 1 ms. The FBCH message is 16 bits long, repeated continuously, and epoch aligned. The FBCH is formatted as defined in Table 4.

TABLE 4

FBCH format

| Bit | Definition |
|---|---|
| 0 | Traffic Light 0 |
| 1 | Traffic Light 1 |
| 2 | Traffic Light 2 |
| 3 | Traffic Light 3 |
| 4–7 | service indicator bits |
| 8 | Traffic Light 0 |
| 9 | Traffic Light 1 |
| 10 | Traffic Light 2 |
| 11 | Traffic Light 3 |
| 12–15 | service indicator bits |

For the FBCH, bit 0 is transmitted first. A traffic light corresponds to an Access Channel (AXCH) and indicates whether the particular access channel is currently in use (red) or not in use (green). A logic "1" indicates that the traffic light is green, and a logic "0" indicates the traffic light is red. The values of the traffic light bits may change from octet to octet, and each 16 bit message contains distinct service indicator bits which describe which types of service are available for the AXCHs.

One embodiment of the present invention uses service indicator bits as follows to indicate the availability of services or AXCHs. The service indicator bits {4,5,6,7,12,13,14,15} are interpreted as an unsigned binary number, with bit 4 as the MSB and bit 15 as the LSB. Each service type increment has an associated nominal measure of the capacity required, and the FBCH continuously broadcasts the available capacity. This is scaled to have a maximum value equivalent to the largest single service increment possible. When an SU requires a new service or an increase in the number of bearers), it compares the capacity required to that indicated by the FBCH, and then considers itself blocked if the capacity is not available. The FBCH and the traffic channels are aligned to the epoch.

Slow Broadcast Information frames contain system or other general information that is available to all SUs, and Paging Information frames contain information about call requests for particular SUs. Slow Broadcast Information frames and Paging Information frames are multiplexed together on a single logical channel which forms the Slot Broadcast Channel (SBCH). As previously defined, the code epoch is a sequence of 29 877 20 chips having an epoch duration which is a function of the chip rate defined in Table 5 below. In order to facilitate power saving, the channel is divided into N "Sleep" Cycles, and each Cycle is subdivided into M Slots, which are 19 ms long, except for 10.5 Mhz bandwidth which has slots of 18 ms.

TABLE 5

SBCH Channel Format Outline

| Bandwidth (MHz) | Spreading Code Rate (MHz) | Epoch Length (ms) | Cycles/ Epoch N | Cycle Length (ms) | Slots/ Cycle M | Slot Length (ms) |
|---|---|---|---|---|---|---|
| 7.0 | 5.824 | 5130 | 5 | 1026 | 54 | 19 |
| 10.0 | 8.320 | 3591 | 3 | 1197 | 63 | 19 |
| 10.5 | 8.512 | 3510 | 3 | 1170 | 65 | 18 |
| 14.0 | 11.648 | 2565 | 3 | 855 | 45 | 19 |
| 15.0 | 12.480 | 2394 | 2 | 1197 | 63 | 19 |

Sleep Cycle Slot #1 is always used for slow broadcast information. Slots #2 to #M−1 are used for paging groups unless extended slow broadcast information is inserted. The pattern of cycles and slots in one embodiment of the present invention run continuously at 16 kbit/s.

Within each Sleep Cycle the SU may power-up the receiver and re-acquire pilot code to achieve carrier lock to a sufficient precision for satisfactory demodulation and Viterbi decoding. This settling time may be up to 3 Slots in duration. For example, an SU assigned to Slot #7 may power up the Receiver at the start of Slot #4. Having monitored its Slot the SU either recognizes its Paging Address and initiates an access request, or fails to recognize its Paging Address in which case it reverts to the Sleep mode.

Spreading code Tracking and AMF Detection in Multipath Channels

Spreading code Tracking

Three CDMA spreading-code tracking methods in multipath fading environments are described which track the code phase of a received multipath spread-spectrum signal. The first method uses the prior art tracking circuit which simply tracks the spreading code phase of the detector having the highest output signal value, the second method uses a tracking circuit that tracks the median value of the code phase of the group of multipath signals, and the third method of the present invention, is the centroid tracking circuit which tracks the code-phase of an optimized,east mean squared weighted average of the multipath signal components. The following describes the algorithms by which the spreading code phase of the received CDMA signal is tracked.

Figure 3C:
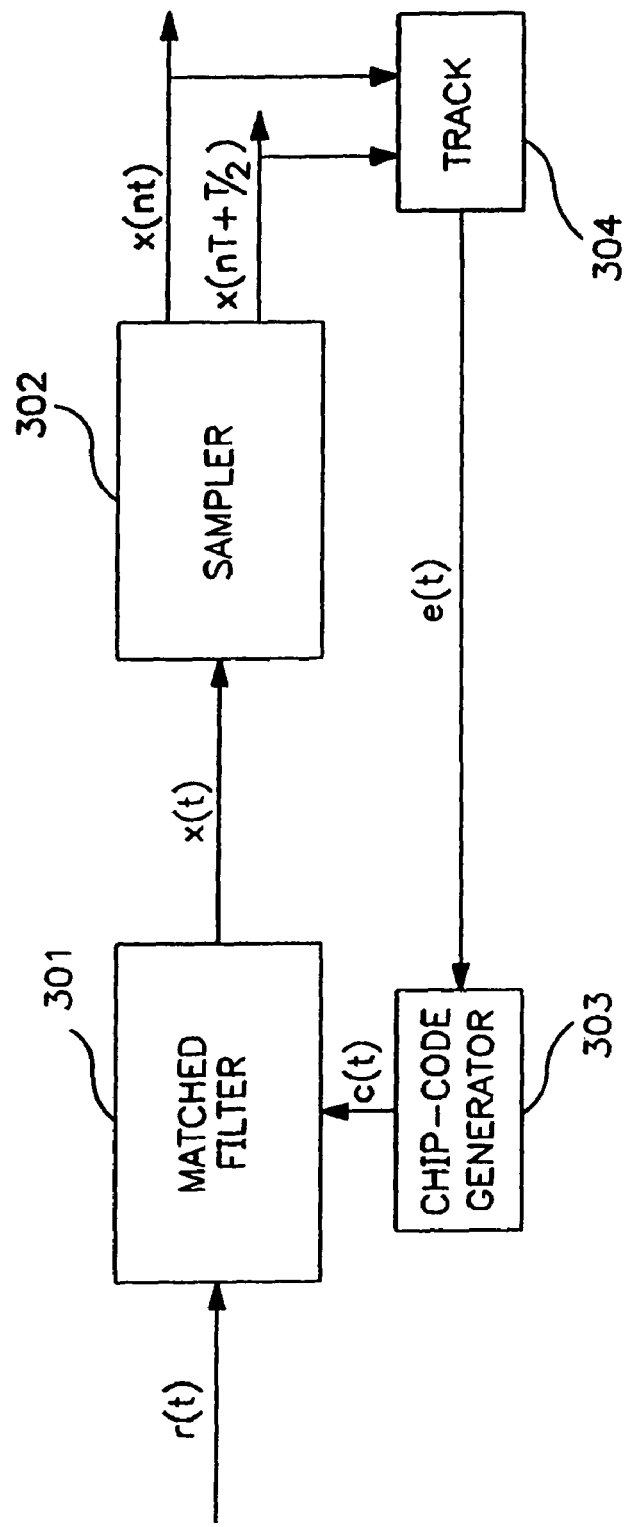
FIG. 3c is a block diagram of exemplary circuitry which implements the method of tracking the received spreading-code phase of the present invention.

A tracking circuit has operating characteristics that reveal the relationship between the time error and the control voltage that drives a Voltage Controlled Oscillator (VCO) of a spreading-code phase tracking circuit. When there is a positive timing error, the exemplary tracking circuit generates a negative control voltage to offset the timing error. When there is a negative timing error, the exemplary tracking circuit generates a positive control voltage to offset the timing error. When the tracking circuit generates a zero value, this value corresponds to the perfect time alignment called the 'lock-point'. FIG. 3c shows the basic tracking circuit. Received signal r(t) is applied to matched filter 301, which correlates r(t) with a local code-sequence c(t) generated by Code Generator 303. The output signal of the matched filter x(t) is sampled at the sampler 302 to produce samples x[nT] and x[nT+T/2]. The samples x[nT] and x[nT+T/2] are used by a tracking circuit 304 to determine if the phase of the spreading-code c(t) of the code generator 303 is correct. The tracking circuit 304 produces an error signal e(t) as an input to the code generator 303. The code generator 303 uses this signal e(t) as an input signal to adjust the code-phase it generates.

In a CDMA system, the signal transmitted by the reference user is written in the low-pass representation as $$s(t) = \sum_{k=-\infty}^{\infty} c_k P_{T_c}(t - kT_c) \quad (4)$$

where $c_k$ represents the spreading code coefficients, $P_{T_c}(t)$ represents the spreading code chip waveform, and $T_c$ is the chip duration. Assuming that the reference user is not transmitting data, only the spreading code modulates the carrier. Referring to FIG. 3, the received signal is $$r(t) = \sum_{i=1}^{M} a_i s(t - \tau_i) \quad (5)$$

Here, $a_i$ is due to fading effect of the multipath channel on the i-th path and $\tau_i$ is the random time delay associated with the same path. The receiver passes the received signal through a matched filter, which is implemented as a correlation receiver and is described below. This operation is done in two steps: first the signal is passed through a chip matched filter and sampled to recover the spreading code chip values, then this chip sequence is correlated with the locally generated code sequence.

FIG. 3c shows the chip matched filter 301, matched to the chip waveform $P_{Tc}(t)$, and the sampler 302. The signal x(t) at the output terminal of the chip matched filter is $$x(t) = \sum_{i=k}^{M} \sum_{k=-\infty}^{\infty} a_i c_k g(t - \tau_i - kT_c) \quad (6)$$

where $$g(t) = P_{Tc}(t) * h_R(t) \quad (7)$$

Here, $h_R(t)$ is the impulse response of the chip matched filter and "*" denotes convolution. The order of the summations, can be rewritten as:

$$x(t) = \sum_{k=-\infty}^{\infty} c_k f(t - kT_c) \quad (8)$$

where $$f(t) = \sum_{i=1}^{M} a_1 g(t - \tau_1) \quad (9)$$

In the multipath channel described above, the sampler samples the output signal of the matched filter to produce x(nT) at the maximum power level points of g(t). In practice, however, the waveform g(t) is often severely distorted because of the effect of the multipath signal reception, and a perfect time alignment of the signals is not available.

When the multipath in the channel is negligible and a perfect estimate of the timing is available, i.e., $a_1=1, \tau_1=0$, and $a_1=0, i=2, \ldots, M$, the received signal is r(t)=s(t). Then, with this ideal channel model, the output of the chip matched filter becomes $$x(t) = \sum_{k=-\infty}^{\infty} c_k g(t - kT_c) \quad (10)$$

When there is multipath fading, however, the received spreading code chip value waveform is distorted, and a number of local maxima that can change from one sampling interval to another depending on the channel characteristics.

For multipath fading channels with quickly changing channel characteristics, it is not practical to try to locate the maximum of the waveform f(t) in every chip period interval. Instead, a time reference can be obtained from the characteristics of f(t) that may not change as quickly. Three tracking methods are described based on different characteristics of f(t).

Prior Art Spreading-Code Tracking Method:

Prior art tracking methods include a code tracking circuit in which the receiver attempts to determine where the maximum matched filter output value of the chip waveform occurs and sample the signal at that point. In multipath fading channels, however, the receiver despreading code waveform can have a number of local maxima, especially in a mobile environment. If f(t) represents the received signal waveform of the spreading code chip convolved with the channel impulse response, the shape of f(t) and where its maximum occurs can change rather quickly making it impractical to track the maximum of f(t).

Define $\tau$ to be the time estimate that the tracking circuit calculates during a particular sampling interval. Also, define the following error function $$\varepsilon = \begin{cases} \int_{\{t:\tau-\upsilon 8\}} f(t)dt, & |\tau - t| > \delta \\ \varepsilon = 0 & |\tau - t| < \delta \end{cases} \quad (11)$$

The tracking circuits of the prior art calculate a value of the input signal that minimizes the error $\varepsilon$. One can write $$\min \varepsilon = 1 - \max_{\tau} \int_{\tau-\delta}^{\tau+\delta} f(t)dt \quad (12)$$

Assuming has a smooth shape in the values given, the value of $\tau$ for which $f(\tau)$ is maximum minimizes the error $\varepsilon$, so the tracking circuit tracks the maximum point of $f(\tau)$.

Median Weighted Value Tracking Method:

The Median Weighted Tracking Method of one embodiment of the present invention, minimizes the absolute weighted error, defined as $$\varepsilon = \int_{-\infty}^{\infty} |t - \tau| f(t)dt \quad (13)$$

This tracking method calculates the 'median' signal value of f(t) by collecting information from all paths, where $f(\tau)$ is as in equation (9). In a multipath fading environment, the waveform f(t) can have multiple local maxima, but only one median.

To minimize $\varepsilon$, the derivative of equation (13) is taken with respect to $\tau$ and equated it to zero, which gives $$\int_{-\infty}^{\tau} f(t)dt = \int_{\tau}^{\infty} f(t)dt \quad (14)$$

Figure 4:
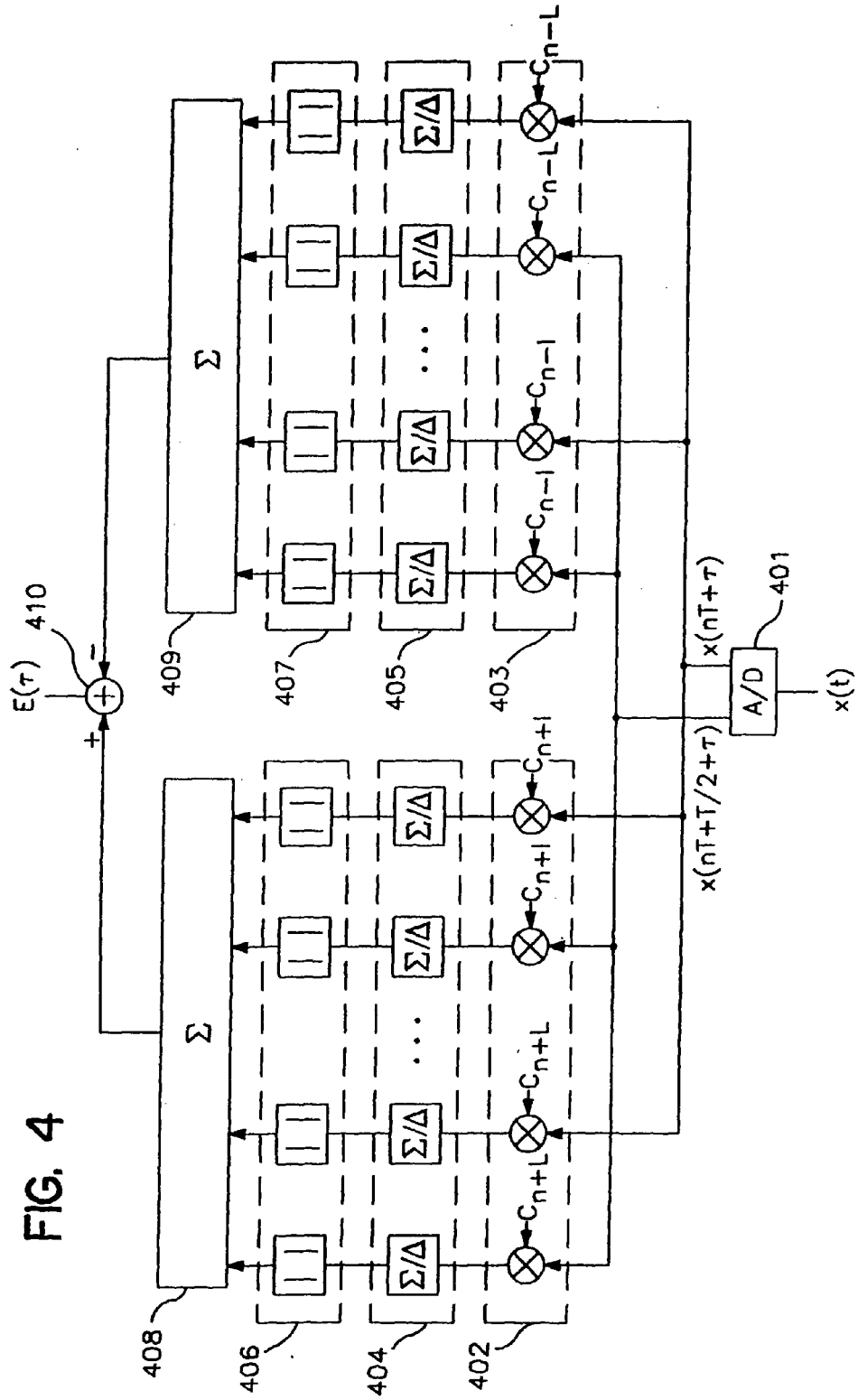
FIG. 4 is a block diagram of the tracking circuit that tracks the median of the received multipath signal components.

The value of $\tau$ that satisfies (14) is called the "median" of f(t). Therefore, the Median Tracking Method of the present embodiment tracks the median of f(t). FIG. 4 shows an implementation of the tracking circuit based on minimizing the absolute weighted error defined above. The signal x(t) and its one-half chip offset version x(t+T/2) are sampled by the analog-to-digital A/D converter 401 at a rate 1/T. The following equation determines the operating characteristic of the circuit in FIG. 4:

$$\varepsilon(\tau) = \sum_{n=1}^{2L} |f(\tau - nT/2)| - |f(\tau + nT/2)| \quad (15)$$

Tracking the median of a group of multipath signals keeps the received energy of the multipath signal components equal on the early and late sides of the median point of the correct locally generated spreading-code phase $c_n$. The tracking circuit consists of an A/D converter 401 which samples an input signal x(t) to form the half chip offset samples. The half chip offset samples are alternatively grouped into even samples called an early set of samples x(nT+$\tau$) and odd samples called a late set of samples x(nT+(T/2)+τ). The first correlation bank adaptive matched filter 402 multiples each early sample by the spreading-code phases c(n+1), c(n+2), ..., c(n+L), where L is small compared to the code length and approximately equal to number of chips of delay between the earliest and latest multipath signal. The output of each correlator is applied to a respective first sum-and-dump bank 404. The magnitudes of the output values of the L sum-and-dumps are calculated in the calculator 406 and then summed in a summer 408 to give an output value proportional to the signal energy in the early multipath signals. Similarly, a second correlation bank adaptive matched filter 403 operates on the late samples, using code phases c(n−1), c(n−2), ..., c(n−L), and each output signal is applied to a respective sum-and-dump in an integrator 405. The magnitudes of the L sum-and-dump outputs are calculated in calculator 407 and then summed in summer 409 to give a value for the late multipath signal energy. Finally, the subtractor 410 calculates the difference and produces error signal ϵ(t) of the early and late signal energy values.

The tracking circuit adjusts, by means of error signal ϵ(τ), the locally generated code phases c(t) to cause the difference between the early and late values to tend toward 0.

Centroid Tracking Method

Another spreading-code tracking circuit of one embodiment of the present invention is called the squared weighted tracking (or centroid) circuit. Defining τ to denote the time estimate that the tracking circuit calculates, based on some characteristic of f(t), the centroid tracking circuit minimizes the squared weighted error defined as $$\varepsilon = \int_{-\infty}^{\infty} |t - \tau|^2 f(t) dt \qquad (16)$$

This function inside the integral has a quadratic form, which has a unique minimum. The value of τ that minimizes epsilon. can be found by taking the derivative of the above equation with respect to τ and equating to zero, which gives $$\int_{-\infty}^{\infty} (-2t + 2\tau) f(t) dt = 0 \qquad (17)$$

Therefore, the value of τ that satisfies $$\tau - \frac{1}{\beta} \int_{-\infty}^{\infty} t f(t) dt = O \qquad (18)$$

is the timing estimate that the tracking circuit calculates, and β is a constant value.

Figure 5A:
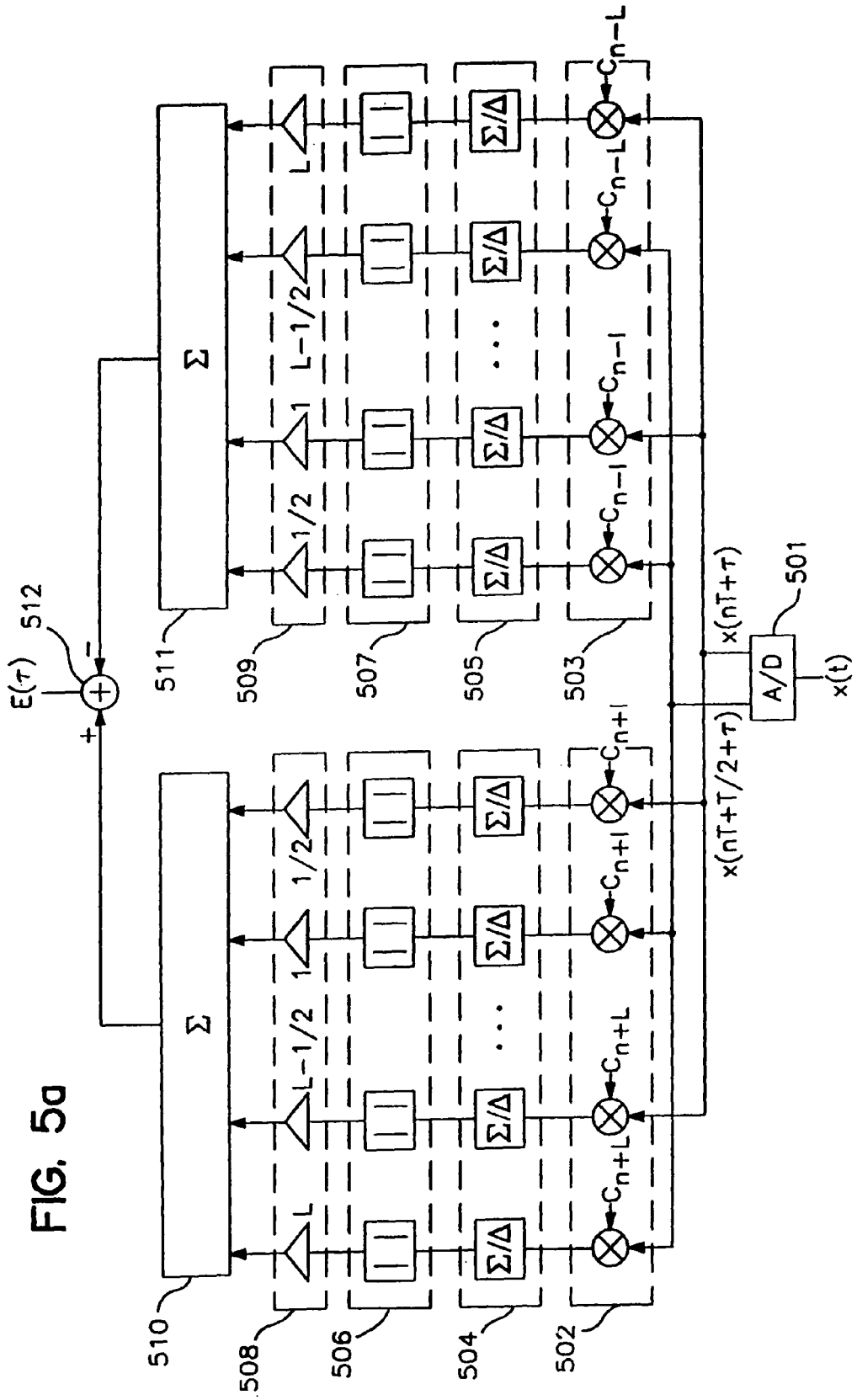
FIG. 5a is a block diagram of the tracking circuit that tracks the centroid of the received multipath signal components.

Based on these observations, a realization of the tracking circuit minimizing the squared weighted error is shown in FIG. 5. The following equation determines the error signal ϵ(τ) of the centroid tracking circuit:

$$\varepsilon(\tau) = \sum_{n=1}^{2L} n[|f(\tau - nT/2)| - |f(\tau + nT/2)|] = 0 \qquad (19)$$

The value that satisfies=0 is the optimized estimate of the timing.

The early and late multipath signal energy on each side of the centroid point are equal. The centroid tracking circuit shown in FIG. 5 consists of an A/D converter 501 which samples an input signal x(t), as described above with reference to FIG. 4 to form half chip offset samples. The half chip offset samples are alternatively grouped as an early set of samples x(nT+τ) and a late set of samples x(nT+(T/2)+τ). The first correlation bank adaptive matched filter 502 multiples each early sample and each late sample by the positive spreading-code phases c(n−1), c(n+2), ..., c(n+L), where L is small compared to the code length and is approximately equal to number of chips of delay between the earliest and latest multipath signal. The output signal of each correlator is applied to a respective one of L sum-and-sump circuits of the first sum and dump bank 504. The magnitude value of the output signal produced by each sum-and-dump circuit of the sum and dump bank 504 is calculated by the respective calculator in the calculator bank 506 and applied to a corresponding weighting amplifier of the first weighting bank 508. The output signal of each weighting amplifier represents the weighted signal energy in a multipath component signal.

The weighted early multipath signal energy values are summed in sample adder 510 to give an output value that is proportional to the signal energy in the group of multipath signals corresponding to positive code phases which are the early multipath signals. Similarly, a second correlation bank adaptive matched filter 503 operates on the early and late samples, using the negative spreading-code phases c(n−1), c(n−2), ..., c(n−L), each output signal is provided to a respective sum-and-dump circuit of discrete integrator 505. The magnitude value of the L sum-and-dump output signals are calculated by the respective calculator of calculator bank 507 and then weighted in weighting bank 509. The weighted late multipath signal energy values are summed in sample adder 511 to give an energy value for the group of multipath signal corresponding to the negative code phases which are the late multipath signals. Finally, the subtractor 512 calculates the difference of the early and late signal energy values to produce error sample value. ϵ(τ)

The tracking circuit of FIG. 5 produces error signal ϵ(τ) which is used to adjust the locally generated code phase c(nT) to keep the weighted average energy in the early and late multipath signal groups equal. The embodiment shown uses weighting values that increase as the distance from the centroid increases. The signal energy in the earliest and latest multipath signals is probably less than the multipath signal values near the centroid. Consequently, the difference calculated by the subtractor 512 is more sensitive to variations in delay of the earliest and latest multipath signals.

Quadratic Detector for Tracking

In another exemplary tracking method, the tracking circuit adjusts sampling phase to be "optimal" and robust to multipath. If f(t) represent the received signal waveform as in equation (9) above. The particular method of optimizing starts with a delay locked loop with an error signal ϵ(τ) that drives the loop. The function ϵ(τ) desirably has only one zero at τ=τ$_O$ where τ$_O$ is optimal. The optimal form for ϵ(τ)has the canonical form:

$$\varepsilon(\tau) = \int_{-\infty}^{\infty} w(t, \tau) |f(t)|^2 dt \qquad (20)$$

where $w(t, \tau)$ is a weighting function relating $f(t)$ to the error $\epsilon(\tau)$, and the following holds $$\varepsilon(\tau + \tau_0) = \int_{-\infty}^{\infty} W(t, \tau + \tau_0) |f(t)|^2 dt \quad (21)$$

It follows from equation (21) that $w(t, \tau)$ is equivalent to $w(t-\tau)$. Considering the slope M of the error signal in the neighborhood of a lock point:

$$M = \frac{d\varepsilon(\tau)}{d\tau}\bigg|_{\tau_0} = -\int_{-\infty}^{\infty} w'(t - \tau_0) g(t) dt \quad (22)$$

where $w'(t, \tau)$ is the derivative of $w(t, \tau)$ with respect to $\tau$, and $g(t)$ is the average of $|f(t)|^2$.

The error $\epsilon(\tau)$ has a deterministic part and a noise part. Let z denote the noise component in $\epsilon(\tau)$, then $|Z|^2$ is the average noise power in the error function $\epsilon(\tau)$. Consequently, the optimal tracking circuit maximizes the ratio:

$$F = \frac{M^2}{|z|^2} \quad (23)$$

Figure 5B:
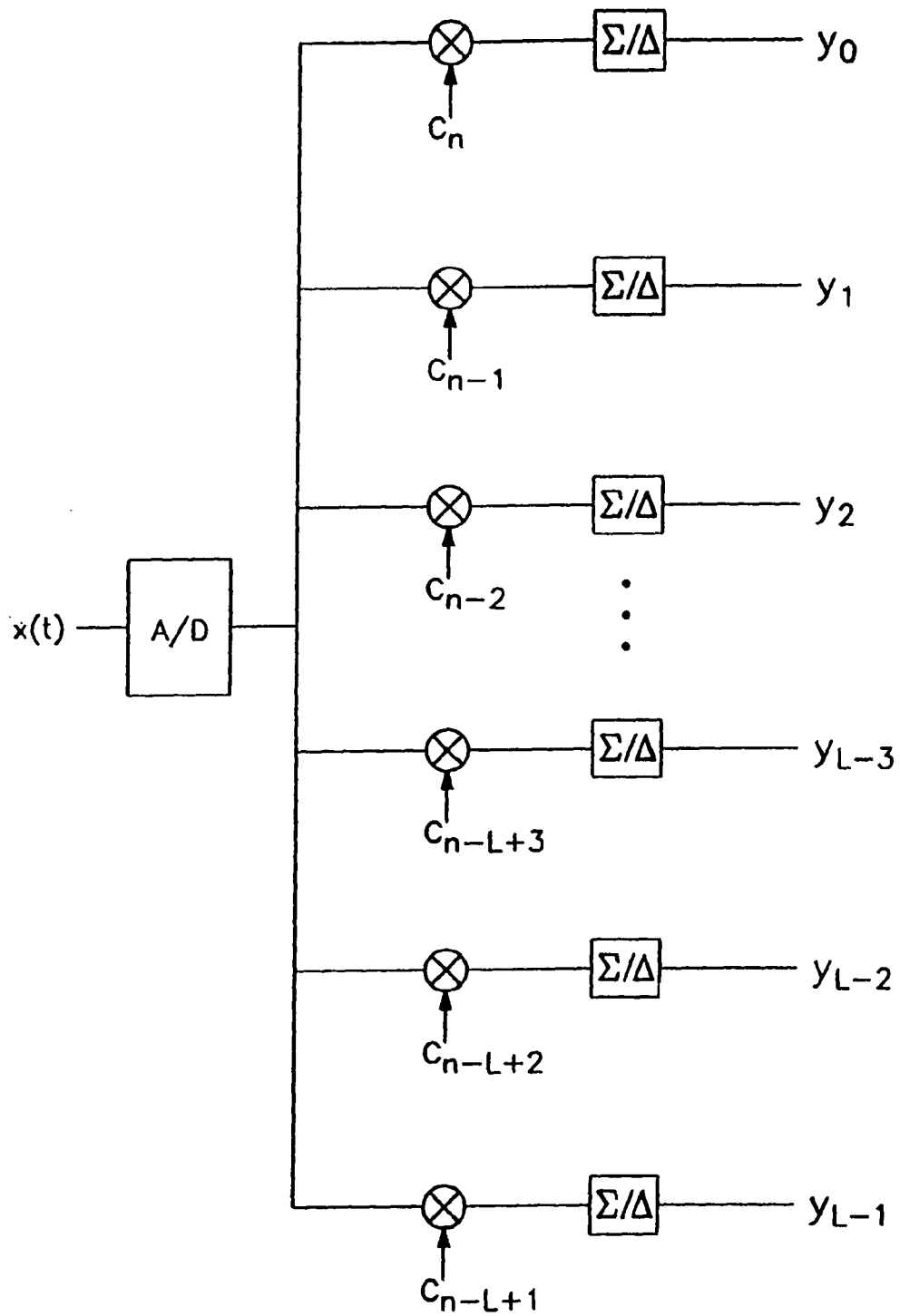
FIG. 5b is a block diagram of the Adaptive Vector Correlator.

The implementation of the Quadratic Detector is now described. The discrete error value e of an error signal $\epsilon(\tau)$ is generated by performing the operation $$e = y^T B y \quad (24)$$

where the vector y represents the received signal components $y_i$, $i=0, 1, \ldots L-1$, as shown in FIG. 5b. The matrix B is an L by L matrix and the elements are determined by calculating values such that the ratio F of equation 23 is maximized.

Determining the Minimum Value of L needed:

The value of L in the previous section determines the minimum number of correlators and sum-and-dump elements. L is chosen as small as possible without compromising the functionality of the tracking circuit.

The multipath characteristic of the channel is such that the received chip waveform $f(t)$ is spread over $QT_c$ seconds, or the multipath components occupy a time period of Q chips duration. The value of L chosen is L=Q. Q is found by measuring the particular RF channel transmission characteristics to determine the earliest and latest multipath component signal propagation delay. $QT_c$ is the difference between the earliest and latest multipath component arrival time at a receiver.

The Quadratic Detector described above may be used to implement the cetroid tracking system described above with reference to FIG. 5a. For this implementation, the vector y is the output signal of the sum and dump circuits 504: y= $\{f(\tau-LT), f(\tau-LT+T/2), f(\tau-(L-1)T), \ldots f(\tau), f(\tau+T/2), f(\tau+T), \ldots f(\tau+LT)\}$ and the matrix B is set forth in table 6.

TABLE 6

B matrix for quadratic form of Centroid Tracking System

| L | 0 | 0 | 0 | 0 | 0 | 0 | 0 | 0 | 0 | 0 |
|---|---|---|---|---|---|---|---|---|---|---|
| 0 | L - ½ | 0 | 0 | 0 | 0 | 0 | 0 | 0 | 0 | 0 |
| 0 | 0 | L - 1 | 0 | 0 | 0 | 0 | 0 | 0 | 0 | 0 |
| 0 | 0 | 0 | 0 | ½ | 0 | 0 | 0 | 0 | 0 | 0 |
| 0 | 0 | 0 | 0 | 0 | 0 | 0 | 0 | 0 | 0 | 0 |
| 0 | 0 | 0 | 0 | 0 | 0 | -½ | 0 | 0 | 0 | 0 |

TABLE 6-continued

B matrix for quadratic form of Centroid Tracking System

| 0 | 0 | 0 | 0 | 0 | 0 | 0 | 0 | -L + 1 | 0 | 0 |
|---|---|---|---|---|---|---|---|---|---|---|
| 0 | 0 | 0 | 0 | 0 | 0 | 0 | 0 | 0 | -L + ½ | 0 |
| 0 | 0 | 0 | 0 | 0 | 0 | 0 | 0 | 0 | 0 | -L |

Adaptive Vector Correlator

An embodiment of the present invention uses an adaptive vector correlator (AVC) to estimate the channel impulse response and to obtain a reference value for coherent combining of received multipath signal components. The described embodiment employs an array of correlators to estimate the complex channel response affecting each multipath component, then the receiver compensates for the channel response and coherently combines the received multipath signal components. This approach is referred to as maximal ratio combining.

Figure 6:
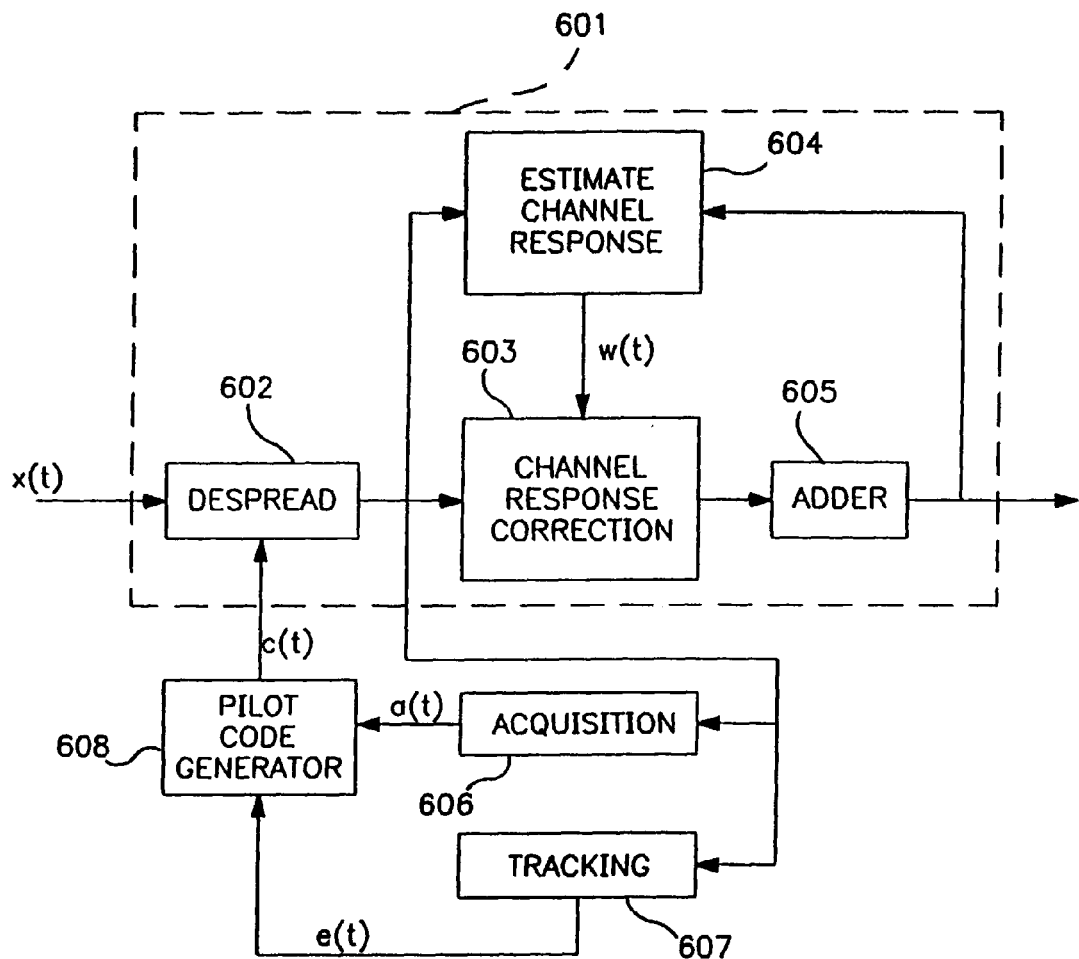
FIG. 6 is a block diagram of exemplary circuitry which implements the acquisition decision method of the correct spreading-code phase of the received pilot code of the present invention.

Referring to FIG. 6, The input signal $x(t)$ to the system is composed of interference noise of other message channels, multipath signals of message channels, thermal noise, and multipath signals of the pilot signal. The signal is provided to AVC 601 and which includes a despreading means 602, channel estimation means for estimating the channel response 604, correction means for correcting a signal for effects of the channel response 603, and adder 605 in the present invention. The AVC despreading means 602 is composed of multiple code correlators, with each correlator using a different phase of the pilot code $c(t)$ provided by the pilot code generator 608. The output of this despreading means corresponding to a noise power level if the phase of the local pilot code of the despreading means is not in phase with the input code signal, or it corresponds to a received pilot signal power level plus noise power level if the input pilot code and locally generated pilot code phases are the same. The output signals of the correlators of the despreading means corrected for the channel response by the correction means 603 and are applied to the adder 605 which collects all multipath pilot signal power. The channel response estimation means 604 receives the combined pilot signal and the output signals of the despreading means 602, and provides a channel response estimate signal, $w(t)$, to the correction means 603 of the AVC, and the estimate signal $w(t)$ is also available to the adaptive matched filter (AMF) described subsequently. The output signal of the despreading means 602 is also provided to the acquisition decision means 606 which decides, based on a particular algorithm, such as a sequential probability ratio test (SPRT), if the present output levels of the despreading circuits correspond to synchronization of the locally generated code to the desired input code phase. If the detector finds no synchronization, then the acquisition decision means sends a control signal $a(t)$ to the local pilot code generator 608 to offset its phase by one or more chip periods. When synchronization is found, the acquisition decision means informs the tracking circuit 607, which achieves and maintains a close synchronization between the received and locally generated code sequences.

Figure 7:
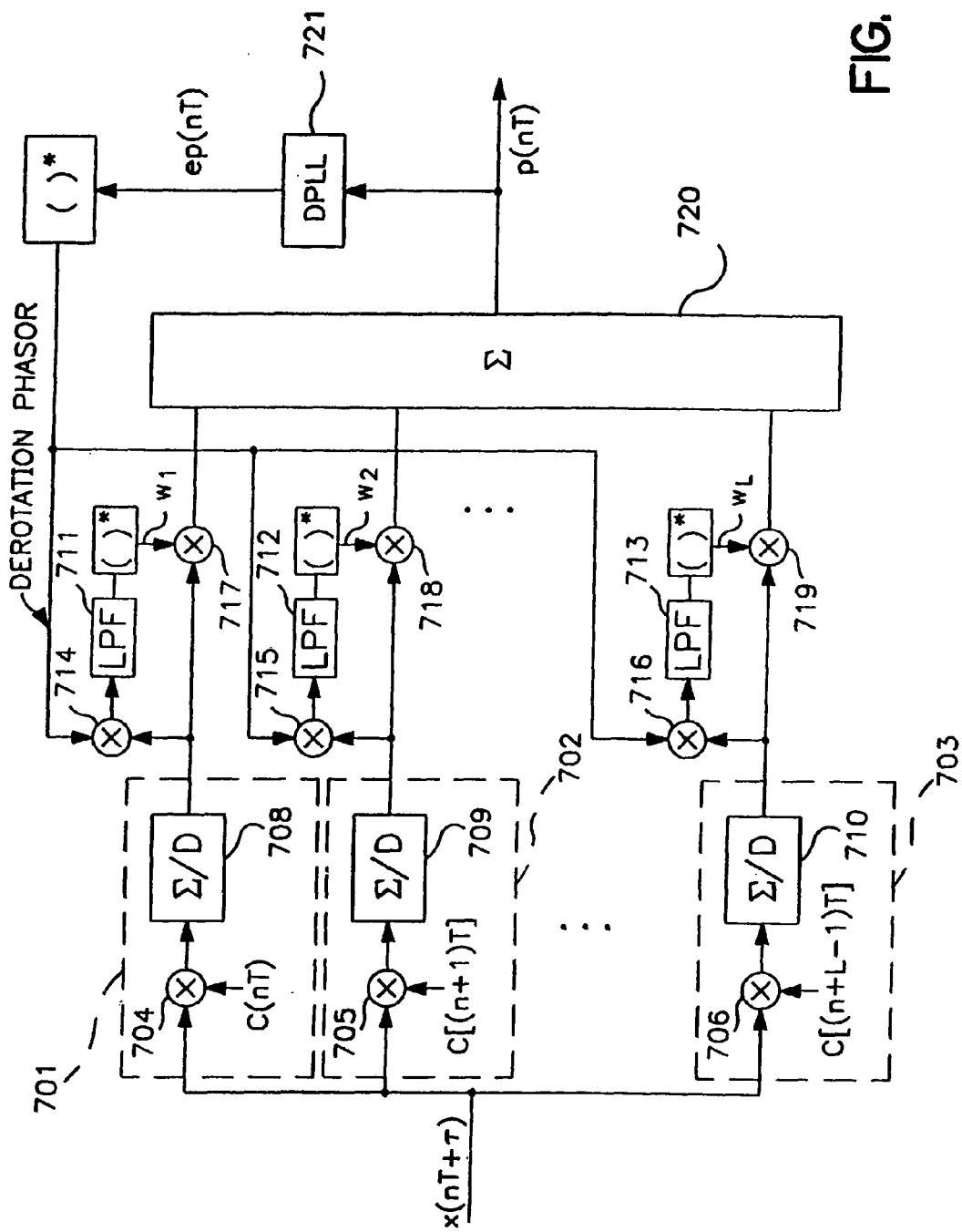
FIG. 7 is a block diagram of an exemplary pilot rake filter which includes the tracking circuit and digital phase locked loop for despreading the pilot spreading-code, and generator of the derotation factors of the present invention.

An exemplary implementation of the Pilot AVC used to despread the pilot spreading-code is shown in FIG. 7. The described embodiment assumes that the input signal $x(t)$ has been sampled with sampling period T to form $x(nT+\tau)$, and is composed of interference noise of other message channels, multipath signals of message channels, thermal noise, and multipath signals of the pilot code. The signal $x(nT+\tau)$ is applied to L correlators, where L is the number of code phases over which the uncertainty within the multipath signals exists. Each correlator 701, 702, 703 comprises a respective multiplier 704, 705, 706, which multiplies the input signal with a particular phase of the Pilot spreading code signal c((n+i)T), and a sum-and-dump circuit 708, 709, 710. The output signal of each multiplier 704, 705, 706 is applied to a respective sum-and-dump circuit 708, 709, 710 to perform discrete integration. Before summing the signal energy contained in the outputs of the correlators, the AVC compensates for the channel response the carrier phase rotation of the different multipath signals. Each output signal of each sum-and-dump 708, 709, 710 is multiplied by a derotation phasor [complex conjugate of ep(nT)] obtained from the digital phase lock loop (DPLL) 721. This phasor is applied to one input port of a respective multiplier 714, 715, 716 to account for the phase and frequency offset of the carrier signal. The Pilot Rake AMF calculates, complex weighting factors, wk, k=1, . . . , L, for each multipath signal by passing the output of each multiplier 714, 715, 716 through a low pass filter (LPF) 711, 712, 713. Each despread multipath signal is multiplied by its corresponding weighting factor in a respective multiplier 717, 718, 719. The output signals of the multipliers 717, 718, 719 are summed in a master adder 720, and the output signal p(nT) of the accumulator 720 consists of the combined despread multipath pilot signals in noise. The output signal p(nT) is also applied to the DPLL 721 to produce the error signal ep(nT) for tracking of the carrier phase.

Figure 8A:
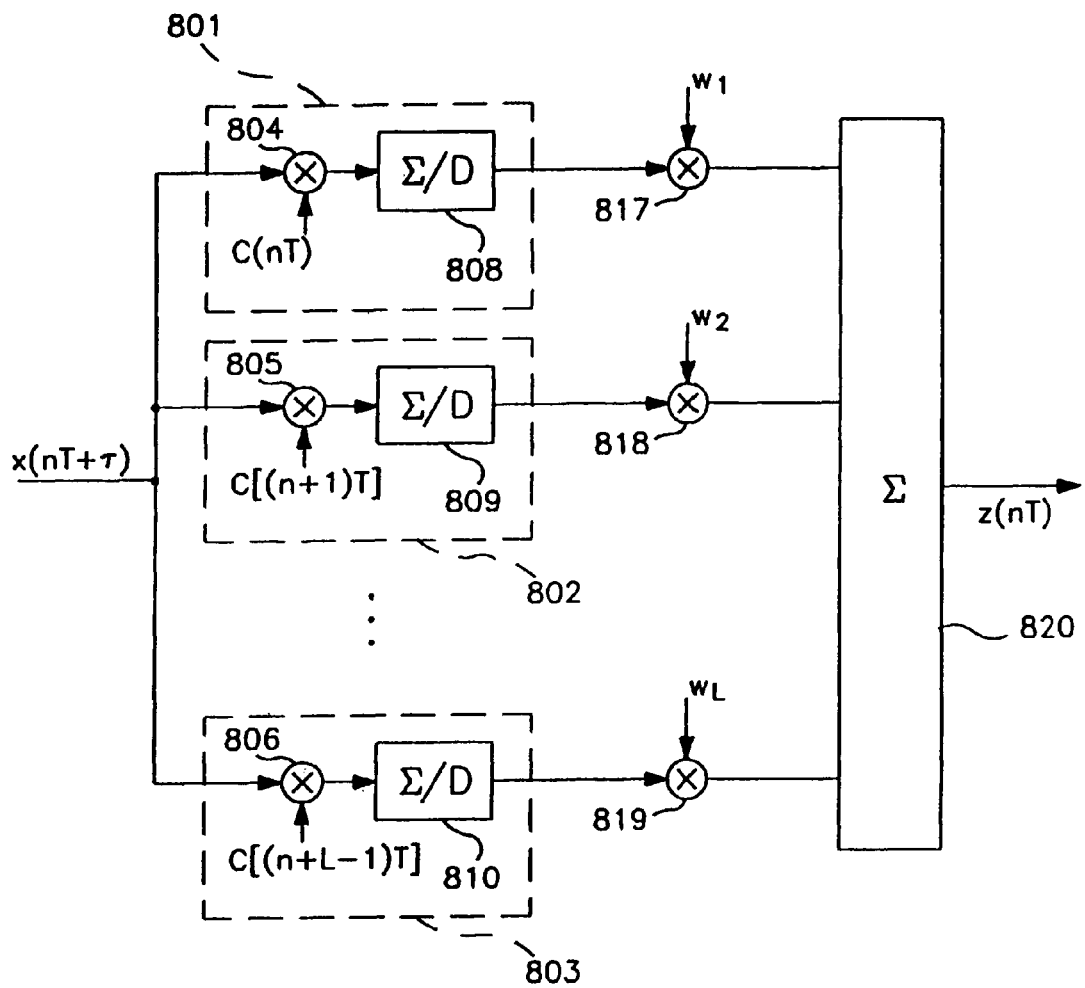
FIG. 8a is a block diagram of an exemplary adaptive vector correlator and matched filter for despreading and combining the multipath components of the present invention.
Figure 8B:
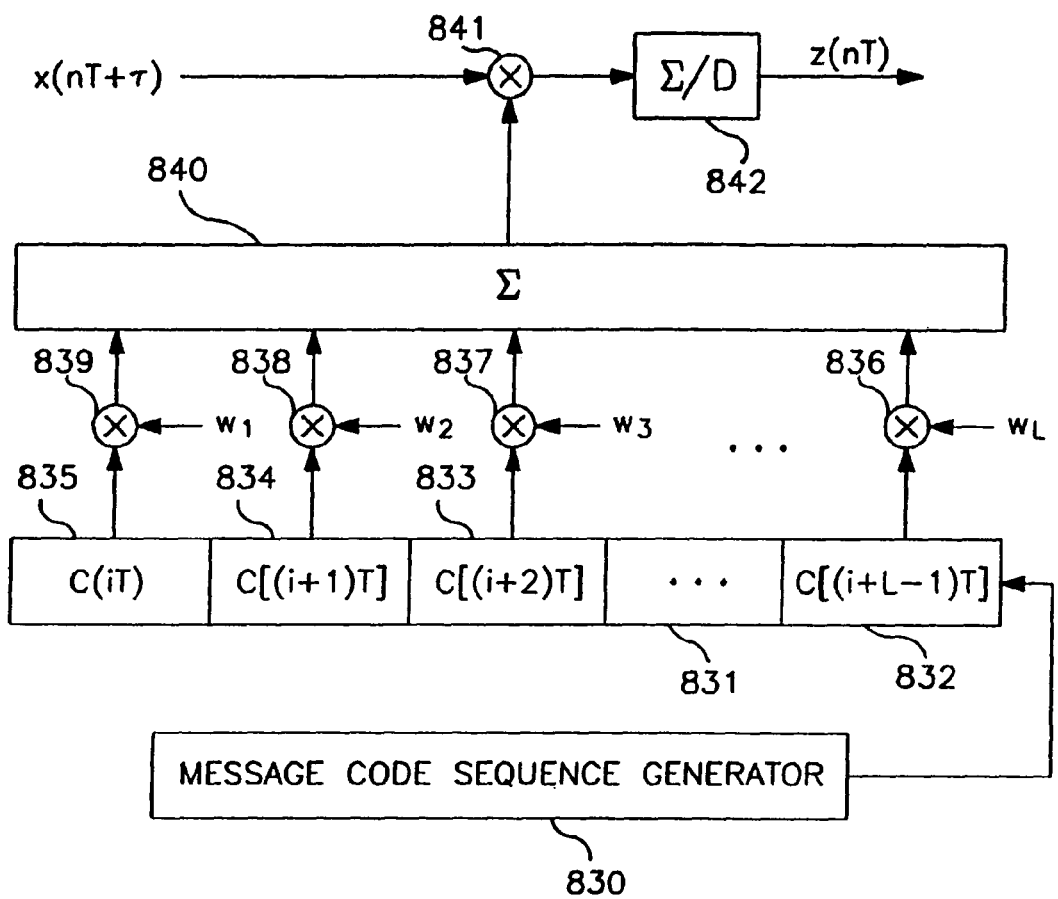
FIG. 8b is a block diagram of an alternative implementation of the adaptive vector correlator and adaptive matched filter for despreading and combining the multipath components of the present invention.

FIGS. 8a and 8b show alternate embodiments of the AVC which can be used for detection and multipath signal component combining. The message signal AVCs of FIGS. 8a and 8b use the weighting factors produced by the Pilot AVC to correct the message data multipath signals. The spreading code signal, c(nT) is the spreading sequence used by a particular message channel and is synchronous with the pilot spreading code signal. The value L is the number of correlators in the AVC circuit.

The circuit of FIG. 8a calculates the decision variable Z which is given by $$Z = w_1 \sum_{i=1}^{N} x(iT+\tau)c(iT) + w_2 \sum_{i=1}^{N} x(iT+\tau)c((i+1)T) + \qquad (25)$$
$$\ldots + w_L \sum_{i+1}^{L} x(iT+\tau) + c((i+L)T)$$

where N is the number of chips in the correlation window. Equivalently, the decision statistic is given by $$Z = x(T+\tau) \sum_{i=1}^{L} w_1 c(iT) + x(2T+\tau) \sum_{i=1}^{L} w_2 c((i+1)T) + \ldots + \qquad (26)$$
$$x(NT+\tau) \sum_{i=1}^{L} w_N c((i+N)T)$$
$$= \sum_{k=1}^{N} x(kT\_\tau) \sum_{i=1}^{L} w_k c((i+k-1)T)$$

The alternative implementation that results from equation (26) is shown in FIG. 8b.

Referring to FIG. 8a, the input signal x(t) is sampled to form x(nT+τ), and is composed of interference noise of other message channels, multipath signals of message channels, thermal noise, and multipath signals of the pilot code. The signal x(nT+τ) is applied to L correlators, where L is the number of code phases over which the uncertainty within the multipath signals exists. Each correlator 801, 802, 803 comprises a multiplier 804, 805, 806, which multiplies the input signal by a particular phase of the message channel spreading code signal, and a respective sum-and-sump circuit 808, 809, 810. The output of each multiplier 804, 805, 806 is applied to a respective sum-and dump circuit 808, 809, 810 which performs discrete integration. Before summing the signal energy contained in the output signals of the correlators, the AVC compensates for the different multipath signals. Each despread multipath signal and its corresponding weighting factor, which is obtained from the corresponding multipath weighting factor of the pilot AVC, are multiplied by multiplier 817, 818, 819. The output signals of the multiplier 817, 818, 819. The output signals of the multipliers 817, 818, 819 are summed in a master adder 820, and the output signal z(nT) of the accumulator 820 consists of sampled levels of a despread message signal in noise.

The alternative embodiment of the invention includes a new implementation of the AVC despreading circuit for the message channels which performs the sum-and-dump for each multipath signal component simultaneously. The advantage of this circuit is that only one sum-and dump circuit and one adder is necessary. Referring to FIG. 8b, the message code sequence generator 830 provides a message code sequence to shift register 831 of length L. The output signal of each register 832, 833, 834, 835 of the shift register 831 corresponds to the message code sequence shifted in phase by one chip. The output value of each register 832, 833, 834, 835 is multiplied in multipliers 836, 837, 838, 839 with the corresponding weighting factor $w_k$, k=1, . . . L obtained from the Pilot AVC. The output signals of the L multipliers 836, 837, 838, 839 are summed by the adding circuit 840. The adding circuit output signal and the receiver input signal x(nT+τ) are then multiplied in the multiplier 841 and integrated by the sum-and-dump circuit 842 to produce message signal z(nT).

Figure 8C:
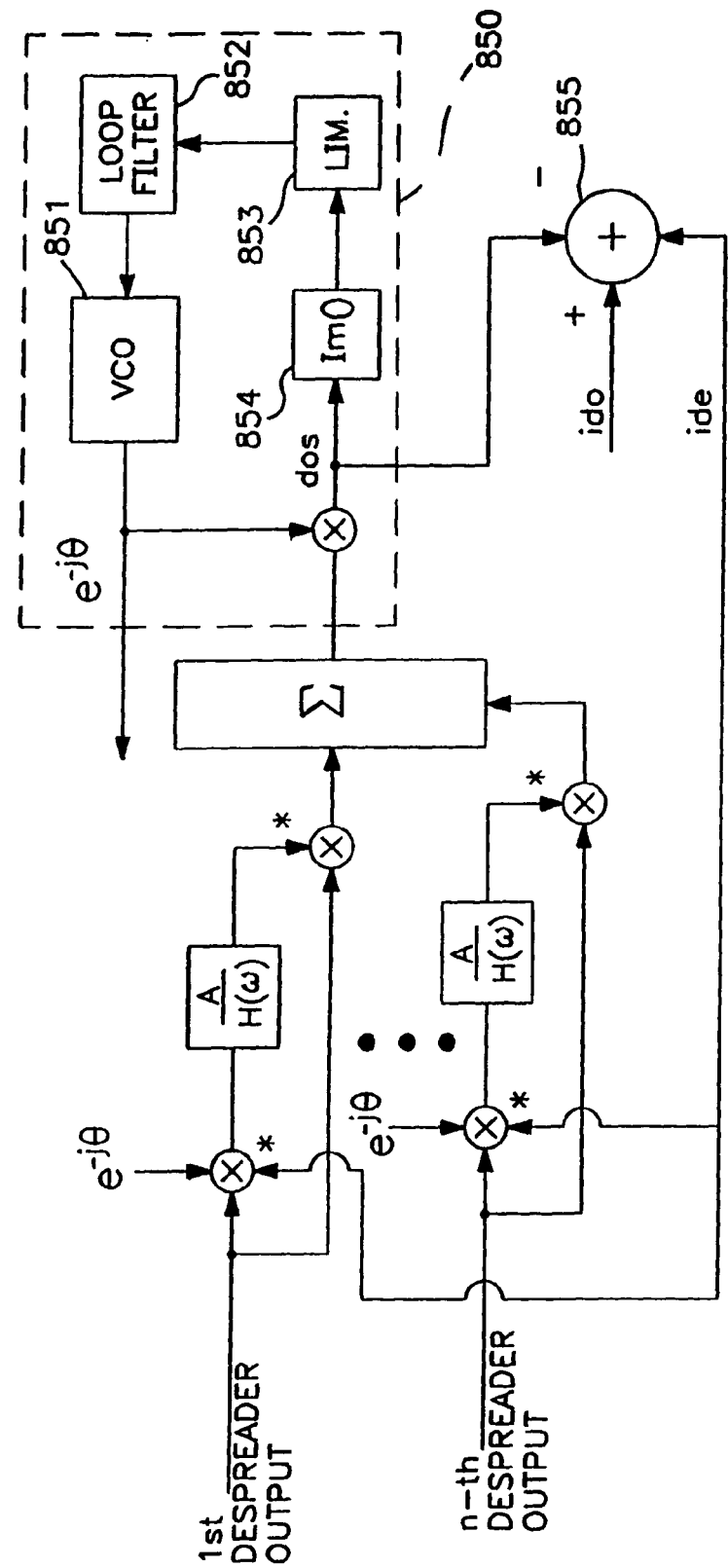
FIG. 8c is a block diagram of an alternative embodiment of the adaptive vector correlator and adaptive matched filter for despreading and combining the multipath components of the present invention.

A third embodiment of the adaptive vector correlator is shown in FIG. 8c. This embodiment uses the least mean square (LMS) statistic to implement the vector correlator and determines the derotation factors for each multipath component from the received multipath signal. The AVC of FIG. 8c is similar to the exemplary implementation of the Pilot AVC used to despread the pilot spreading-code shown in FIG. 7. The digital phase locked loop 721 is replaced by a phase locked loop 850 having a voltage controlled oscillator 851, loop filter 852, limiter 853, and imaginary component separator 854. The difference between the corrected despread output signal dos and an ideal despread output is provided by adder 855, and the difference signal is a despread error value ide which is further used by the derotation circuits to compensate for errors in the derotation factors.

In a multipath signal environment, the signal energy of a transmitted symbol is spread out over the multipath signal components. The advantage of multipath signal addition is that a substantial portion of signal energy is recovered in an output signal from the AVC. Consequently, a detection circuit has an input signal from the AVC with a higher sign-to-noise ratio (SNR), and so can detect the presence of a symbol with a lower bit-error ration (BER). In addition, measuring the output of the AVC is a good indication of the transmit power of the transmitter, and a good measure of the system's interference noise.

Adaptive Matched Filter

One embodiment of the current invention includes an Adaptive Matched Filter (AMF) to optimally combine the multipath signal components in a received spread spectrum message signal. The AMF is a tapped delay line which holds shifted values of the sampled message signal and combines these after correcting for the channel response. The correction for the channel response is done using the channel response estimate calculated in the AVC which operates on the Pilot sequence signal. The output signal of the AMF is the combination of the multipath components which are summed to give a maximum value. This combination corrects for the distortion of multipath signal reception. The various message despreading circuits operate on this combined multipath component signal from the AMF.

Figure 8D:
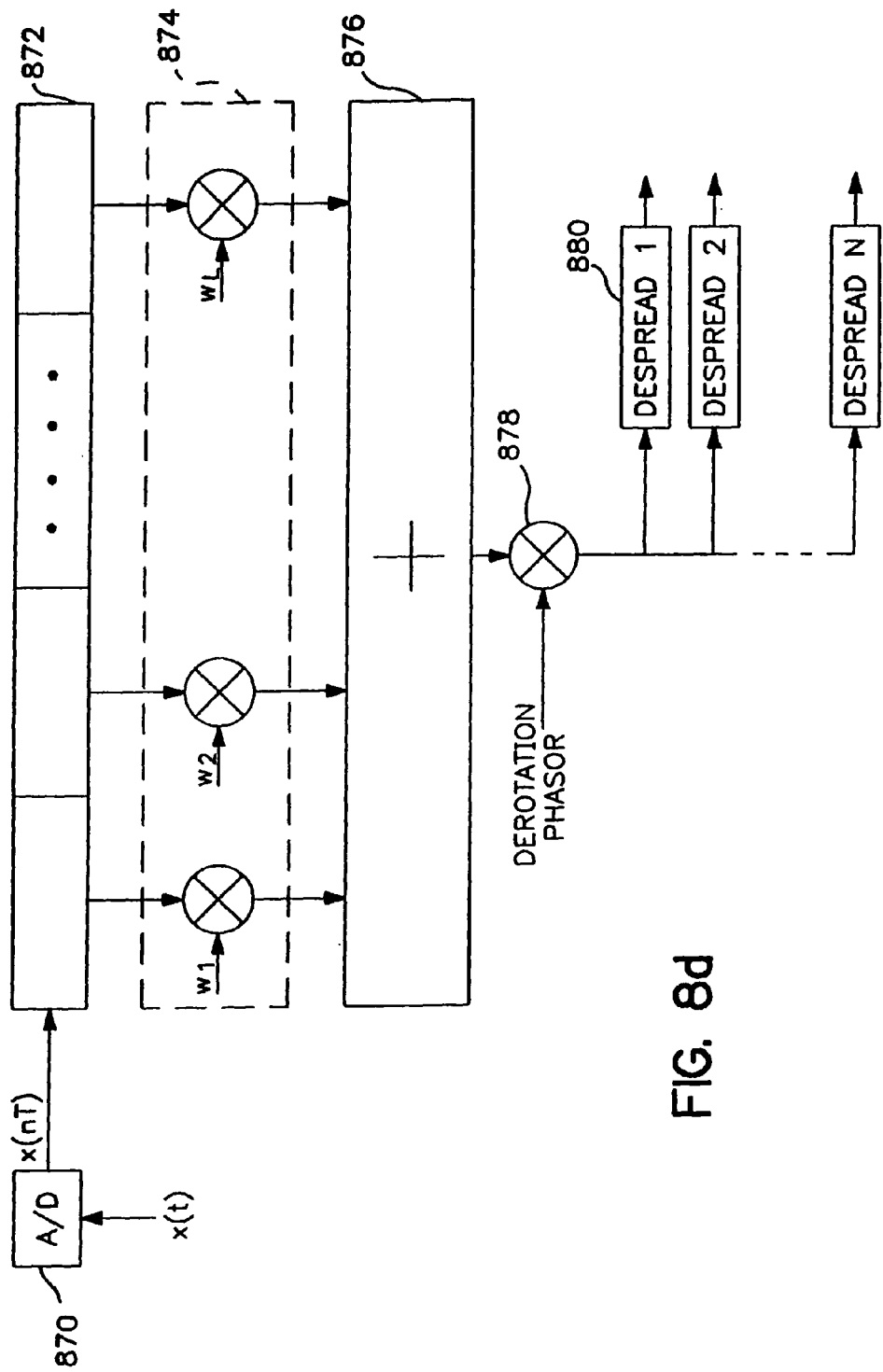
FIG. 8d is a block diagram of the Adaptive Matched Filter of one embodiment of the present invention.

FIG. 8*d* shows an exemplary embodiment of the AMF. The sampled signal from the A/D converter 870 is applied to the L-stage delay line 872. Each stage of this delay line 872 holds the signal corresponding to a different multipath signal component. Correction for the channel response is applied to each delayed signal component by multiplying the component in the respective multiplier of multiplier bank 874 with the respective weighting factor $w_1, w_2, \ldots, w_L$ from the AVC corresponding to the delayed signal component. All weighted signal components are summed in the adder 876 to give the combined multipath component signal y(t).

The combined multipath component signal y(t) does not include the correction due to phase and frequency offset of the carrier signal. The correction for the phase and frequency offset of the carrier signal is made to y(t) by multiplying y(t) with carrier phase and frequency correction (derotation phasor) in multiplier 878. The phase and frequency correction is produced by the AVC as described previously. FIG. 8*d* shows the correction before the despreading circuits 880, but alternate embodiments of the invention can apply the correction after the despreading circuits.

The Radio Carrier Station (RCS)

The Radio Carrier Station (RCS) of the present invention acts as a central interface between the SU and the remote processing control network element, such as a Radio Distribution Unit (RDU). The interface to the RDU of the exemplary system follows the G.704 standard and an interface according to a modified version of DECT V5.1, but the present invention may support any interface that can exchange call control and traffic channels. The RCS receives information channels from the RDU including call control data, and traffic channel data such as, but not limited to, 32 kb/s ADPCM, 64 kb/s PCM, and ISDN, as well as system configuration and maintenance data. The RCS also terminates the CDMA radio interface bearer channels with SUs, which channels include both control data, and traffic channel data. In response to the call control data from either the RDU or a SU, the RCS allocates traffic channels to bearer channels on the RF communication link and establishes a communication connection between the SU and the telephone network through an RDU.

Figure 9:
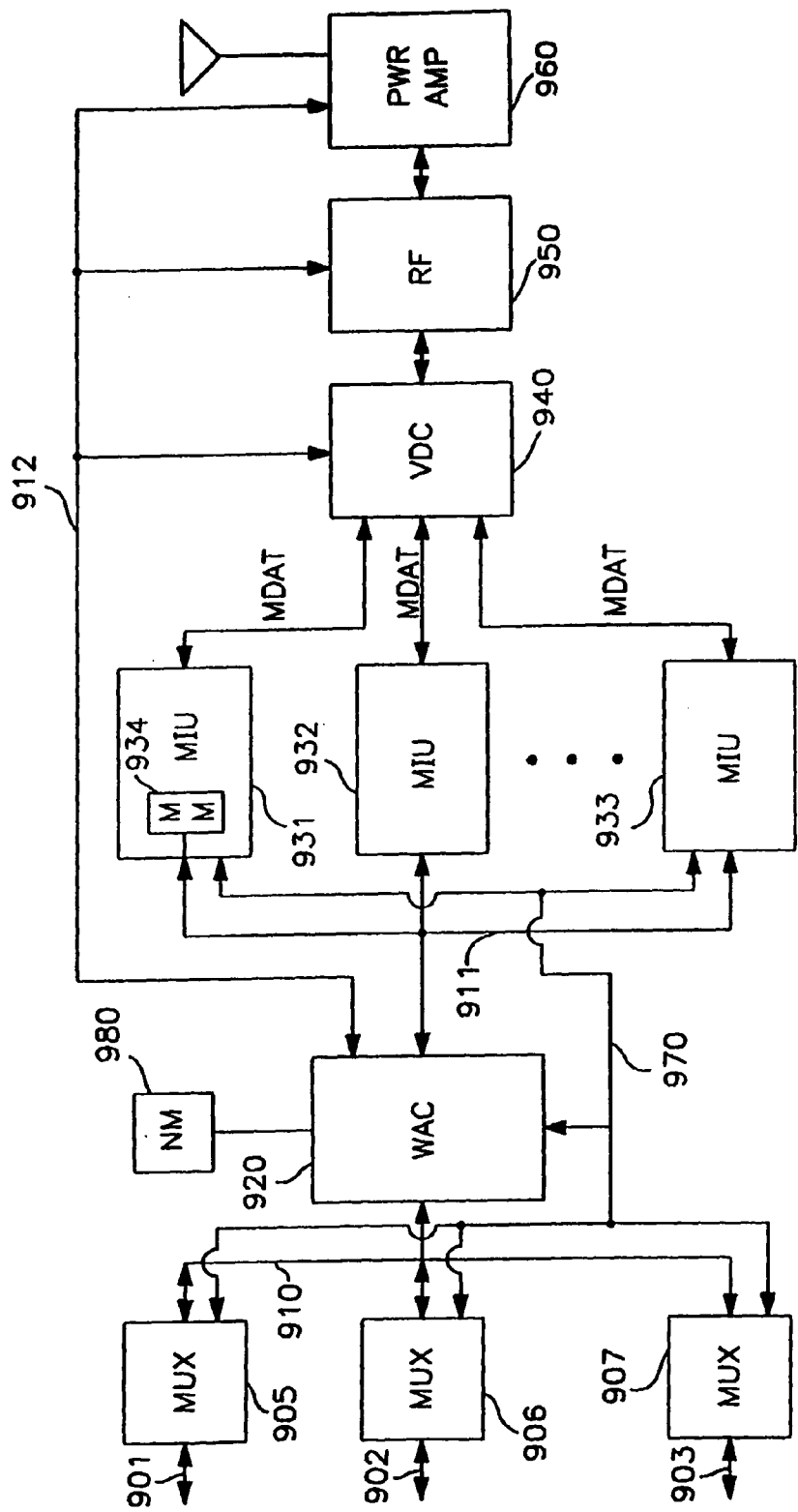
FIG. 9 is a block diagram of the elements of an exemplary radio carrier station (RCS) of the present invention.

As shown in FIG. 9, the RCS receives call control and message information data into the MUXs 905, 906 and 907 through interface lines 901, 902 and 903. Although E1 format is shown, other similar telecommunication formats can be supported in the same manner as described below. Each MUX provides a connection to the Wireless Access Controller (WAX) 920 through the PCM highway 910. While the exemplary system shown in FIG. 1 uses an E1 Interface, it is contemplated that other types of telephone lines which convey multiple calls may be used, for example, T1 lines or lines which interface to a Private Branch Exchange (PBX).

The Wireless Access Controller (WAC) 920 is the RCS system controller which manages call control functions and interconnection of data streams between the MUXs 905, 906, 907 and the Modem Interface Units (MIUs) 931, 932, 933. The WAC 920 also controls and monitors other RCS elements such as the VCD 940, RF 950, and Power Amplifier 960.

A low speed bus 912 is connected to the WAC 920 for transferring control and status signals between the RF Transmitter/Receiver 950, VDC 940, RF 950 and Power Amplifier 960. The controls signals are sent from the WAC 920 to enable to enable or disable the RF Transmitters/Receiver 950 or Power amplifier 960, and the status signals are sent from the RF Transmitters/Receiver 950 or Power amplifier 960 to monitor the presence of a fault condition.

Figure 10:
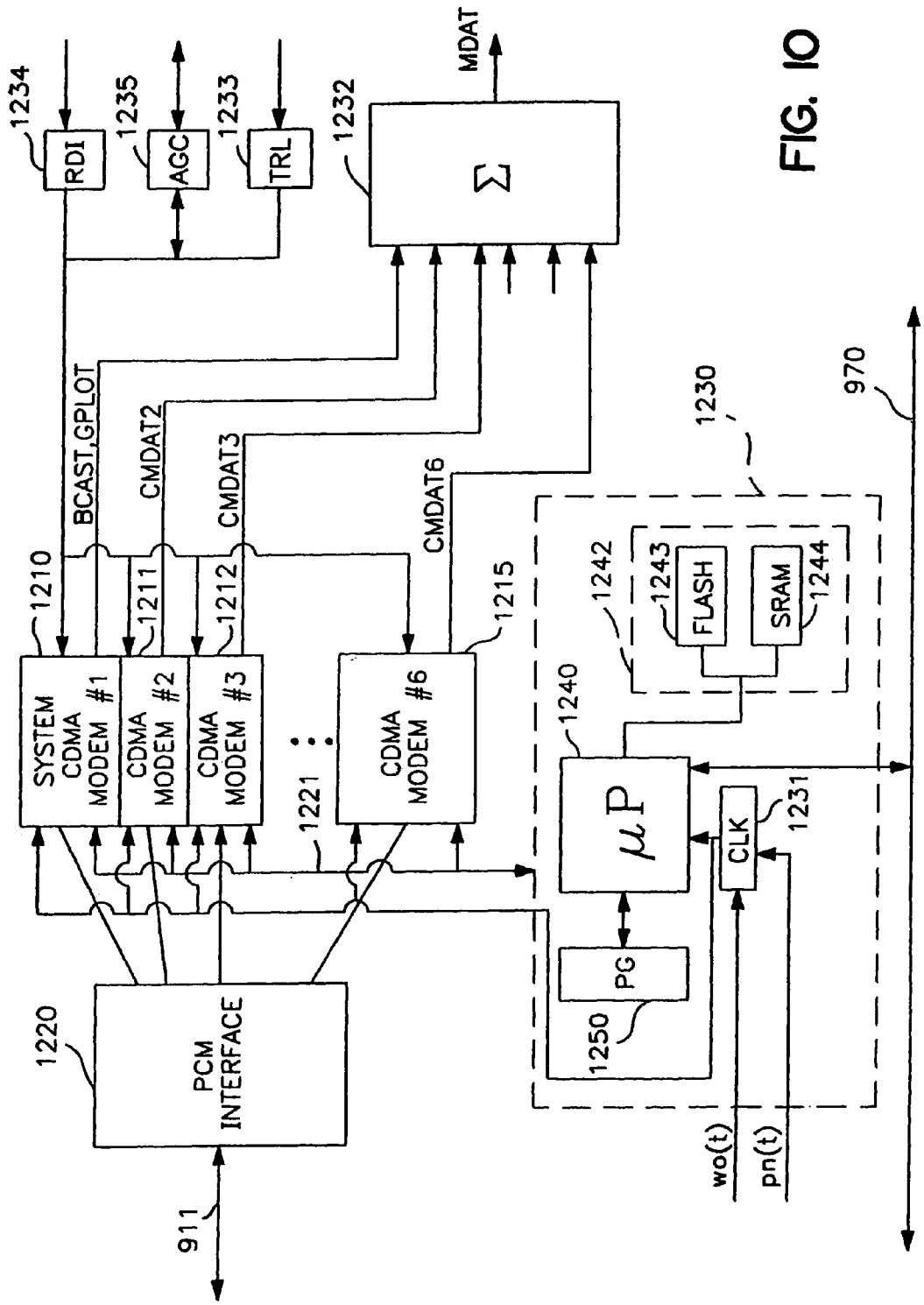
FIG. 10 is a block diagram of the elements of an exemplary modem interface unit (MIU) of the RCS shown in FIG. 9.

The exemplary RCS contains at least one MIU 931, which is shown in FIG. 10. The MIU of the exemplary embodiment includes six CDMA modems, but the invention is not limited to this number of modems. The MIU includes: a System PCM Highway 1201 connected to each of the CDMA Modems 1210, 1211, 1212, 1215 through a PCM Interface 1220; a Control Channel Bus 1221 connected to MIU controller 1230 and each of the CDMA Modems 1210, 1211, 1212, 1213; an MIU clock signal generator (CLK) 1231; and a modem output combiner 1232. The MIU provides the RCS with the following functions: the MIU controller receives CDMA Channel Assignment Instructions from the WAC and assigns a first modem to a user information signal which is applied to the line interface of the MUX and a second modem to receive the CDMA channel from the SU; the MIU also combines the CDMA Transmit Modem Data for each of the MIU CDMA modems; multiplexes I and Q transmit message data from the CDMA modems for transmission to the VDC; receives Analog I and Q receive message data from the VDC; distributes the I and Q data to the CDMA modems; transmits and receives digital AGC Data; distributes the AGC data to the CDMA modems; and sends MIU Board Status and Maintenance Information to the WAC 920.

The MIU controller 1230 of the exemplary embodiment of the present invention contains one communication microprocessor 1240, such as the MC68360 "QUICC" Processor, and includes a memory 1242 having a Flash Prom memory 1243 and a SRAM memory 1244. Flash Prom 1243 is provided to contain the program code for the Microprocessors 1240, and the memory 1243 is downloadable and reprogrammable to support new program versions. SRAM 1244 is provided to contain the temporary data space needed by the MC68360 Microprocessor 1240 when the MIU controller 1230 reads or writes data to memory.

The MIU CLK circuit 1231 provides a timing signal to the MIU controller 1230, and also provides a timing signal to the CDMA modems. The MIU CLK circuit 1231 receives and is synchronized to the system clock signal wo(t). The controller clock signal generator 1213 also receives and synchronizes to the spreading code clock signal pn(t) which is distributed to the CDMA modems 1210, 1211, 1212, 1215 from the MUX.

The RCS of the present embodiment includes a System Modem 1210 contained on one MIU. The System Modem 1210 includes a Broadcast spreader (not shown) and a Pilot Generator (not shown). The Broadcast Modem provides the broadcast information used by the exemplary system, and the broadcast message data is transferred from the MIU controller 1230 to the System Modem 1210. The System Modem also includes four additional modems (not shown) which are used to transmit the signals CT1 through CT4 and AX1 through AX4. The System Modem 1210 provides unweighted I and Q Broadcast message data signals which are applied to the VDC. The VDC adds the Broadcast message data signal to the MIU CDMA Modem Transmit Data of all CDMA modems 1210, 1211, 1212, 1215, and the Global Pilot signal.

The Pilot Generator (PG) 1250 provides the Global Pilot signal which is used by the present invention, and the Global Pilot signal is provided to the CDMA modems 1210, 1211, 1212, 1215 by the MIU controller 1230. Other embodiments of the present invention, however, do not require the MIU controller to generate the Global Pilot signal, but include a Global Pilot signal generated by any form of CDMA Code Sequence generator. In the described embodiment of the invention, the unweighted I and Q Global Pilot signal is also sent to the VDC where it is assigned a weight, and added to the MIU CDMA Modem transmit data and Broadcast message data signal.

System timing in the exemplary RCS is derived from the E1 interface. There are four MUXs in an RCS, three of which (905, 906 and 907) are shown in FIG. 9. Two MUXs are located on each chassis. One of the two MUXs on each chassis is designated as the master, and one of the masters is designated as the system master. The MUX which is the system master derives a 2.048 Mhz PCM clock signal from the E1 interface using a phase locked loop (not shown). In turn, the system master MUX divides the 2.048 Mhz PCM clock signal in frequency by 16 to derive a 128 KHz reference clock signal. The 128 KHz reference clock signal is distributed from the MUX that is the system master to all the other MUXs. In turn, each MUX multiplies the 128 KHz reference clock signal in frequency to synthesize the system clock signal which has a frequency that is twice the frequency of the PN-clock signal. The MUX also divides the 128 KHz clock signal in frequency by 16 to generate the 8 KHz frame synch signal which is distributed to the MIUs. The system clock signal for the exemplary embodiment has a frequency of 11.648 Mhz for a 7 MHz bandwidth CDMA channel. Each MUX also divides the system clock signal in frequency by 2 to obtain the PN-clock signal and further divides the PN-clock signal in frequency by 29 877 120 (the PN sequence length) to generate the PN-synch signal which indicates the epoch boundaries. The PN-synch signal from the system master MUX is also distributed to all MUXs to maintain phase alignment of the internally generated clock signals for each MUX. The PN-synch signal and the frame synch signal are aligned. The two MUXs that are designated as the master MUXs for each chassis then distribute both the system clock signal and the PN-clock signal to the MIUs and the VDC.

The PCM Highway Interface 1220 connects the System PCM Highway 911 to each CDMA Modem 1210, 1211, 1212, 1215. The WAC controller transmits Modem Control information, including traffic message control signals for each respective user information signal, to the MIU controller 1230 through the HSB 970. Each CDMA Modem 1210, 1211, 1212, 1215 receives a traffic message control signal, which includes signaling information, from the MIU. Traffic message control signals also include call control (CC) information and spreading code and despreading code sequence information.

The MIU also includes the Transmit Data Combiner 1232 which adds weighted CDMA modem transmit data including In-phase (I) and Quadrature (Q) modem transmit data from the CDMA modems 1210, 1211, 1212, 1215 on the MIU. The I modem transmit data is added separately from the Q modem transmit data. The combined I and Q modem transmit data output signal of the Transmit Data Combiner 1232 is applied to the I and Q multiplexer that creates a single CDMA transmit message channel composed of the I and Q modem transmit data multiplexed into a digital data stream.

The Receiver Data Input Circuit (RDI) 1234 receives the Analog Differential I and Q Data from the Video Distribution Circuit (VDC) 940 shown in FIG. 9 and distributes Analog Differential I and Q Data to each of the CDMA Modems 1210, 1211, 1212, 1215 of the MIU. The Automatic Gain Control Distribution Circuit (AGC) 1235 receives the AGC Data signal from the VDC and distributes the AGC Data to each of the CDMA Modems of the MIU. The TRL circuit 1233 receives the Traffic lights information and similarly distributes the Traffic light data to each of the Modems 1210, 1211, 1212, 1215.

The CDMA Modem

The CDMA modem provides for generation of CDMA spreading-code sequences, synchronization between transmitter and receiver. It also provides four full duplex channels (TR0, TR1, TR2, TR3) programmable to 64, 32, 16, and 8 ksym/sec. each, spreading and transmission at a specific power level. The CDMA modem measures the received signal strength to allow Automatic Power Control, it generates and transmits pilot signals, encodes and decodes using the signal for forward error correction (FEC). The modem in a subscriber unit (SU) also performs transmitter spreading-code pulse shaping using an FIR filter. The CDMA modem is also used by the SU and, in the following discussion, those features which are used only by the SU are distinctly pointed out. The operating frequencies of the CDMA modem are given in Table 7.

TABLE 7

| Operating Frequencies | | | |
|---|---|---|---|
| Bandwidth (MHz) | Chip Rate (MHz) | Symbol Rate (KHz) | Gain (Chips/Symbol) |
| 7 | 5.824 | 64 | 91 |
| 10 | 8.320 | 64 | 130 |
| 10.5 | 8.512 | 64 | 133 |
| 14 | 11.648 | 64 | 182 |
| 15 | 12.480 | 64 | 195 |

Figure 11:
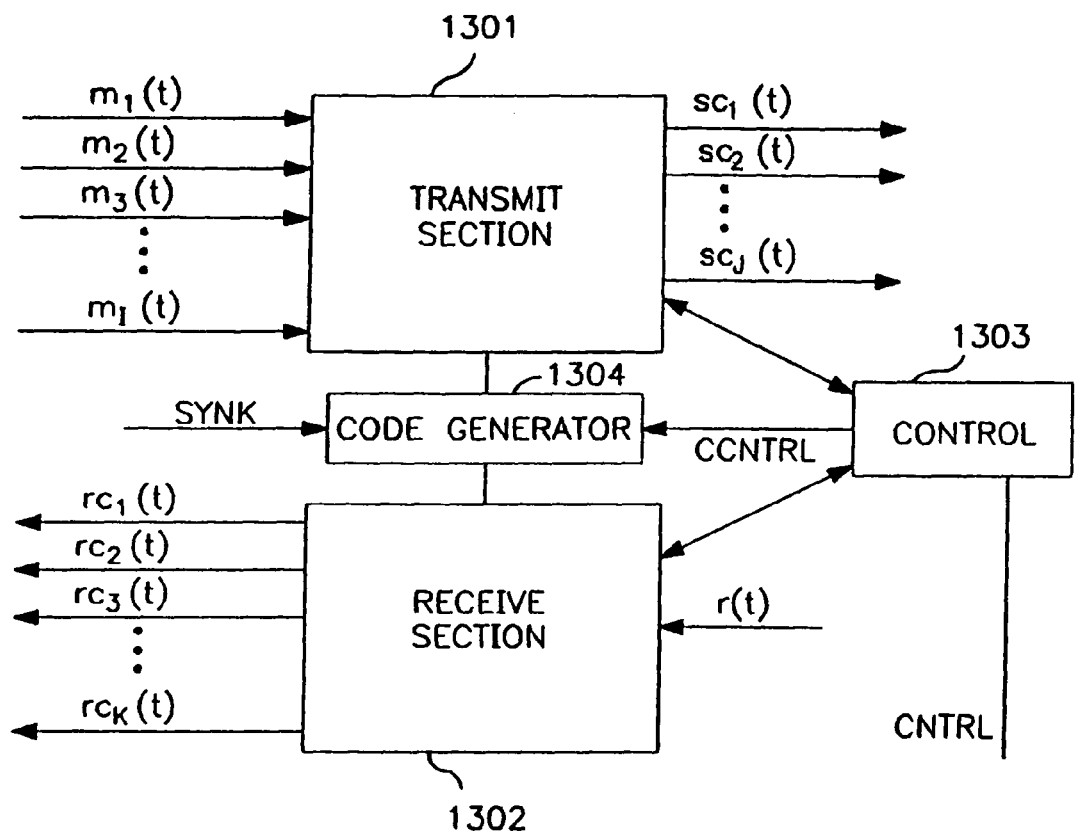
FIG. 11 is a high level block diagram showing the transmit, receive, control, and code generation circuitry of the CDMA modem.

Each CDMA modem 1210, 1211, 1212, 1215 of FIG. 10, and as shown in FIG. 11, is composed of a transmit section 1301 and a receive section 1302. Also included in the CDMA modem is a control center 1303 which receives control messages CNTRL from the external system. These messages are used, for example, to assign particular spreading codes, to activate the spreading or despreading, or to assign transmission rates. In addition, the CDMA modem has a code generator means 1304 used to generate the various spreading and despreading codes used by the CDMA modem. The transmit section 1301 transmits the input information and control signals $m_i(t)$, i=1, 2, ... I as spread-spectrum processed user information signals $sc_j(t)$, j=1, 2, ... J. The transmit section 1301 receives the global pilot code from the code generator 1304 which is controlled by the control means 1303. The spread spectrum processed user information signals are ultimately added with other similarly processed signals and transmitted as CDMA channels over the CDMA RF forward message link, for example to the SUs. The receive section 1302 receives CDMA channels as r(t) and despreads and recovers the user information and control signal $rc_k(t)$, k=1, 2, ... K transmitted over the CDMA RF reverse message link, for example to the RCS from the SUs.

CDMA Modem Transmitter Section

Figure 12:
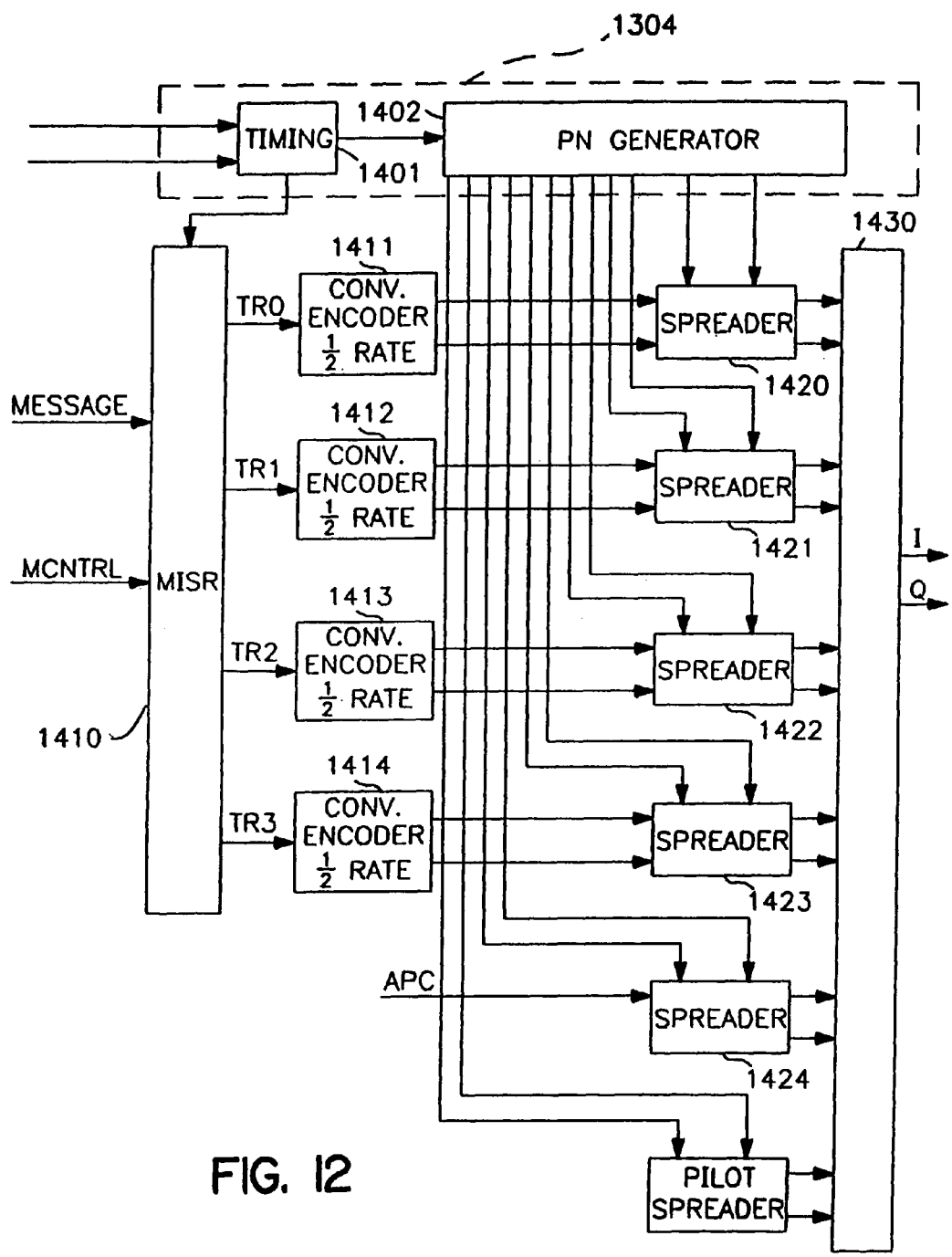
FIG. 12 is a block diagram of the transmit section of the CDMA modem.

Referring to FIG. 12, the code generator means 1304 includes Transmit Timing Control Logic 1401 and spreading-code PN-Generator 1402, and the Transmit Section 1301 includes MODEM Input Signal Receiver (MISR) 1410, convolution Encoders 1411, 1412, 1413, 1414, Spreaders 1420, 1421, 1422, 1423, 1424, and Combiner 1430. The Transmit Section 1301 receives the message data channels MESSAGE, convolutionally encodes each message data channel in the respective convolutional encoder 1411, 1412, 1413, 1414, modulates the data with random spreading-code sequence in the respective spreader 1420, 1421, 1422, 1423, 1424, and combines modulated data from all channels, including the pilot code received in the described embodiment from the code generator, in the combiner 1430 to generate I and Q components for RF transmission. The Transmitter Section 1301 of the present embodiment supports four (TR0, TR1, TR2, TR3) 64, 32, 16, 8 Kbps programmable channels. The message channel data is a time multiplexed signal received from the PCM highway 1201 through PCM interface 1220 and input to the MISR 1410.

Figure 13:
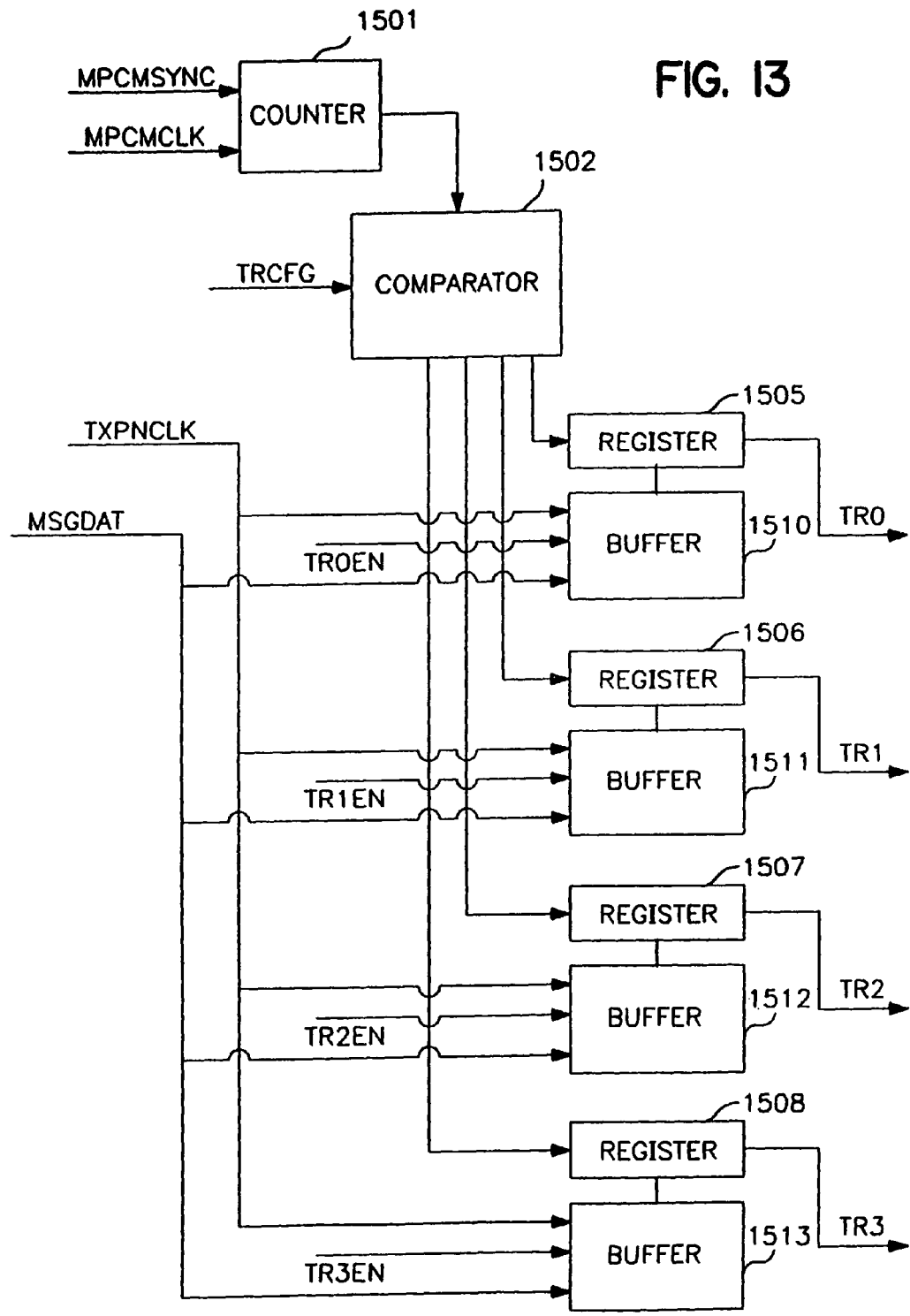
FIG. 13 is a block diagram of an exemplary modem input signal receiver.

FIG. 13 illustrates the block diagram of the MISR 1410. For the exemplary embodiment of the present invention, a counter is set by the 8 KHz frame synchronization signal MPCMSYNC and is incremented by 2.048 MHz MPCM-CLK from the timing circuit 1401. The counter output is compared by comparator 1502 against TRCFG values corresponding to slot time location for TR0, TR1, TR2, TR3 message channel data; and the TRCFG values are received from the MIU Controller 1230 in MCTRL. The comparator sends a count signal to the registers 1505, 1506, 1507, 1508 which clocks message channel data into buffers 1510, 1511, 1512, 1513 using the TXPCNCLK timing signal derived from the system clock. The message data is provided from the signal MSGDAT from the PCM highway signal MESSAGE when enable signal TR0EN, RT1EN, TR2EN and TR3EN from Timing Control Logic 1401 are active. In further embodiments, MESSAGE may also include signals that enable registers depending upon an encryption rate or data rate. If the counter output is equal to one of the channel location addresses, the specified transmit message data in registers 1505, 1506, 1507, 1508 are input to the convolutional encoders 1411, 1412, 1413, 1414 shown in FIG. 12.

The convolutional encoder enables the use of Forward error correction (FEC) techniques, which are well known in the art. FEC techniques depend on introducing redundancy in generation of data in encoded form. Encoded data is transmitted and the redundancy in the data enables the receiver decoder device to detect and correct errors. One exemplary system which uses a modem according to the present invention employs convolutional encoding. Additional data bits are added to the data in the encoding process and are the coding overhead. The coding overhead is expressed as the ratio of data bits transmitted to the tool bits (code data+redundant data) transmitted and is called the rate "R" of the code.

Convolution codes are codes where each code bit is generated by the convolution of each new uncoded bit with a number of previous coded bits. The total number of bits used in the encoding process is referred to as the constraint length, "K", of the code. In convolution coding, data is clocked into a shift register of K bits length so that an incoming bit is clocked into the register, and it and the existing K−1 bits are convolutionally encoded to create a new symbol. The convolution process consists of creating a symbol consisting of a module-2 sum of a certain pattern of available bits, always including the first bit and the last bit in at least one of the symbols.

Figure 14:
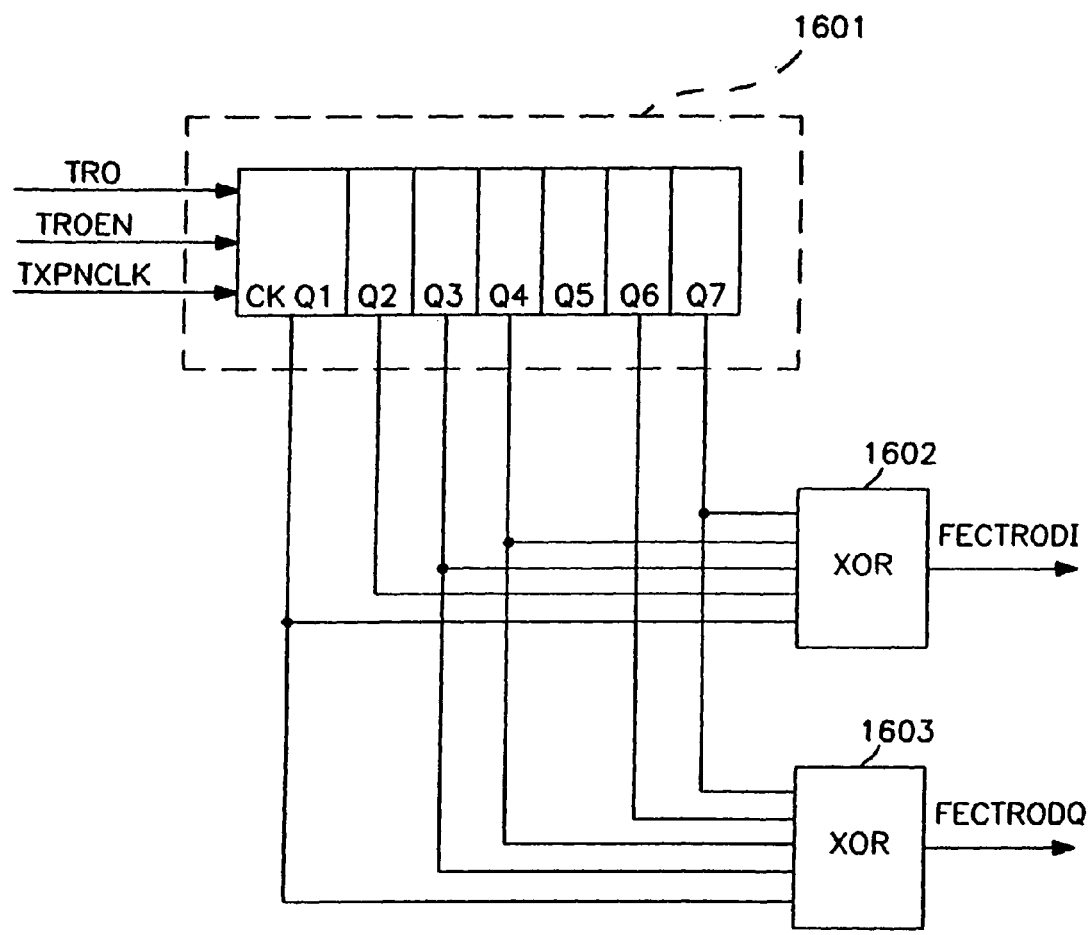
FIG. 14 is a block diagram of an exemplary convolutional encoder as used in the present invention.

FIG. 14 shows the block diagram of K=7, R=½ convolution encoder suitable for use as the encoder 1411 shown in FIG. 12. This circuit encodes the TR0 Channel as used in one embodiment of the present invention. Seven-bit Register 1601 with stages Q1 through Q7 uses the signal TXPNCLK to clock in TR0 data when the TR0EN signal is asserted. The output value of stages Q1, Q2, Q3, Q4, Q6, and Q7 are each combined using EXCLUSIVE-OR Logic 1602, 1603 to produce respective I and Q channel FEC data for the TR0 channel FECTR0DI and FECTR0DQ.

Two output symbol streams FECTR0DI and FECTR0DQ are generated. The FECTR0DI symbol stream is generated by EXCLUSIVE OR Logic 1602 of shift register outputs corresponding to bits 6, 5, 4.3, and 0, (Octal 171) and is designed as In phase component "I" of the transmit message channel data. The symbol stream FECTR0DQ is likewise generated by EXCLUSIVE-OR logic 1603 of shift register outputs from bits 6, 4, 3, 1 and 0, (Octal 133) and is designated as Quadrature component "Q" of the transmit message channel data. Two symbols are transmitted to represent a single encoded bit creating the redundancy necessary to enable error correction to take place on the receiving end.

Referring to FIG. 14, the shift enable clock signal for the transmit message channel data is generated by the Control Timing Logic 1401. The convolutionally encoded transmit message channel output data for each channel is applied to the respective spreader 1420, 1421, 1422, 1423, 1424 which multiplies the transmit message channel data by its preassigned spreading-code sequence from code generator 1402. This spreading-code sequence is generated by control 1303 as previously described, and is called a random pseudonoise signature sequence (PN-code).

The output signal of each spreader 1420, 1421, 1422, 1423, 1424 is a spread transmit data channel. The operation of the spreader is as follows: the spreading of channel output (I+jQ) multiplied by a random sequence (PNI+jPNQ) yields the In-phase component I of the result being composed of (I xor PNI) and (−Q xor PNQ). Quadrature component Q of the result is (Q xor PNI) and (I xor PNQ). Since there is no channel data input to the pilot channel logic (I=1, Q values are prohibited), the spread output signal for pilot channels yields the respective sequences PNI for I component and PNQ for Q component.

The combiner 1430 receives the I and Q spread transmit data channels and combines the channels into an I modem transmit data (TXIDAT) and Q modem transmit data (TXQ-DAT) signals. The I-spread transmit data and the Q spread transmit data are added separately.

For an SU, the CDMA modem Transmit Section 1301 includes the FIR filters to receive the I and Q channels from the combiner to provide pulse shaping, close-in spectral control and x/sin (x) correction on the transmitted signal. Separate but identical FIR filters (not shown) receive the I and Q spread transmit data streams at the chipping rate, and the output signal of each of the filters is at twice the chipping rate. The FIR filters are 28 tap even symmetrical filters, which upsample (interpolate) by 2. The upsampling occurs before the filtering, so that 28 taps refers to 28 taps at twice the chipping rate, and the upsampling is accomplished by setting every other sample a zero. Exemplary coefficients are shown in Table 8.

TABLE 8

Coefficient Values

| Coeff No. | | | | | | | | | | | | | |
|---|---|---|---|---|---|---|---|---|---|---|---|---|---|
| 0 | 1 | 2 | 3 | 4 | 5 | 6 | 7 | 8 | 9 | 10 | 11 | 12 | 13 |

| Value | 3 | −11 | −34 | −22 | 19 | 17 | 32 | 19 | 52 | 24 | 94 | −31 | 277 | 468 |

| Coeff No. | | | | | | | | | | | | | |
|---|---|---|---|---|---|---|---|---|---|---|---|---|---|
| 14 | 15 | 16 | 17 | 18 | 19 | 20 | 21 | 22 | 24 | 25 | 26 | 27 | |

| Value | 277 | −31 | −94 | 24 | 52 | −19 | −32 | 17 | 19 | −22 | −34 | −11 | 3 |

CDMA Modem Receiver Section

Referring to FIGS. 9 and 10, the RF receiver 950 of the present embodiment accepts analog input I and Q CDMA channels, which are transmitted to the CDMA modems 1210, 1211, 1212, 1215 through the MIUs 931, 932, 933 from the VDC 940. These I and Q CMDA channel signals are sampled by the CDMA modem receive section 1302 (shown in FIG. 11) and converted to I and Q digital receive message signal using an Analog to Digital (A/D) converter 1730 of FIG. 15. The sampling rate of the A/D converter of the exemplary embodiment of the present invention is equivalent to the despreading code rate. The I and Q digital receive message signals are then despread with correlators using six different complex despreading code sequences corresponding to the spreading code sequences of the four channels (TR0, TR1, TR2, TR3), APC information and the pilot code.

Time synchronization of the receiver to the received signal is separated into two phases; there is an initial acquisition phase and then a tracking phase after the signal timing has been acquired. The initial acquisition is done by sliding the locally generated pilot code sequence relative to the received signal and comparing the output signal of the pilot despreader to a threshold. The method used is called sequential search. Two thresholds (match and dismiss) are calculated from the auxiliary despreader. Once the signal is acquired, the search process is stopped and tracking begins. The tracking maintains the code generator 1304 (shown in FIGS. 11 and 15) used by the receiver in synchronization with the incoming signal. The tracking loop used in the Delay-Locked Loop (DLL) and is implemented in the acquisition & track 1701 and the IPM 1702 blocks of FIG. 15.

Figure 15:
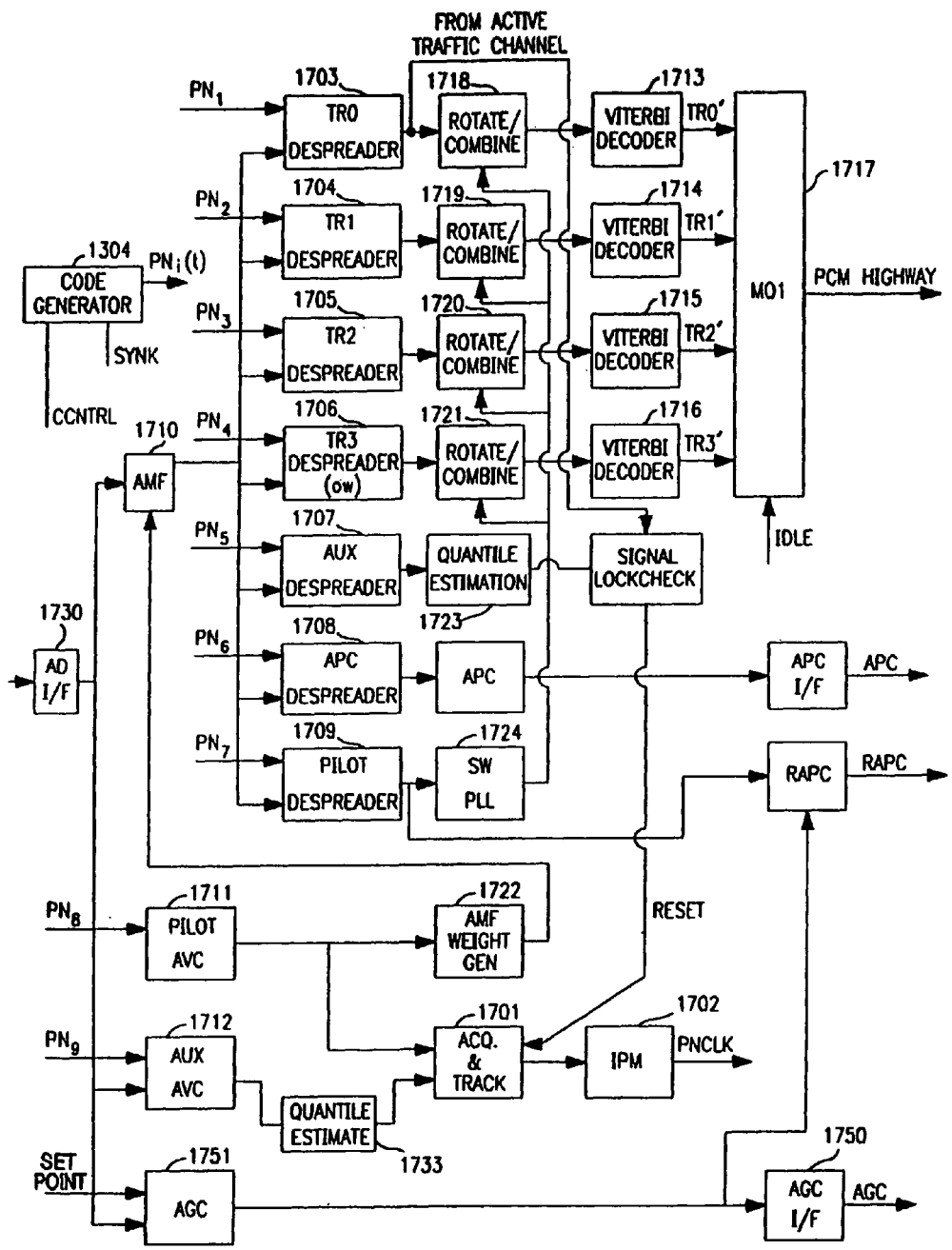
FIG. 15 is a block diagram of the receive section of the CDMA modem.

In FIG. 11, the modem controller 1303 implements the Phase Lock Loop (PLL) as a software algorithm in SW PLL logic 1724 of FIG. 15 that calculates the phase and frequency shift in the received signal relative to the transmitted signal. The calculated phase shifts are used to derotate the phase shifts in rotate and combine blocks 1718, 1719, 1720, 1721 of the multipath data signal for combining to produce output signals corresponding to receive channels TR0', TR1', TR2', TR3'. The data is then Viterbi decoded in Viterbi Decoders 1713, 1714, 1715, 1716 to remove the convolutional encoding in each of the received message channels.

FIG. 15 indicates that the Code Generator 1304 provides the code sequences $Pn_i(t)$, I=1, 2, . . . I used by the receive channel despreaders 1703, 1704, 1705, 1706, 1707, 1708, 1709. The code sequences generated are timed in response to the SYNK signal of the system clock signal and are determined by the CCNTRL signal from the modem controller 1303 shown in FIG. 11. Referring to FIG. 15, the CDMA modem receiver section 1302 includes Adaptive Matched Filter (AMF) 1710, Channel despreaders 1703, 1704, 1705, 1706, 1707, 1708, 1709, Pilot AVC 1711, Auxiliary AVC 1712, Viterbi decoders 1713, 1714, 1715, 1716, Modem output interface (MOI) 1717, Rotate and Combine logic 1718, 1719, 1720, 1721, AMF Weight Generator 1722, and Quantile Estimation logic 1723.

In another embodiment of the invention, the CDMA modem receiver may also include a Bit error Integrator to measure the BER of the channel and idle code insertion logic between the Viterbi decoders 1713, 1714, 1715, 1716 and the MOI 1717 to insert idle codes in the event of loss of the message data.

Figure 16:
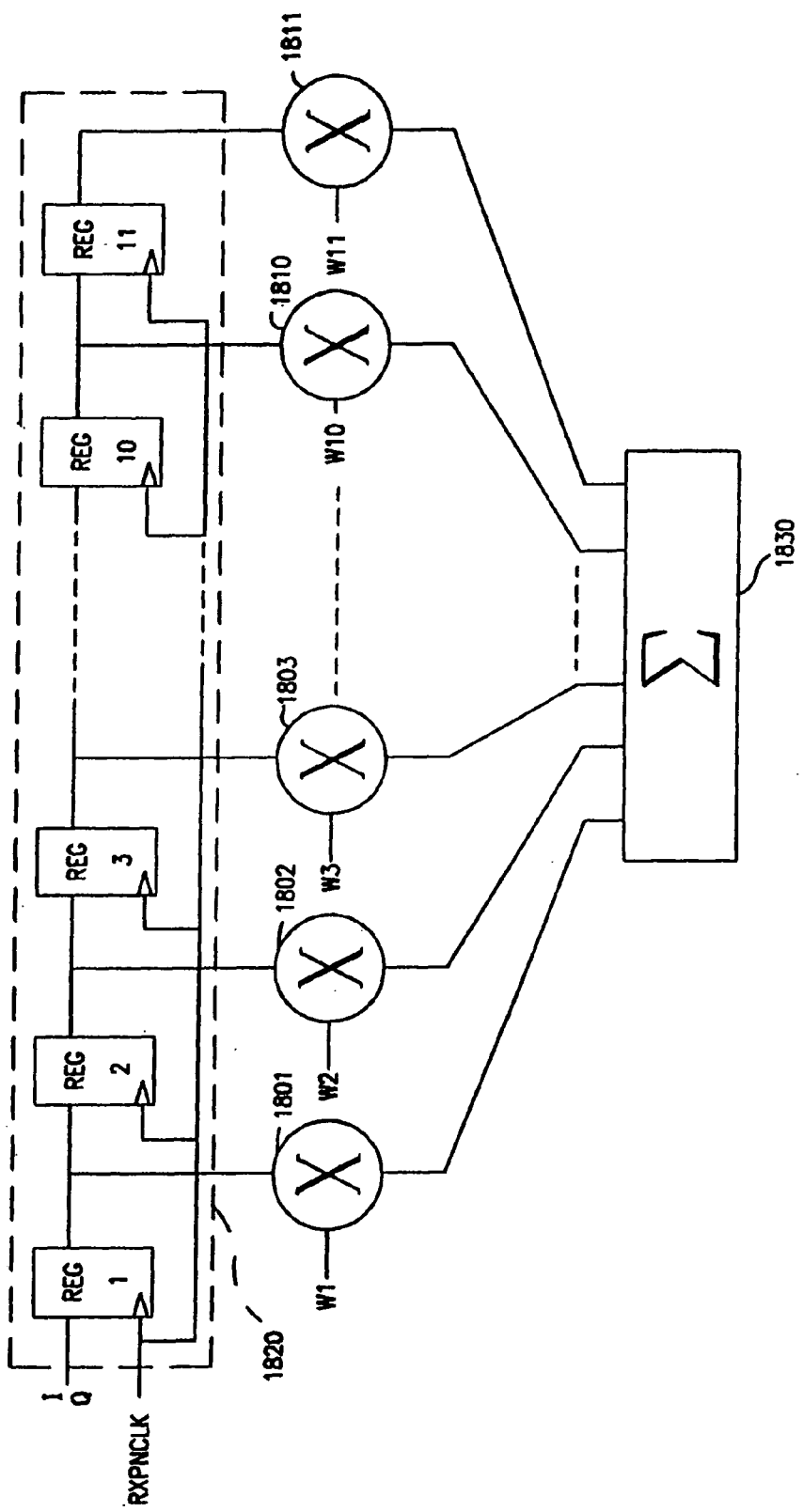
FIG. 16 is a block diagram of an exemplary adaptive matched filter as used in the CDMA modem receive section.

The Adaptive Matched Filter (AMP) 1710 resolves multipath interference introduced by the air channel. The exemplary AMF 1710 uses an stage complex FIR filter as shown in FIG. 16. The received I and Q digital message signals are received at the register 1820 from the A/D converter 1730 of FIG. 15 and are multiplied in multipliers 1801, 1802, 1803, 1810, 1811 by I and Q channel weights W1 to W11 received from AMF weight generator 1722 of FIG. 15. In the exemplary embodiment, the A/D converter 1730 provides the I and Q digital receive message signal data as 2's complement 6 bits I and 6 bits Q which are clocked through an 11 stage shift register 1820 responsive to the receive spreading-code clock signal RXPNCLK. The signal RXPNCLK is generated by the timing section 1401 of code generation logic 1304. Each stage of the shift register is tapped and complex multiplied in the multipliers 1801, 1802, 1803, 1810, 1811 by individual (6-bit I and 6-bit Q) weights to provide 11 tap-weighted products which are added in adder 1830, and limited to 7-bit I and 7-bit Q values.

The CDMA modem receive section 1302 (shown in FIG. 11) provides independent channel despreaders 1703, 1704, 1705, 1706, 1707, 1708, 1709 (shown in FIG. 15) for despreading the message channels. The described embodiment despreads 7 message channels, each despreader accepting a 1-bit I b 1-bit Q spreading-code signal to perform a complex correlation of this code against a 8-bit I by 8-bit Q data input. The 7 despreaders correspond to the 7 channels; Traffic Channel 0 (TR0'), TR1', TR2', TR3', AUX (a spare channel), Automatic Power Control (APC) and pilot (PLT).

Figure 17:
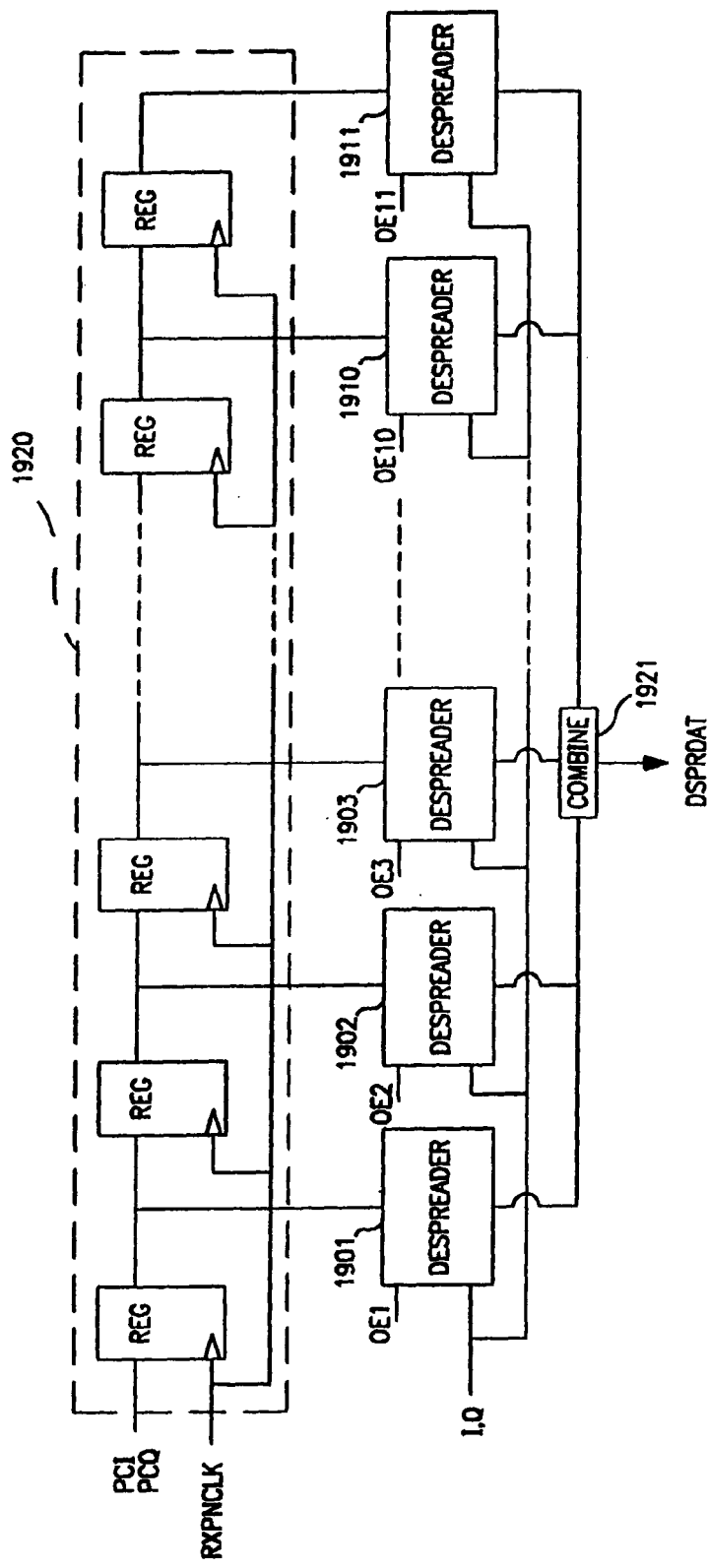
FIG. 17 is a block diagram of an exemplary pilot rake as used in the CDMA modem receive section.

The Pilot AVG 1711 shown in FIG. 17 receives the I and Q Pilot Spreading-code sequence values PCI and PCQ into shift register 1920 responsive to the timing signal RXPNCLK, and includes 11 individual despreaders 1901 through 1911 each correlating the I and Q digital receive message signal data with a one chip delayed versions of the same pilot code sequence. Signals OE1, OE2, . . . OE11 are used by the modem control 1303 to enable the despreading operation. The output signals of the despreaders are combined in combiner 1920 forming correlation signal DSPRDAT of the Pilot AVC 1711, which is received by the ACQ & Track logic 1701

(shown in FIG. 15), and ultimately by modem controller 1303 (shown in FIG. 11). The ACQ & Track logic 1701 uses the correlation signal value to determine if the local receiver is synchronized with its remote transmitter.

Figure 18:
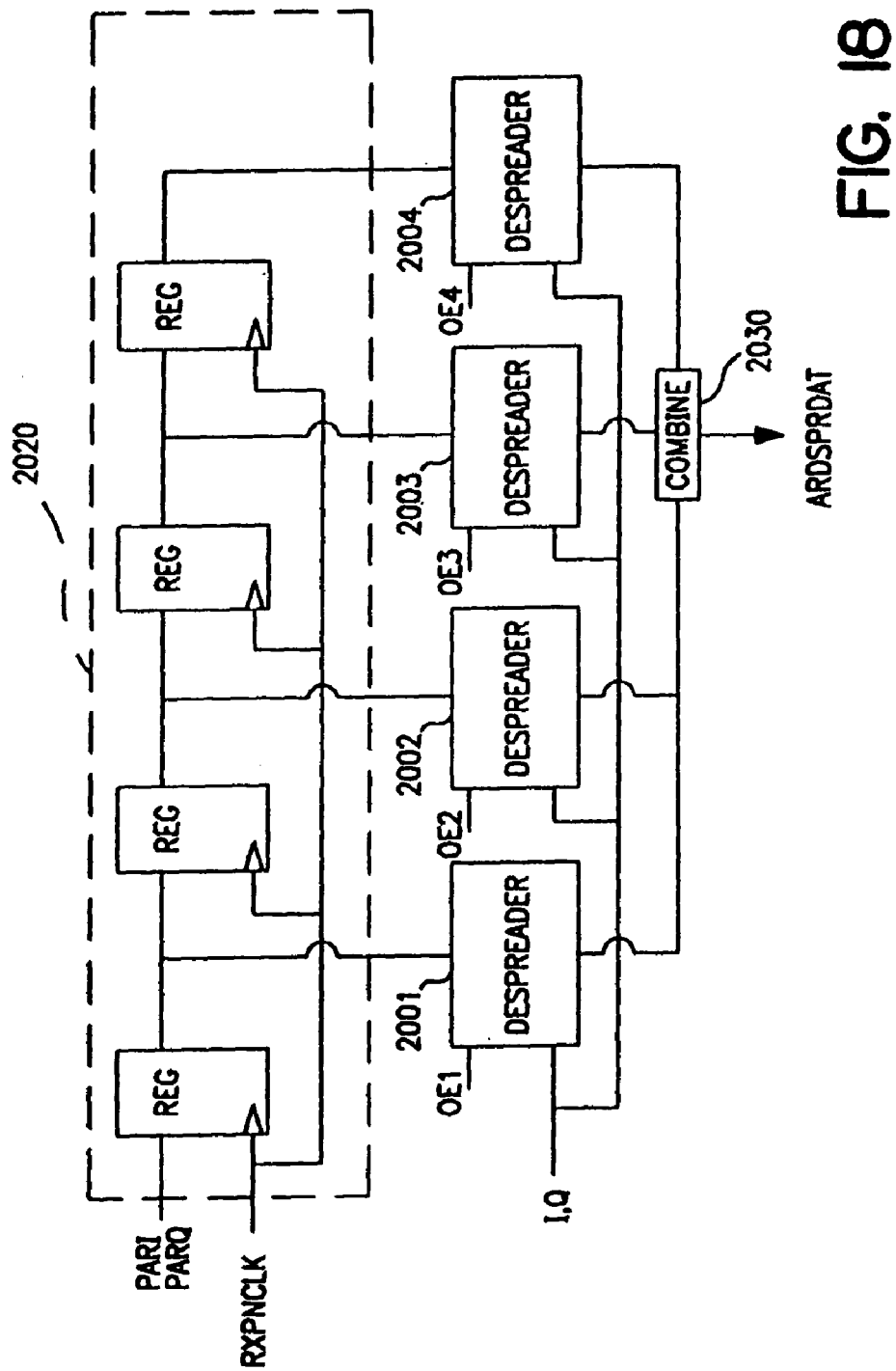
FIG. 18 is a block diagram of an exemplary auxiliary pilot rake as used in the CDMA modem receive section.

The Auxiliary AVC 1712 also receives the I and Q digital receive message signal data and, in the described embodiment, includes four separate despreaders 2001, 2002, 2003, 2004 as shown in FIG. 18. Each despreader receives and correlates the I and Q digital receive message data with delayed versions of the same despreading-code sequence PARI and PARQ which are provided by code generator 1304 input to and contained in shift register 2020. The output signals of the despreaders 2001, 2002, 2003, 2004 are combined in combiner 2030 which provides noise correlation signal ARDSPRDAT. The auxiliary AVC despreading code sequence does not correspond to any transmit spreading-code sequence of the system. Signals OE1, OE2, ... OE4 are used by the modem control 1303 to enable the despreading operation. The Auxiliary AVC 1712 provides a noise correlation signal ARDSPRDAT from which quantile estimates are calculated by the Quantile estimator 1733, and provides a noise level measurement to the ACQ & Track logic 1701 (shown in FIG. 15) and modem controller 1303 (shown in FIG. 11).

Each despread channel output signal corresponding to the received message channels TR0', TR1', TR2', and TR3' is input to a corresponding Viterbi decoder 1713, 1714, 1715, 1716 shown in FIG. 15 which performs forward error correction on convolutionally encoded data. The Viterbi decoders of the exemplary embodiment have a constraint length of K=7 and a rate of R=½. The decoded despread message channel signals are transferred from the CDMA modem to the PCM Highway 1201 through the MOI 1717. The operation of the MOI is very similar to the operation of the MISR of the transmit section 1301 (shown in FIG. 11), except in reverse.

The CDMA modem receiver section 1302 implements several different algorithms during different phases of the acquisition, tracking and despreading of the receive CDMA message signal.

When the received signal is momentarily lost (or severely degraded) the idle code insertion algorithm inserts idle codes in place of the lost or degraded receive message data to prevent the user from hearing loud noise bursts on a voice call. The idle codes are sent to the MOI 1717 (shown in FIG. 15) in place of the decoded message channel output signal from the Viterbi decoders 1713, 1714, 1715, 1716. The idle code used for each traffic channel is programmed by the Modem Controller 1303 by writing the appropriate pattern IDLE to the MOI, which in the present embodiment is a 8 bit word for a 64 kbps stream, 4 bit word for a 32 kbps stream.

Modem Algorithms for Acquisition and Tracking of Received Pilot Signal

The acquisition and tracking algorithms are used by the receiver to determine the approximate code phase of a received signal, synchronize the local modem receiver despreaders to the incoming pilot signal, and track the phase of the locally generated pilot code sequence with the received pilot code sequence. Referring to FIGS. 11 and 15, the algorithms are performed by the Modem controller 1303, which provides clock adjust signals to code generator 1304. These adjust signals cause the code generator for the despreaders to adjust locally generated code sequences in response to measured output values of the Pilot Rake 1711 and Quantile values from quantile estimators 1723B. Quantile values are noise statistics measured from the In-phase and Quadrature channels from the output values of the AUX Vector Correlator 1712 (shown in FIG. 15). Synchronization of the receiver to the received signal is separated into two phases; an initial acquisition phase and a tracking phase. The initial acquisition phase is accomplished by clocking the locally generated pilot spreading-code sequence at a higher or lower rate than the received signal's spreading code rate, sliding the locally generated pilot spreading code sequence and performing sequential probability ratio test (SPRT) on the output of the Pilot Vector correlator 1711. The tracking phase maintains the locally generated spreading-code pilot sequence in synchronization with the incoming pilot signal.

The SU cold acquisition algorithm is used by the SU CDMA modem when it is first powered up, and therefore has no knowledge of the correct pilot spreading code phase, or when an SU attempts to reacquire synchronization with the incoming pilot signal but has taken an excessive amount of time. The cold acquisition algorithm is divided into two subphases. The first subphase consists of a search over the length 233415 code used by the FBCCH. Once this sub-code phase is acquired, the pilot's 233415×128 length code is known to within an ambiguity of 128 possible phases. The second subphase is a search of these remaining 128 possible phases. In order not to lose synch with the FBCCH, the second phase of the search it is desirable to switch back and forth between tracking the FBCCH code and attempting acquisition of the pilot code.

The RCS acquisition of short access pilot (SAXPT) algorithm is used by an RCS CDMA modem to acquire the SAXPT pilot signal of an SU. The algorithm is a fast search algorithm because the SAXPT is a short code sequence of length N, where N=chips/symbol, and ranges from 45 to 195, depending on the system's bandwidth. The search cycles through all possible phases until acquisition is complete.

The RCS acquisition of the long access pilot (LAXPT) algorithm begins immediately after acquisition of SAXPT. The SU's code phase is known within a multiple of a symbol duration, so in the exemplary embodiment of the invention, there may be 7 to 66 phases to search within the round trip delay from the RCS. This bound is a result of the SU pilot signal being synchronized to the RCS Global pilot signal.

The re-acquisition algorithm begins when loss of code lock (LOL) occurs. A Z-search algorithm is used to speed the process on the assumption that the code phase has not drifted far from where it was the last time the system was locked. The RCS uses a maximum width of the Z-search windows bounded by the maximum round trip propagation delay.

The Pre-Track algorithm immediately follows the acquisition or re-acquisition algorithms and immediately precedes the tracking algorithm. Pre-track is a fixed duration period during which the receive data provided by the modem is not considered valid. The Pre-Track period allows other modem algorithms, such as those used by the ISW PLL 1724, ACQ & Tracking, AMF Weight GEN 1722, to prepare and adapt to the current channel. The Pre-track algorithm is two parts. The first part is the delay while the code tracking loop pulls in. The second part is the delay while the AMF tap weight calculations are performed by the AMF Weight Gen 1722 to produce settled weighting coefficients. Also in the second part of the Pre-Track period, the carrier tracking loop is allowed to pull in by the SE PLL 1724, and the scalar quantile estimates are performed in the Quantile estimator 1723A.

The Tracking process is entered after the Pre-Track period ends. This process is actually a repetitive cycle and is the only process phase during which receive data provided by the modem may be considered valid. The following operations are performed during this phase: AMF Tap Weight Update, Carrier Tracking, Code Tracking, Vector Quantile Update, Scalar Quantile Update, Code Lock Check. Derotation and Symbol Summing, and Power Control (forward and reverse).

If loss of lock (LOL) is detected, the modem receiver terminates the Track algorithm and automatically enters the reacquisition algorithm. In the SU, a LOL causes the transmitter to be shut down. In the RCS, LOL causes forward power control to disabled with the transmit power held constant at the level immediately prior to loss of lock. It also causes the return power control information being transmitted to assume a 010101 . . . pattern, causing the SU to hold its transmit power constant. This can be performed using the signal lock check function which generates the reset signal to the acquisition and tracking circuit 1701.

Two sets of quantile statistics are maintained, one by Quantile estimator 1723B and the other by the scalar Quantile Estimator 1723A. Both are used by the modem controller 1303. The first set is the "vector" quantile information, so named because it is calculated from the vector of four complex values generated by the AUX AVC receiver 1712. The second set is the scalar quantile information, which is calculated from the signal complex value AUX signal that is output from the AUX Despreader 1707. The two sets of information represent different sets of noise statistics used to maintain a pre-determined Probability of False Alarm ($P_{fa}$). The vector quantile data is used by the acquisition and reacquisition algorithms implemented by the modem controller 1303 to determine the presence of a received signal in noise, and the scalar quantile information is used by the code lock check algorithm.

For both the vector and scalar cases, quantile information consists of calculated values of lambda0 through lambda2, which are boundary values used to estimate the probability distribution function (p.d.f.) of the despread received signal and determine whether the modem is locked to the PN code. The Aux_Power value used in the following C-subroutine is the magnitude squared of the AUX signal output of the scalar correlator array for the scalar quantiles, and the sum of the magnitudes squared for the vector case. In both cases the quantiles are then calculated using the following C-subroutine:

```
for (n = 0; n<3; n++) {
    lambda [n]+ = (lambda [n]<Aux_Power)?CG[n]:GM[n];
}
``` where CG[n] are positive constants and GM [n] are negative constants (different values are used for scalar and vector quantiles).

During the acquisition phase, the search of the incoming pilot signal with the locally generally pilot code sequence employs a series of sequential tests to determine if the locally generated pilot code has the correct code phase relative to the received signal. The search algorithms use the Sequential Probability Ratio Test (SPRT) to determine whether the received and locally generated code sequences are in phase. The speed of acquisition is increased by the parallelism resulting from having a multi-fingered receiver. For example, in the described embodiment of the invention the main Pilot Rake 1711 has a total of 11 fingers representing a total phase period of 11 chip periods. For acquisition 8 separate sequential probability ratio test (SPRTs) are implemented, with each SPRT observing a 4 chip window. Each window is offset from the previous window by one chip period, and in a search sequence any given code phase is covered by 4 windows. If all 8 of the SPRT tests are rejected, then the set of windows is moved by 8 chips. If any of the SPRTs is accepted, then the code phase of the locally generated pilot code sequence is adjusted to attempt to center the accepted SPRTs phase within the Pilot AVC. It is likely that more than one SPRT reaches the acceptance threshold at the same time. A table lookup is used cover all 256 possible combinations of accept/reject and the modem controller uses the information to estimate the correct center code phase within the Pilot Rake 1711. Each SPRT is implemented as follows (all operations occur at 64 k symbol rate): Denote the fingers' output level values as I_Finger[n] and Q_Finger[n], where n=0 . . . 10 (inclusive, 0 is earliest (most advanced) finger), then the power of each window is:

$$\text{Power Window}\,[i] = \sum_n (\text{I\_Finger}^2[n] + \text{Q\_Finger}^2[n])$$

To implement the SPRT's the modem controller then performs for each of the windows the following calculations which are expressed as a pseudo-code subroutine:

```
/*find bin for Power*/
tmp = SIGMA[0];
for (k = 0; k<3; k + +) {
    if (Power>lambda [k]) tmp = SIGMA[k + 1];
}
test_statistic + = tmp; /*update statistic*/
if (test_statistic>ACCEPTANCE_THRESHOLD) you've got ACQ;
else if (test_statistic<DISMISSAL_THRESHOLD) {
    forget this code phase;
} else keep trying--get more statistics;
``` where lambda[k] are as defined in the above section on quantile estimation, and SIGMA[k], ACCEPTANCE_THRESHOLD and DISMISSAL_THRESHOLD are predetermined constants. Note that SIGMA[k] is negative for values for low values of k, and positive for right values of k, such that the acceptance and dismissal thresholds can be constants rather than a function of how many symbols worth of data have been accumulated in the statistic.

The modem controller determines which bin, delimited by the values of lambda [k], the Power level falls into which allows the modem controller to develop an approximate statistic.

For the present algorithm, the control voltage is formed as $\epsilon = y^T By$, where y is a vector formed from the complex valued output values of the Pilot Vector correlator 1711, and B is a matrix consisting of the constant values pre-determined to maximize the operating characteristics while minimizing the noise as described above with reference to the Quadratic Detector.

To understand the operation of the Quadratic Detector, it is useful to consider the following. A spread spectrum (CDMA) signal, s(t) is passed through a multipath channel with an impulse response $h_c$ (t). The baseband spread signal is described by equation (27).

$$s(t) = \sum_i C_i p(t - iT_c) \qquad (27)$$

where $C_i$ is a complex spreading code symbol, p(t) is a predefined chip pulse and $T_c$ is the chip time spacing, where $T_c = 1/R_c$ and $R_c$ is the chip rate.

The received baseband signal is represented by equation (28)

$$r(t) = \sum_i C_i q(t - iT_c - \tau) + n(t) \tag{28}$$

where $q(t)=p(t)*h_c(t)$, $\tau$ is an unknown delay and $n(t)$ is additive noise. The received signal is processed by a filter, $h_R(t)$, so the waveform, $x(t)$, to be processed is given by equation (29).

$$x(t) = \sum_i C_i f(t - iT_c) - \tau + z(t) \tag{29}$$

where $f(t)=q(t)*h_R(t)$ and $z(t)=n(t)*h_R(t)$.

In the exemplary receiver, samples of the received signal are taken at the chip rate, that is to say, $1/T_c$. These samples, $x(mT_c+\tau')$, are processed by an array of correlators that compute, during the $r^{th}$ correlation period, the quantities given by equation (30)

$$v_k^{(r)} = \sum_{m=rL}^{rL-L-1} x(mT_c + \tau')C_{m-k}^* \tag{30}$$

These quantities are composed of a noise component $w_k^{(r)}$ and a deterministic component $y_k^{(r)}$ given by equation (31).

$$y_k^{(r)}=E[v_k^{(r)}]=Lf(kT_c+\tau'-\tau) \tag{31}$$

In the sequel, the time index r may be suppressed for ease of writing, although it is to be noted that the function f(t) changes slowly with time.

The samples are processed to adjust the sampling phase, $\tau'$, in an optimum fashion for further processing by the receiver, such as matched filtering. This adjustment is described below. To simplify the representation of the process, it is helpful to describe it in terms of the function $f(t+\tau)$, where the time shift, $\tau$, is to be adjusted. It is noted that the function $f(t+\tau)$ is measured in the presence of noise. Thus, it may be problematical to adjust the phase $\tau'$ based on measurements of the signal $f(t+\tau)$. To account for the noise, the function $v(t)$: $v(t)=f(t)+m(t)$ is introduced, where the term $m(t)$ represents a noise process. The system processor may be derived based on considerations of the function $v(t)$.

The process is non-coherent and therefore is based on the envelope power function $|v(t+\tau)|^2$. The functional $e(\tau')$ given in equation (32) is helpful for describing the process.

$$e(\tau') = \int_{-\infty}^{0} |v(t+\tau'-\tau)|^2 dt - \int_{0}^{\infty} |v(t+\tau'-\tau)|^2 dt \tag{32}$$

The shift parameter is adjusted for $e(\tau')=0$, which occurs when the energy on the interval $(-\infty,\tau'-\tau]$ equals that on the interval $[\tau'-\tau, \infty)$. The error characteristic is monotonic and therefore has a single zero crossing point. This is the desirable quality of the functional. A disadvantage of the functional is that it is ill-defined because the integrals are unbounded when noise is present. Nevertheless, the functional $e(\tau')$ may be cast in the form given by equation (33).

$$e(\tau') = \int_{-\infty}^{\infty} w(t)|v(t+\tau'-\tau)|^2 dt \tag{33}$$

where the characteristic function $w(t)$ is equal to $sgn(t)$, the signum function.

To optimize the characteristic function $w(t)$, it is helpful to define a figure of merit, F, as set forth in equation (34).

$$F = \frac{[e(\tau_0'+T_A) - e(\tau_0'+T_A)]^2}{\text{VAR}\{e(\tau_0')\}} \tag{34}$$

The numerator of F is the numerical slope of the mean error characteristic on the interval $[-T_A, T_A]$ surrounding the tracked value, $\tau_0'$. The statistical mean is taken with respect to the noise as well as the random channel, $h_c(t)$. It is desirable to specify a statistical characteristic of the channel in order to perform this statistical average. For example, the channel may be modeled as a Wide Sense Stationary Uncorrelated Scattering (WSSUS) channel with impulse response $h_c(t)$ and a white noise process $U(t)$ that has an intensity function $g(t)$ as shown in equation (35).

$$h_c(t)=\sqrt{g(t)U(t)} \tag{35}$$

The variance of $e(\tau)$ is computed as the mean square value of the fluctuation $$e'(\tau)=e(\tau)-<e(\tau)> \tag{36}$$

where $<e(\tau)>$ is the average of $e(\tau)$ with respect to the noise.

Optimization of the figure of merit F with respect to the function $w(t)$ may be carried out using well-known Variational methods of optimization.

Once the optimal $w(t)$ is determined, the resulting processor may be approximated accurately by a quadratic sample processor which is derived as follows.

By the sampling theorem, the signal $v(t)$, bandlimited to a bandwidth W may be expressed in terms of its samples as shown in equation (37).

$$v(t) = \sum v(k/W)\text{sinc}[(Wt-k)\pi] \tag{37}$$

substituting this expansion into equation (z+6) results in an infinite quadratic form in the samples $v(k/W+\tau'-\tau)$. Making the assumption that the signal bandwidth equals the chip rate allows the use of a sampling scheme that is clocked by the chip clock signal to be used to obtain the samples. These samples, $v_k$ are represented by equation (38).

$$v_k=v(kT_c+\tau'-\tau) \tag{38}$$

This assumption leads to a simplification of the implementation. It is valid if the aliasing error is small.

In practice, the quadratic form that is derived is truncated. An example normalized B matrix is given below in Table 12. For this example, an exponential delay spread profile $g(t)= \exp(-t/\tau)$ is assumed with $\tau$ equal to one chip. An aperture a meter $T_A$ equal to one and one-half chips has also been assumed. The underlying pulse has a raised cosine spectrum with a 20% excess bandwidth.

TABLE 12

Example B matrix

| 0 | 0 | 0 | 0 | 0 | 0 | 0 | 0 | 0 | 0 | 0 |
|---|---|---|---|---|---|---|---|---|---|---|
| 0 | 0 | −0.1 | 0 | 0 | 0 | 0 | 0 | 0 | 0 | 0 |
| 0 | −0.1 | 0.22 | 0.19 | −0.19 | 0 | 0 | 0 | 0 | 0 | 0 |
| 0 | 0 | 0.19 | 1 | 0.45 | −0.2 | 0 | 0 | 0 | 0 | 0 |
| 0 | 0 | −0.19 | 0.45 | 0.99 | 0.23 | 0 | 0 | 0 | 0 | 0 |
| 0 | 0 | 0 | −0.2 | 0.23 | 0 | −0.18 | 0.17 | 0 | 0 | 0 |
| 0 | 0 | 0 | 0 | 0 | −0.18 | −0.87 | −0.42 | 0.18 | 0 | 0 |
| 0 | 0 | 0 | 0 | 0 | 0.17 | −0.42 | −0.92 | −0.16 | 0 | 0 |
| 0 | 0 | 0 | 0 | 0 | 0 | 0.18 | −0.16 | −0.31 | 0 | 0 |
| 0 | 0 | 0 | 0 | 0 | 0 | 0 | 0 | 0 | −0.13 | 0 |
| 0 | 0 | 0 | 0 | 0 | 0 | 0 | 0 | 0 | 0 | 0 |

Code tracking is implemented via a loop phase detector that is implemented as follows. The vector y is defined as a column vector which represents the 11 complex output level values of the Pilot AVC 1711, and B denotes an 11×11 metric real valued coefficient matrix with pre-determined values to optimize performance with the non-coherent Pilot AVC output values y. As described above, the phase detector output is given by equation (39);

$$\epsilon = y^T B y \tag{39}$$

The following calculations are then performed to implement a proportional plus integral loop filter and the VCO:

$$x[n] = x[n-1] + \beta \epsilon$$

$$z[n] = z[n-1] + x[n] + \alpha \epsilon$$

for β and α which are constants chosen from modeling the system to optimize system performance for the particular transmission channel and application, and where x[n] is loop filter's integrator output value and z[n] is the VCO output value. The code phase adjustments are made by the modem controller the following pseudo-code subroutine:

```
if (z>zmx) {
    delay phase 1/16 chip;
    z− = zmax;
} else if (z<−zmax) {
    advance phase 1/16 chip;
    z+ = zmax;
}
```

A different delay phase could be used in the above pseudo-code subroutine consistent with the present invention.

The AMF Tap-Weight Update Algorithm of the AMF Weight Gen 1722 (shown in FIG. 15) occurs periodically to de-rotate and scale the phase each finger value of the Pilot Rake 1711 by performing a complex multiplication of the Pilot AVC finger value with the complex conjugate of the current output value of the carrier tracking loop and applying the product to a low pass filter to produce AMF tap-weight values, which are periodically written into the AMF filters of the CDMA modem.

The Code lock check algorithm, shown in FIG. 15) is implemented by the modem controller 1303 performing SPRT operations on the output signal of the scalar correlator array. The SPRT technique is the same as that for the acquisition algorithms, except that the constants are changed to increase the probability of detection of lock.

Carrier tracking is accomplished via a second order loop that operates on the pilot output values of the scalar correlated array. The phase detector output is the hard limited version of the quadrature component of the product of the (complex valued) pilot output signal of the scalar correlated array and the VCO output signal. The loop filter is a proportional plus integral design. The VCO is a pure summation, accumulated phase error .phi., which is converted to the complex phasor $\cos \phi + j \sin \phi$ using a look-up table in memory.

The previous description of acquisition and tracking algorithm focuses on a non-coherent method because the acquisition and tracking algorithm described uses non-coherent acquisition following by non-coherent tracking. This is done because, during acquisition, a coherent reference is not available until the AMF, Pilot AVC, Aux AVC, and DPLL are in an equilibrium state. It is, however, known in the art that coherent tracking and combining is preferred because in non-coherent tracking and combining the output phase information of each Pilot AVC finger is lost. Consequently, another embodiment of the invention employs a two step acquisition and tracking system, in which the previously described non-coherent acquisition and tracking algorithm is implemented first, and then the system switches to a coherent tracking method. The coherent combining and tracking method is similar to that described previously, except that the error signal tracked is of the form:

$$\epsilon = y^T A y \tag{40}$$

where y is defined as a column vector which represents the 11 complex output level values of the Pilot AVC 1711, and A denotes an 11×11 symmetric real valued coefficient matrix with pre-determined values to optimize performance with the coherent Pilot AVC outputs y. An exemplary A matrix is shown below.

$$A = \begin{pmatrix} 1 & 0 & 0 & 0 & 0 & 0 & 0 & 0 & 0 & 0 & 0 \\ 0 & 1 & 0 & 0 & 0 & 0 & 0 & 0 & 0 & 0 & 0 \\ 0 & 0 & 1 & 0 & 0 & 0 & 0 & 0 & 0 & 0 & 0 \\ 0 & 0 & 0 & 1 & 0 & 0 & 0 & 0 & 0 & 0 & 0 \\ 0 & 0 & 0 & 0 & 1 & 0 & 0 & 0 & 0 & 0 & 0 \\ 0 & 0 & 0 & 0 & 0 & 0 & 0 & 0 & 0 & 0 & 0 \\ 0 & 0 & 0 & 0 & 0 & 0 & -1 & 0 & 0 & 0 & 0 \\ 0 & 0 & 0 & 0 & 0 & 0 & 0 & -1 & 0 & 0 & 0 \\ 0 & 0 & 0 & 0 & 0 & 0 & 0 & 0 & -1 & 0 & 0 \\ 0 & 0 & 0 & 0 & 0 & 0 & 0 & 0 & 0 & -1 & 0 \\ 0 & 0 & 0 & 0 & 0 & 0 & 0 & 0 & 0 & 0 & -1 \end{pmatrix} \tag{41}$$

Although the invention has been described in terms of multiple exemplary embodiments, it is understood by those skilled in the art that the invention may be practiced with modifications to the embodiments which are within the scope of the invention defined by the following claims.

What is claimed is:

1. A method for use in a wireless communication unit for transferring voice data and non-voice data, the method comprising:

receiving the voice data associated with a first logical channel during a time period when the voice data is present in a wireless channel set, wherein the wireless channel set comprises at least one wireless channel and is associated with the wireless communication unit;

receiving the non-voice data associated with a second logical channel during a time period when the non-voice data is present in the wireless channel set;

inserting information into the voice data on a condition that a portion of the voice data is missing in the wireless channel set; and processing the information in the voice data.

2. The method of claim 1, wherein the wireless channel set is code division multiple access (CDMA) channels.

3. The method of claim 1, wherein the wireless channel set is frequency hopped channels.

4. The method of claim 1, wherein control data is multiplexed with the voice data or the non-voice data, the wireless channel set including the multiplexed control data.

5. The method of claim 1, wherein the non-voice data is phase shift keying modulated.

6. The method of claim 1, further comprising:
convolutionally decoding the voice data with a first convolutional decoder; and
convolutionally decoding the non-voice data with a second convolutional decoder.

7. The method of claim 6, further comprising:
processing the voice data as the first logical channel having a first data rate; and
processing the non-voice data as the second logical channel having a second data rate different than the first data rate.

8. The method of claim 7, further comprising:
processing the voice data and the non-voice data for transmission;
amplifying the processed voice data and the processed non-voice data with a power amplifier; and
transmitting the amplified processed voice data and the amplified processed non-voice data with a radio frequency section.

9. A wireless communication unit comprising:
circuitry configured to receive a voice data associated with a first logical channel, the circuitry further being configured to receive a non-voice data associated with a second logical channel, the voice data and the non-voice data being carried by a wireless channel set during a time period, wherein the wireless channel set comprises at least one wireless channel and is associated with the wireless communication unit; and circuitry configured to insert information into the voice data on a condition that a portion of the voice data is missing in the wireless channel set during the time period.

10. The wireless communication unit of claim 9, wherein the wireless channel set is CDMA channels.

11. The wireless communication unit of claim 9, wherein the wireless channel set is frequency hopped channels.

12. The wireless communication unit of claim 9, further comprising circuitry configured to multiplex control data with the voice data or the non-voice data, such that the wireless channel set includes the multiplexed control data.

13. The wireless communication unit of claim 9, wherein the non-voice data is phase shift keying modulated.

14. The wireless communication unit of claim 9, further comprising:
a first convolutional decoder configured to convolutionally decode the voice data; and
a second convolutional decoder configured to convolutionally decode the non-voice data.

15. The wireless communication unit of claim 14, wherein the circuitry configured to receive the voice data and the non-voice data is configured to process the voice data as the first logical channel having a first data rate and to process the non-voice data as the second logical channel having a second data rate different than the first data rate.

16. The wireless communication unit of claim 15, further comprising:
circuitry that processes the voice data and the non-voice data for transmission;
a power amplifier configured to amplify the processed voice data and the processed non-voice data; and
a radio frequency circuit that transmits the amplified processed voice data and the amplified processed non-voice data.

* * * * *